United States Patent
Toyotaka

(10) Patent No.: US 10,330,993 B2
(45) Date of Patent: Jun. 25, 2019

(54) DISPLAY DEVICE

(71) Applicant: Semiconductor Energy Laboratory Co., Ltd., Atsugi-shi, Kanagawa-ken (JP)

(72) Inventor: Kouhei Toyotaka, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/841,866

(22) Filed: Dec. 14, 2017

(65) Prior Publication Data

US 2018/0180951 A1  Jun. 28, 2018

(30) Foreign Application Priority Data

Dec. 23, 2016 (JP) ................. 2016-250228

(51) Int. Cl.
| | |
|---|---|
| *H01L 27/32* | (2006.01) |
| *H01L 51/52* | (2006.01) |
| *G02F 1/1333* | (2006.01) |
| *G02F 1/1343* | (2006.01) |

(52) U.S. Cl.
CPC .............. *G02F 1/134336* (2013.01); *G02F 1/133345* (2013.01); *H01L 27/32* (2013.01); *H01L 27/3204* (2013.01); *H01L 27/3218* (2013.01); *H01L 27/3246* (2013.01); *H01L 27/3283* (2013.01); *H01L 27/3295* (2013.01); *H01L 51/5203* (2013.01); *H01L 51/5212* (2013.01)

(58) Field of Classification Search
CPC ............. H01L 27/3202; H01L 27/3204; H01L 27/3246; H01L 27/3296; H01L 27/3209; H01L 27/3295; H01L 27/3283; H01L 27/326; H01L 51/5209; H01L 51/504; H01L 51/5203–51/5215
See application file for complete search history.

(56) References Cited

U.S. PATENT DOCUMENTS

| | | | |
|---|---|---|---|
| 5,725,915 | A | 3/1998 | Ishitaka et al. |
| 6,233,033 | B1 | 5/2001 | Moore |
| 6,404,472 | B1 | 6/2002 | Andreatta et al. |
| 6,839,108 | B1 | 1/2005 | Hirakata et al. |
| 2002/0163614 | A1 | 11/2002 | Hinata et al. |
| 2007/0013823 | A1 | 1/2007 | Jung et al. |
| 2007/0065603 | A1 | 3/2007 | Leu et al. |
| 2008/0068527 | A1 | 3/2008 | Urn et al. |

(Continued)

FOREIGN PATENT DOCUMENTS

| | | |
|---|---|---|
| JP | 06-160875 | 6/1994 |
| JP | 2014-197522 A | 10/2014 |

*Primary Examiner* — Mariceli Santiago
(74) *Attorney, Agent, or Firm* — Robinson Intellectual Property Law Office; Eric J. Robinson

(57) ABSTRACT

A display device having high display quality is provided. In the display device including a plurality of pixels, adjacent pixel electrodes are formed over different insulating layers. Accordingly, when seen in a plan view, the adjacent pixel electrodes can be close to each other without constraints of design rules. Openings (light-emitting regions) of the adjacent pixels can be close to each other, leading to an improvement in graininess of an image. With the use of a step provided between the adjacent pixel electrodes, the resistance of an EL layer across the adjacent pixels can be increased to reduce crosstalk.

16 Claims, 41 Drawing Sheets

(56) References Cited

U.S. PATENT DOCUMENTS

| | | |
|---|---|---|
| 2009/0072232 A1 | 3/2009 | Hayashi et al. |
| 2011/0194059 A1 | 8/2011 | Yamazaki |
| 2012/0305952 A1* | 12/2012 | Takei ................. H01L 27/3216 257/89 |
| 2013/0299789 A1 | 11/2013 | Yamazaki et al. |
| 2015/0144908 A1* | 5/2015 | Yoon ................... H01L 27/3216 257/40 |
| 2016/0118449 A1* | 4/2016 | Sato .................... H01L 27/3246 257/89 |
| 2016/0274394 A1 | 9/2016 | Yamazaki et al. |
| 2017/0104035 A1* | 4/2017 | Lee ..................... H01L 51/5265 |

\* cited by examiner light irradiation light irradiation

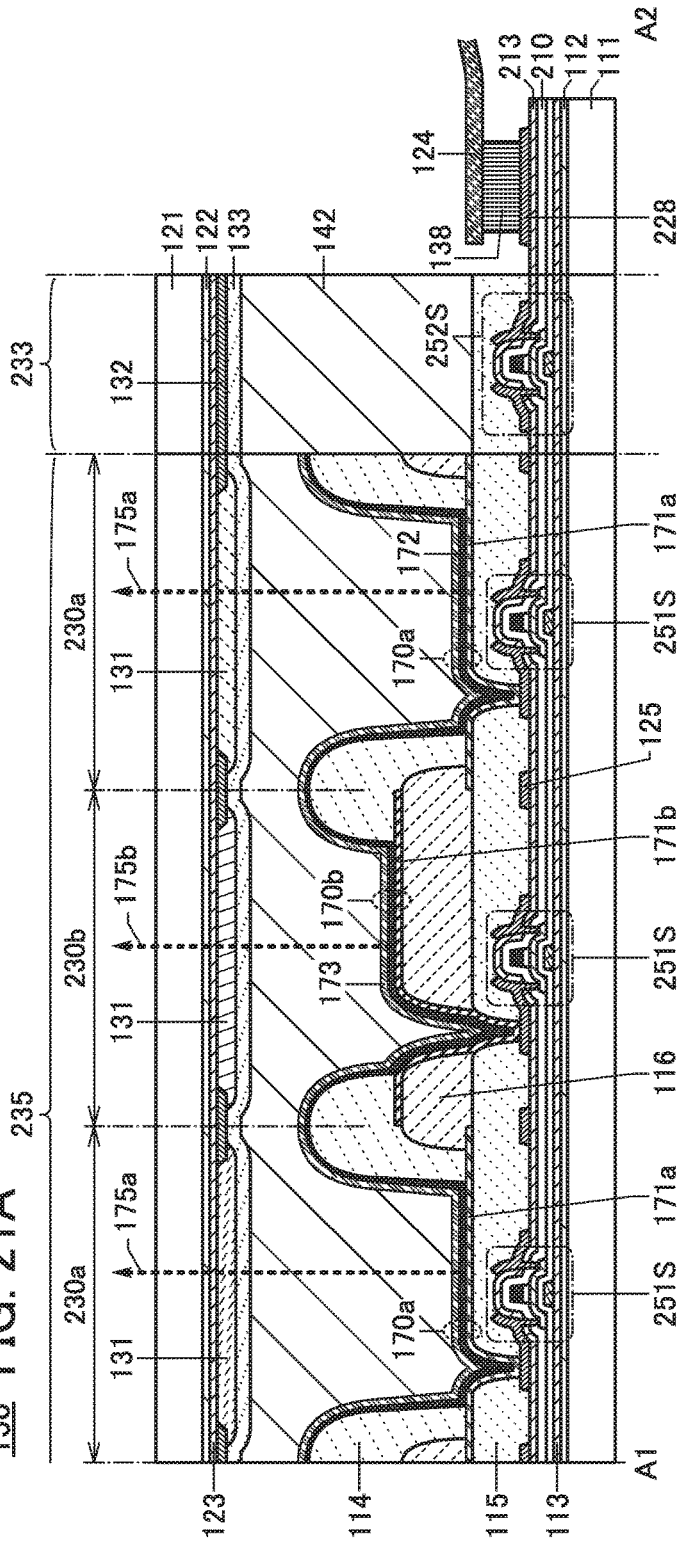

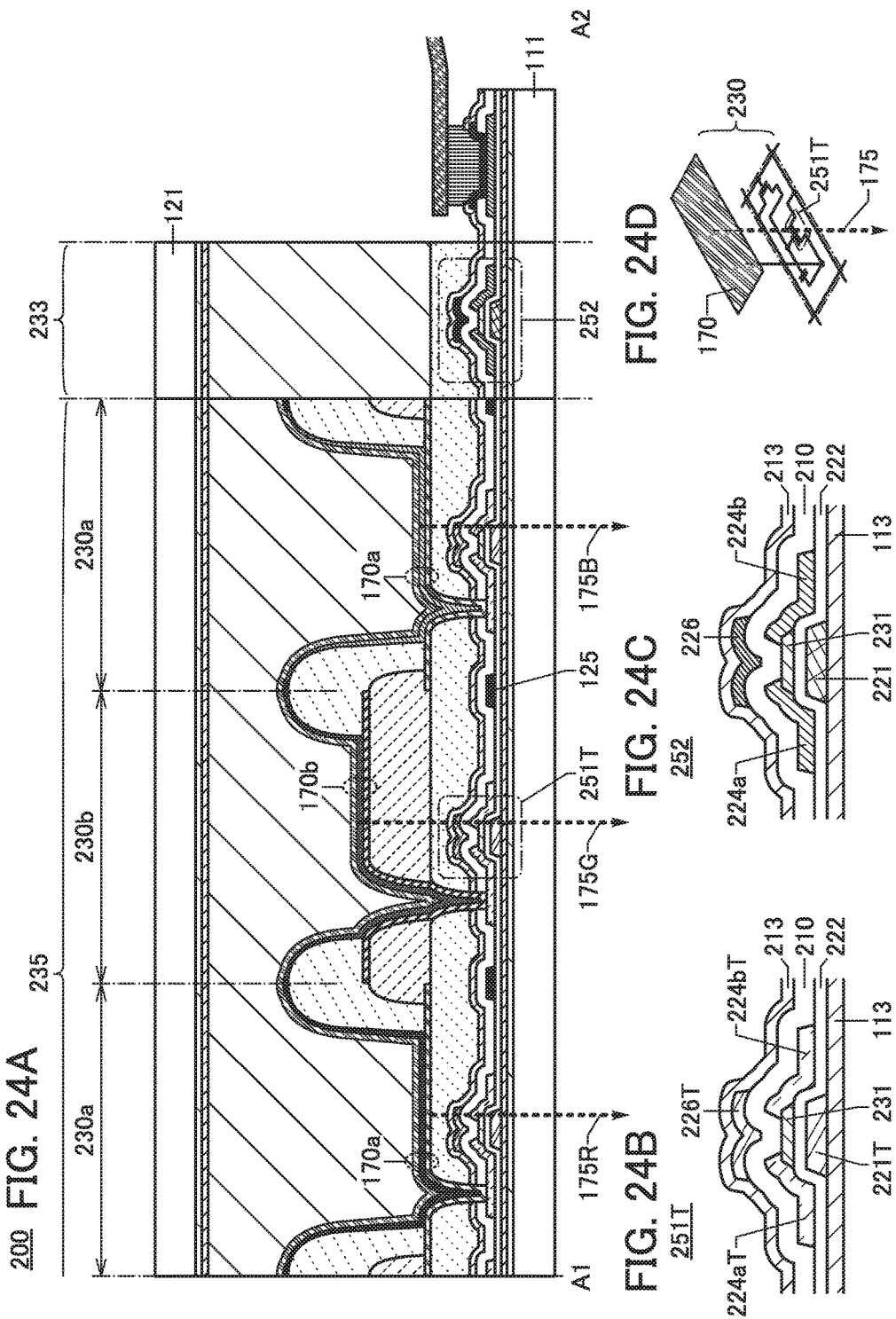

FIG. 27A
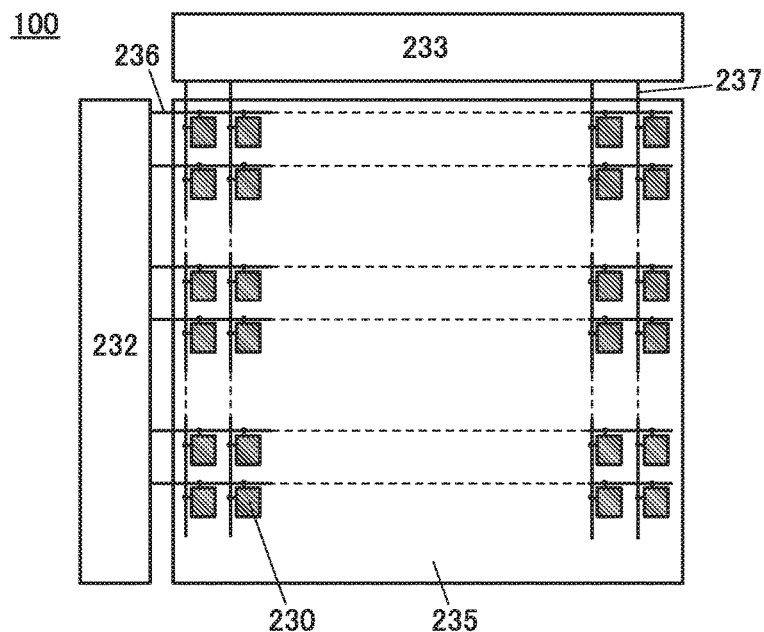
FIG. 27B1
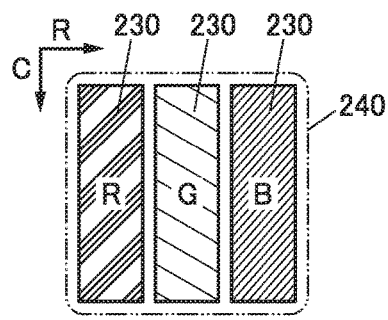
FIG. 27B2
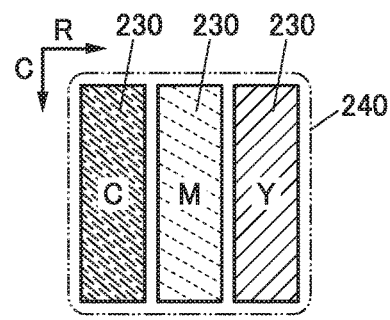
FIG. 27B3
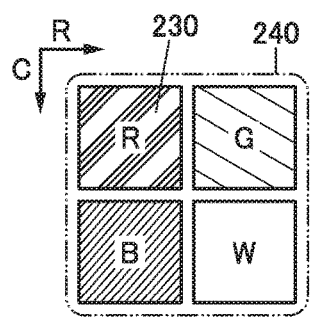
FIG. 27B4
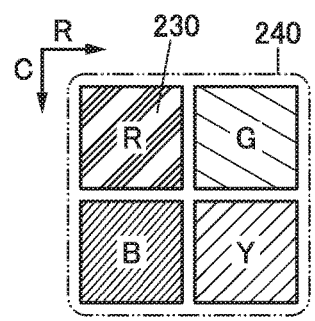
FIG. 27B5
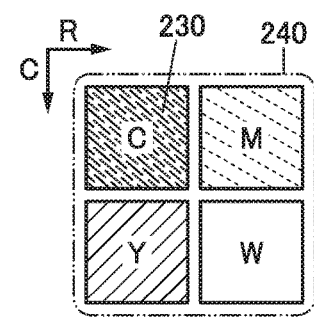

FIG. 30A1
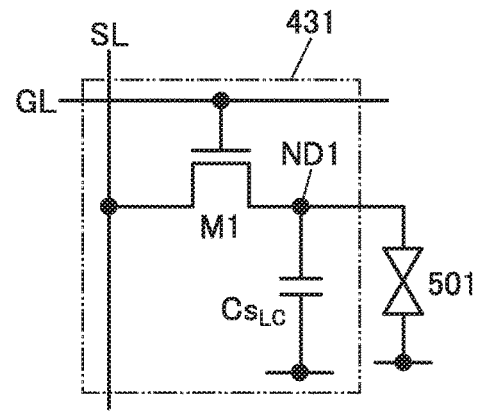
FIG. 30A2
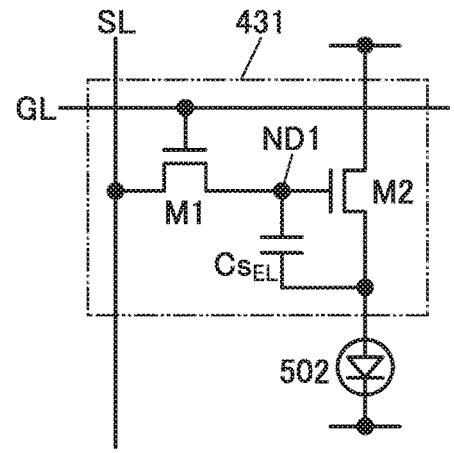
FIG. 30B
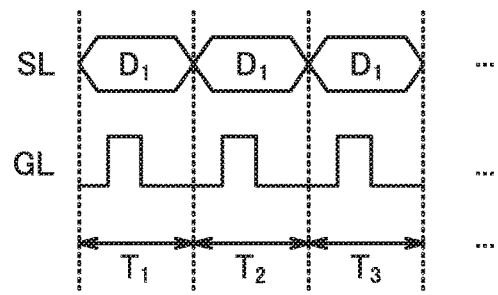
FIG. 30C
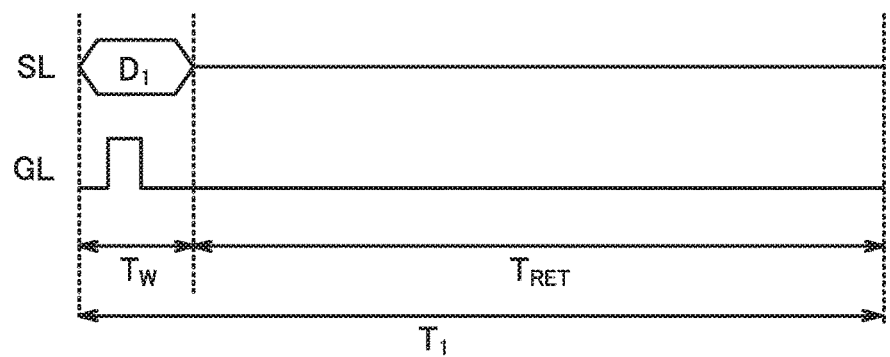

FIG. 35A
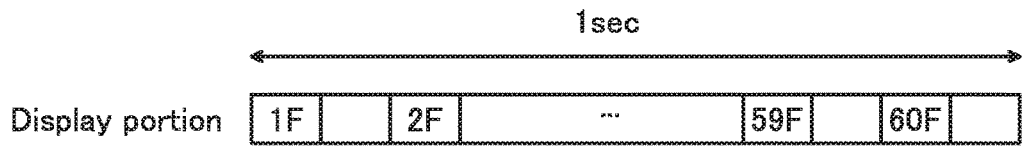
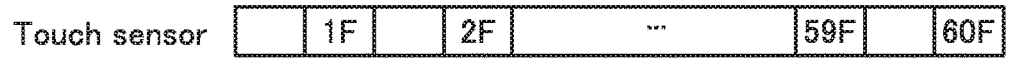
FIG. 35B
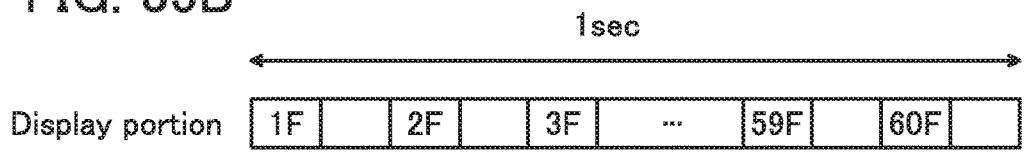
FIG. 35C
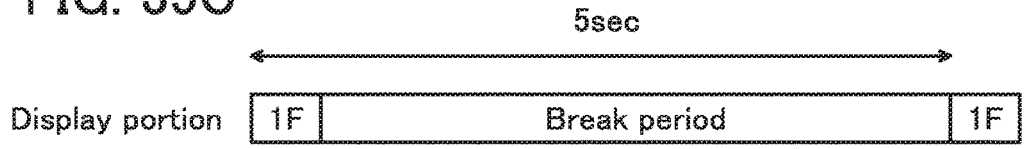
FIG. 35D
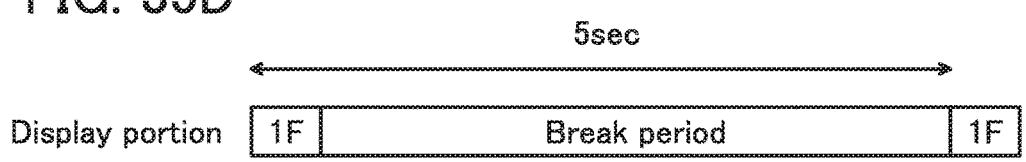

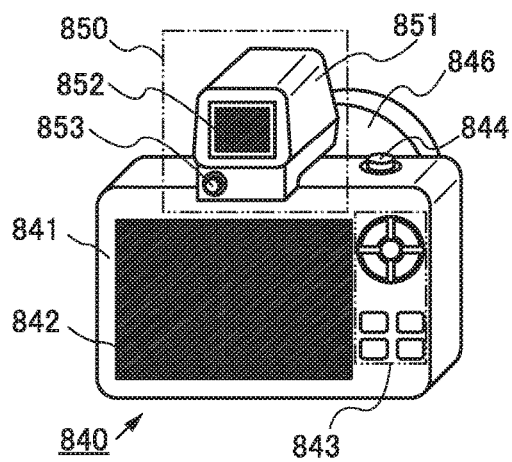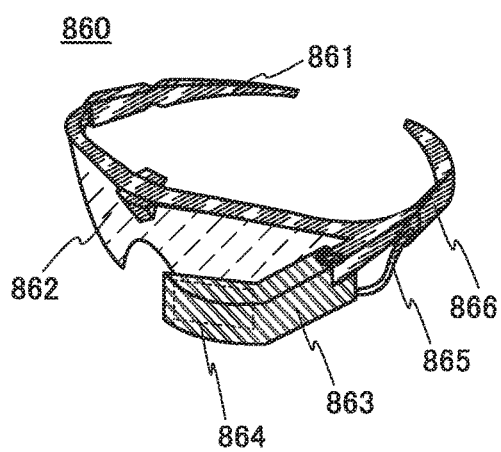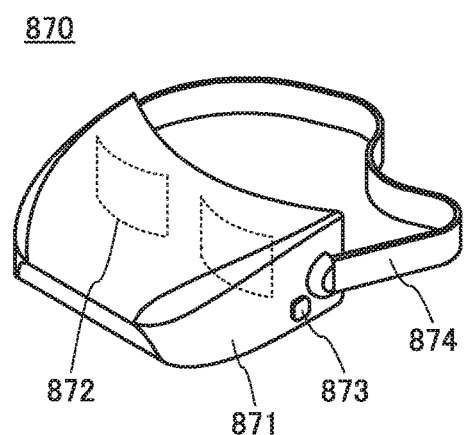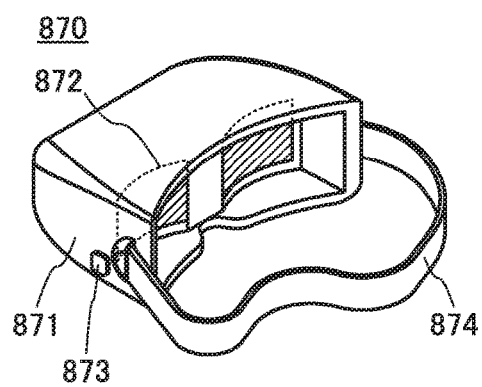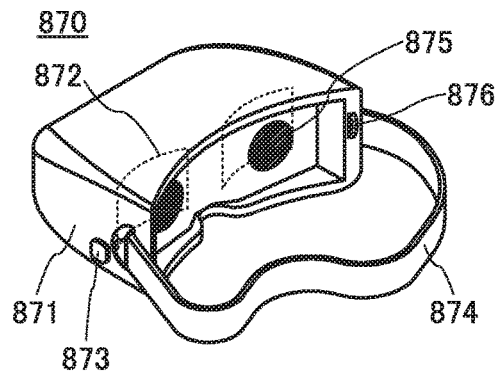

DISPLAY DEVICE

BACKGROUND OF THE INVENTION

1. Field of the Invention

One embodiment of the invention disclosed in this specification and the like relates to an object, a method, or a manufacturing method. One embodiment of the invention disclosed in this specification and the like also relates to a process, a machine, manufacture, or a composition of matter. In particular, one embodiment of the invention disclosed in this specification and the like relates to a display device and a manufacturing method thereof.

In this specification and the like, a semiconductor device generally means a device that can function by utilizing semiconductor characteristics. A display device (e.g., a liquid crystal display device and a light-emitting display device), a projection device, a lighting device, an electro-optical device, a power storage device, a memory device, a semiconductor circuit, an imaging device, an electronic device, and the like may be referred to as a semiconductor device. Alternatively, they may include a semiconductor device.

2. Description of the Related Art

An active-matrix display device where a transistor for driving a display element is provided in each pixel is known. For example, an active-matrix liquid crystal display device that includes a liquid crystal element as a display element, an active-matrix light-emitting display device that includes a light-emitting element, such as an organic electroluminescent (EL) element, as a display element, and the like are known. These active-matrix display devices are easier to increase in display size or definition than simple-matrix display devices, and have an advantage in reduced power consumption and the like.

Patent Document 1 discloses a light-emitting display device including an organic EL element as a display element.

REFERENCE

Patent Document

[Patent Document 1] Japanese Published Patent Application No. 2014-197522

SUMMARY OF THE INVENTION

In recent years, demands for display devices with higher definition and higher aperture ratio are increasing. In addition, display devices are required to have high reliability and be produced at low cost.

An object of one embodiment of the present invention is to provide a display device, electronic device, or the like having favorable visibility. Another object of one embodiment of the present invention is to provide a display device, electronic device, or the like having high display quality. Another object of one embodiment of the present invention is to provide a display device, electronic device, or the like with low power consumption. Another object of one embodiment of the present invention is to provide a display device, electronic device, or the like with high productivity. Another object of one embodiment of the present invention is to provide a display device, electronic device, or the like having high reliability. Another object of one embodiment of the present invention is to provide a novel display device, electronic device, or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

In a display device including a plurality of pixels, adjacent pixel electrodes are formed over different insulating layers. Accordingly, when seen in a plan view, the adjacent pixel electrodes can be close to each other without constraints of design rules. Openings (light-emitting regions) of the adjacent pixels can be close to each other, leading to an improvement in graininess of an image. With the use of a step provided between the adjacent pixel electrodes, the resistance of an EL layer across the adjacent pixels can be increased to reduce crosstalk.

One embodiment of the present invention is a display device including a first electrode, a second electrode, a third electrode, a first insulating layer, a second insulating layer, a third insulating layer, and an organic layer. The first insulating layer includes a region covered with the second insulating layer. The first electrode is provided over the first insulating layer. The second electrode is provided over the second insulating layer. The second insulating layer includes a region covering an end portion of the first electrode. The third insulating layer includes a region in contact with part of the first electrode and a region covering an end portion of the second electrode. The organic layer includes a first region overlapping with the first electrode and a second region overlapping with the second electrode. The third electrode includes a region overlapping with the first electrode with the first region positioned therebetween and a region overlapping with the second electrode with the second region positioned therebetween. The organic layer has a function of emitting visible light.

One embodiment of the present invention is a display device including a first transistor, a second transistor, a first electrode, a second electrode, a third electrode, a first insulating layer, a second insulating layer, a third insulating layer, and an organic layer. The first transistor and the second transistor are covered with the first insulating layer. The first insulating layer includes a region covered with the second insulating layer. The first electrode is provided over the first insulating layer. The second electrode is provided over the second insulating layer. The second insulating layer includes a region covering an end portion of the first electrode. The third insulating layer includes a region in contact with part of the first electrode and a region covering an end portion of the second electrode. The organic layer includes a first region overlapping with the first electrode and a second region overlapping with the second electrode. The third electrode includes a region overlapping with the first electrode with the first region positioned therebetween, a region overlapping with the second electrode with the second region positioned therebetween, and a region overlapping with the third insulating layer. The first electrode is electrically connected to the first transistor. The second electrode is electrically connected to the second transistor. The organic layer has a function of emitting visible light.

The first transistor and the second transistor each preferably include an oxide semiconductor in a semiconductor layer in which a channel is formed. The organic layer preferably includes a light-emitting substance.

The display device of one embodiment of the present invention preferably includes coloring layers having a function of changing a hue of the visible light. For example, a first coloring layer is preferably provided in a region overlapping with the first region. A second coloring layer is preferably provided in a region overlapping with the second region.

One embodiment of the present invention can provide a display device, electronic device, or the like having favorable visibility. One embodiment of the present invention can provide a display device, electronic device, or the like having high display quality. One embodiment of the present invention can provide a display device, electronic device, or the like with low power consumption. One embodiment of the present invention can provide a display device, electronic device, or the like with high productivity. One embodiment of the present invention can provide a display device, electronic device, or the like having high reliability. One embodiment of the present invention can provide a novel display device, electronic device, or the like.

Note that the descriptions of these effects do not disturb the existence of other effects. One embodiment of the present invention does not necessarily achieve all the effects. Other effects will be apparent from and can be derived from the description of the specification, the drawings, the claims, and the like.

BRIEF DESCRIPTION OF THE DRAWINGS

In the accompanying drawings:
FIGS. 21A and 21B illustrate a display device;
FIGS. 24A to 24D illustrate a display device;
FIGS. 27A, 27B1, 27B2, 27B3, 27B4, and 27B5 illustrate structure examples of a display device;
FIGS. 30A1, 30A2, 30B, and 30C are circuit diagrams and timing charts illustrating operation modes;
FIGS. 35A to 35D illustrate the operation of a display device and a touch sensor;
FIGS. 39A to 39E illustrate examples of electronic devices.

DETAILED DESCRIPTION OF THE INVENTION

Figure 1A:
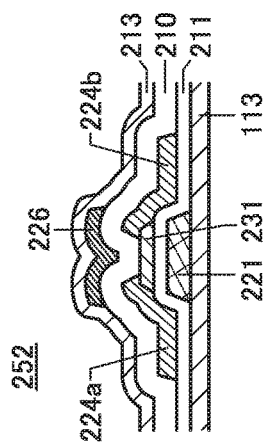
FIGS. 1A to 1C illustrate a display device.

Embodiments will be described in detail with reference to the drawings. Note that the present invention is not limited to the following description, and it will be readily appreciated by those skilled in the art that modes and details can be modified in various ways without departing from the spirit and scope of the present invention. Thus, the present invention should not be construed as being limited to the description in the following embodiments. Note that in the structures of the present invention described below, the same portions or portions having similar functions are denoted by the same reference numerals in different drawings, and description of such portions is not repeated in some cases.

The position, size, range, and the like of each component illustrated in the drawings and the like are not accurately represented in some cases to facilitate understanding of the invention. Therefore, the disclosed invention is not necessarily limited to the position, size, range, and the like disclosed in the drawings and the like. For example, in the actual manufacturing process, a layer, a resist mask, or the like might be unintentionally reduced in size by treatment such as etching, which is not illustrated in some cases for easy understanding of the present invention.

Especially in a top view (also referred to as a "plan view"), a perspective view, or the like, some components might not be illustrated for easy understanding of the invention. In addition, some hidden lines and the like might not be shown.

Ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A different ordinal number from an ordinal number used to denote a component in this specification and the like might be used to denote the component in a claim. Moreover, a term with an ordinal number in this specification and the like might not be provided with any ordinal number in a claim and the like.

In addition, in this specification and the like, the term such as an "electrode" or a "wiring" does not limit a function of the component. For example, an "electrode" is used as part of a "wiring" in some cases, and vice versa. Furthermore, the term "electrode" or "wiring" can also mean a combination of a plurality of "electrodes" and "wirings" provided in an integrated manner.

Note that the channel length refers to, for example, the distance between a source (a source region or a source electrode) and a drain (a drain region or a drain electrode) in a region where a semiconductor (or a portion where current flows in a semiconductor when a transistor is on) and a gate electrode overlap with each other or a region where a channel is formed in a plan view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value, in a region where a channel is formed.

The channel width refers to, for example, the length of a portion where a source and a drain face each other in a region where a semiconductor (or a portion where current flows in a semiconductor when a transistor is on) and a gate electrode overlap with each other, or a region where a channel is formed. In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter, also referred to as an "effective channel width") is different from a channel width shown in a top view of a transistor (hereinafter, also referred to as an "apparent channel width") in some cases. For example, in a transistor having a gate electrode covering side surfaces of a semiconductor layer, an effective channel width is greater than an apparent channel width, and its influence cannot be ignored in some cases. For example, in a miniaturized transistor having a gate electrode covering side surfaces of a semiconductor, the proportion of a channel formation region formed in the side surfaces of the semiconductor is increased in some cases. In that case, an effective channel width is greater than an apparent channel width.

In such a case, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, an apparent channel width is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by analyzing a cross-sectional TEM image and the like.

Note that in the case where field-effect mobility, a current value per channel width, and the like of a transistor are obtained by calculation, a surrounded channel width may be used for the calculation. In that case, a value different from the one obtained in the case where an effective channel width is used for the calculation is obtained in some cases.

In this specification and the like, in the case where an etching step (removal step) is performed after a resist mask is formed by a photolithography method, the resist mask is removed after the etching step, unless otherwise specified.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification and the like, a transistor is an element having at least three terminals of a gate, a drain, and a source. The transistor includes a channel formation region between a drain (a drain terminal, a drain region, or a drain electrode) and a source (a source terminal, a source region, or a source electrode), and current can flow between the source and the drain through the channel formation region. Note that in this specification and the like, a channel formation region refers to a region through which current mainly flows.

A transistor described in this specification and the like refers to an enhancement-mode (normally-off) field-effect transistor, unless otherwise specified. A transistor described in this specification and the like also refers to an n-channel transistor, unless otherwise specified. Therefore, the threshold voltage (also referred to as "$V_{th}$") thereof is higher than 0 V, unless otherwise specified.

Note that the $V_{th}$ of a transistor including a back gate in this specification and the like refers to a $V_{th}$ obtained when the potential of the back gate is set equal to that of a source or a gate, unless otherwise specified.

Unless otherwise specified, off-state current in this specification and the like refers to drain current of a transistor in an off state (also referred to as a non-conducting state and a cutoff state). Unless otherwise specified, the off state of an n-channel transistor means that a potential difference (hereinafter also referred to as $V_g$) between its gate and source when the potential of the source is regarded as a reference potential is lower than the threshold voltage $V_{th}$, and the off state of a p-channel transistor means that the voltage $V_g$ between its gate and source is higher than the threshold voltage $V_{th}$. For example, the off-state current of an n-channel transistor sometimes refers to drain current that flows when $V_g$ is lower than the threshold voltage $V_{th}$.

The off-state current of a transistor depends on $V_g$ in some cases. Thus, "the off-state current of a transistor is lower than or equal to I" may mean there is $V_g$ at which the off-state current of the transistor is lower than or equal to I. Furthermore, the off-state current of a transistor may refer to the off-state current in an off state at predetermined $V_g$, the off-state current in an off state at $V_g$ in a predetermined range, the off-state current in an off state at $V_g$ with which sufficiently reduced off-state current is obtained, or the like.

As an example, the assumption is made of an n-channel transistor where $V_{th}$ is 0.5 V and the drain current is $1\times10^{-9}$ A at $V_g$ of 0.5 V, $1\times10^{-13}$ A at $V_g$ of 0.1 V, $1\times10^{-19}$ A at $V_g$ of −0.5 V, and $1\times10^{-22}$ A at $V_g$ of −0.8 V. The drain current of the transistor is lower than or equal to $1\times10^{-19}$ A at $V_g$ of −0.5 V or at $V_g$ in the range of −0.8 V to −0.5 V; therefore, it can be said that the off-state current of the transistor is lower than or equal to $1\times10^{-19}$ A. Since there is $V_g$ at which the drain current of the transistor is lower than or equal to $1\times10^{-22}$ A, it may be said that the off-state current of the transistor is lower than or equal to $1\times10^{-22}$ A.

The off-state current of a transistor depends on temperature in some cases. Unless otherwise specified, the off-state current in this specification may be an off-state current at room temperature (RT), 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., a temperature higher than or equal to 5° C. and lower than or equal to 35° C.). The state in which the off-state current of a transistor is lower than or equal to I may indicate that the off-state current of the transistor at RT, 60° C., 85° C., 95° C., 125° C., a temperature at which the reliability of a semiconductor device or the like including the transistor is ensured, or a temperature at which the semiconductor device or the like is used (e.g., a temperature higher than or equal to 5° C. and lower than or equal to 35° C.) is lower than or equal to I at a certain $V_g$.

In some cases, the off-state current of a transistor depends on a voltage between its drain and source when the potential of the source is regarded as a reference potential (hereinafter such a voltage is also referred to as $V_d$). Unless otherwise specified, the off-state current in this specification may be an off-state current at $V_d$ of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_d$ at which the reliability of a semiconductor device or the like including the transistor is ensured or at $V_d$ used in the semiconductor device or the like including the transistor. The state in which the off-state current of a transistor is lower than or equal to I may indicate that the off-state current of the transistor at $V_d$ of 0.1 V, 0.8 V, 1 V, 1.2 V, 1.8 V, 2.5 V, 3 V, 3.3 V, 10 V, 12 V, 16 V, or 20 V, at $V_d$ at which the reliability of a semiconductor device or the like including the transistor is ensured, or at $V_d$ used in the semiconductor device or the like is lower than or equal to I at a certain $V_g$.

In the above description of off-state current, a drain may be replaced with a source. That is, the off-state current sometimes refers to current that flows through a source of a transistor in the off state.

In this specification and the like, the term "leakage current" sometimes expresses the same meaning as "off-state current". In this specification and the like, the off-state current sometimes refers to current that flows between a source and a drain of a transistor in the off state, for example.

Note that the term "over" or "below" in this specification and the like does not necessarily mean that a component is placed "directly over" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

In this specification and the like, unless otherwise specified, the term "parallel" indicates that the angle formed between two straight lines is greater than or equal to −10° and less than or equal to 10°, and accordingly also includes the case where the angle is greater than or equal to −5° and less than or equal to 5°. In addition, unless otherwise specified, the term "substantially parallel" indicates that the angle formed between two straight lines is greater than or equal to −30° and less than or equal to 30°. The term "perpendicular" or "orthogonal" indicates, unless otherwise specified, that the angle formed between two straight lines is greater than or equal to 80° and less than or equal to 100°, and accordingly also includes the case where the angle is greater than or equal to 85° and less than or equal to 95°. In addition, unless otherwise specified, the term "substantially perpendicular" indicates that the angle formed between two straight lines is greater than or equal to 60° and less than or equal to 120°.

In this specification and the like, the terms "identical", "the same", "equal", "uniform", and the like (including synonyms thereof) used in describing calculation values and actual measurement values allow for a margin of error of ±20% unless otherwise specified.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. That is, a metal oxide that has at least one of an amplifying function, a rectifying function, and a switching function can be called a metal oxide semiconductor, or OS for short. In addition, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification and the like, "c-axis aligned crystal (CAAC)" or "cloud-aligned composite (CAC)" may be stated in some cases. Note that CAAC refers to an example of a crystal structure, and CAC refers to an example of a function or a material composition.

In this specification and the like, a CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

In this specification and the like, the CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, a high on-state current and high field-effect mobility, can be obtained.

In other words, the CAC-OS or the CAC metal oxide can be called a matrix composite or a metal matrix composite.

Embodiment 1

A display device 100 of one embodiment of the present invention will be described with reference to the drawings.

Structure Example

FIG. 1A is a schematic perspective view of the display device 100. In the display device 100, a substrate 111 and a substrate 121 are bonded to each other. The display device 100 includes a display region 235, a peripheral circuit region 232, a peripheral circuit region 233, and the like. FIG. 1A illustrates an example in which the display device 100 is provided with an FPC 124. Thus, the structure illustrated in FIG. 1A can be regarded as a display module including the display device 100 and the FPC 124.

The peripheral circuit region 232 and the peripheral circuit region 233 each include a circuit for supplying a signal to the display region 235. The circuits included in the peripheral circuit region 232 and the peripheral circuit region 233 are collectively referred to as a peripheral driver circuit in some cases. Examples of the peripheral driver circuit include a scan line driver circuit and a signal line driver circuit.

Part or the whole of the peripheral driver circuit may be mounted as an integrated circuit (IC). The IC including the part or the whole of the peripheral driver circuit may be mounted over the substrate 111 by a chip on glass (COG) method, a chip on film (COF) method, or the like. The IC may be mounted over the FPC 124 by a COF method or the like.

A signal and power are input from the outside to the display region 235, the peripheral circuit region 232, and the peripheral circuit region 233 through the FPC 124.

FIG. 1A also illustrates an enlarged view of part of the display region 235. In the display region 235, a plurality of pixels 230 are arranged in a matrix. The pixels 230 are classified into two types, a pixel 230a and a pixel 230b, in accordance with cross-sectional structures. The pixel 230a is provided adjacent to the pixel 230b. Note that in this specification and the like, the pixel 230 refers to both the pixel 230a and the pixel 230b.

[Cross-Sectional Structure Example]

Figure 1C:
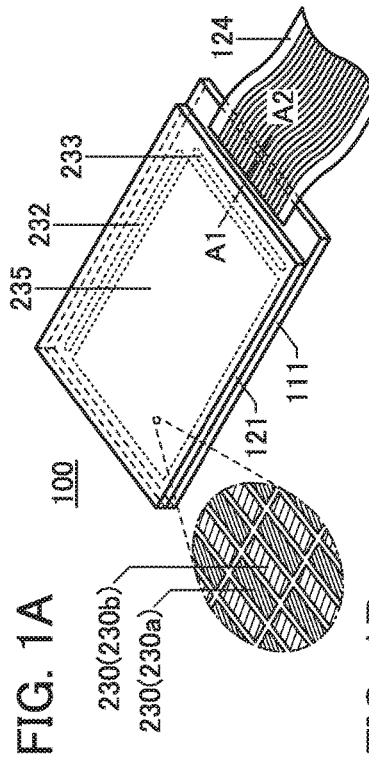
Figure 1B:
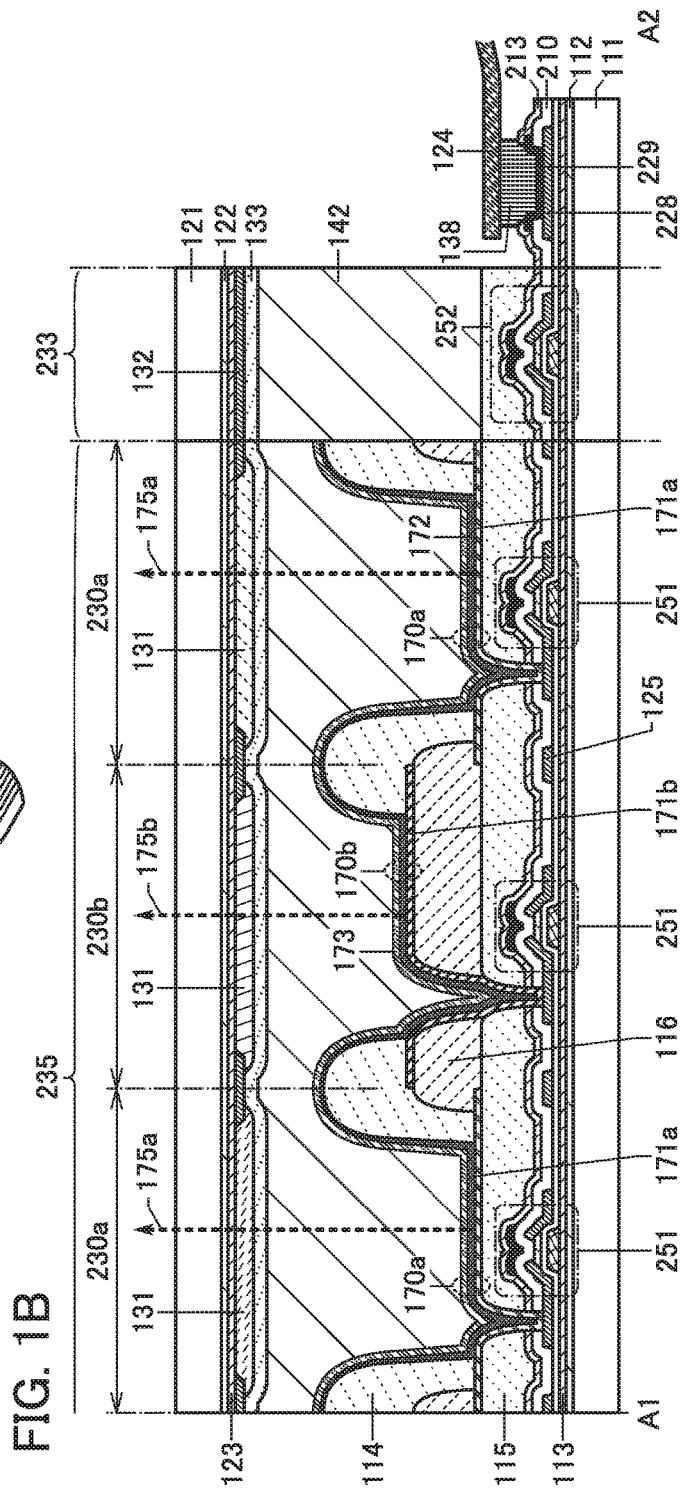

FIG. 1B is a cross-sectional view taken along the dashed-dotted line A1-A2 in FIG. 1A. FIG. 1B illustrates cross sections of part of the display region 235, part of the peripheral circuit region 233, and part of a region including the FPC 124.

Each of the plurality of pixels 230 includes a light-emitting element 170 as a display element. In this specification and the like, the light-emitting element 170 included in the pixel 230a is referred to as a light-emitting element 170a, and the light-emitting element 170 included in the pixel 230b is referred to as a light-emitting element 170b. Note that in this specification and the like, the light-emitting element 170 refers to both the light-emitting element 170a and the light-emitting element 170b.

Each of the plurality of pixels 230 includes a transistor 251 for driving the display element. The peripheral circuit region 232 and the peripheral circuit region 233 each include a plurality of transistors. FIG. 1B illustrates a transistor 252 as one example of the transistors included in the peripheral circuit region 233.

The display device 100 includes the transistor 251, the transistor 252, the light-emitting element 170, a coloring layer 131, a light-blocking layer 132, and the like between the substrate 111 and the substrate 121. The substrate 111 and the substrate 121 are bonded to each other with an adhesive layer 142.

As the adhesive layer 142, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component resin may be used. Still alternatively, an adhesive sheet or the like may be used.

The substrate 121 is provided with an adhesive layer 122, an insulating layer 123, the coloring layer 131, the light-blocking layer 132, an insulating layer 133, and the like. The insulating layer 133 may function as a planarization layer.

The substrate 111 is provided with the transistor 251, the transistor 252, and the light-emitting element 170 with an adhesive layer 112 and an insulating layer 113 provided therebetween.

FIG. 1C is an enlarged view of the transistor 252. Note that the transistor 252 can have a structure similar to that of the transistor 251.

The transistor 252 includes an electrode 221, a semiconductor layer 231, an electrode 224a, an electrode 224b, and an electrode 226. The electrode 221 is provided over the insulating layer 113, and an insulating layer 211 is provided to cover the electrode 221. The semiconductor layer 231 is provided over the insulating layer 211. The electrode 224a and the electrode 224b are provided over the insulating layer 211. The electrode 224a includes a region in contact with part of the semiconductor layer 231. The electrode 224b includes a region in contact with another part of the semiconductor layer 231. One of the electrode 224a and the electrode 224b can function as a source electrode, and the other can function as a drain electrode.

An insulating layer 210 is provided to cover the electrode 224a, the electrode 224b, and the semiconductor layer 231. The electrode 226 is provided over the insulating layer 210. The electrode 226 includes a region overlapping with the semiconductor layer 231. An insulating layer 213 is provided to cover the electrode 226.

In FIG. 1B, the transistor 251 and the transistor 252 are bottom-gate transistors. The transistor 251 is used for controlling current flowing to the light-emitting element 170 (such a transistor is also referred to as a driving transistor).

An insulating layer 115 is provided over the insulating layer 213. The insulating layer 115 functions as a planarization layer. The transistor 251 and the transistor 252 are covered with the insulating layer 213 and the insulating layer 115. The number of insulating layers covering the transistors is not limited and may be one or two or more.

A material through which impurities such as water and hydrogen do not easily diffuse is preferably used for at least one of the insulating layers that cover the transistors. This is because such an insulating layer can serve as a barrier film. Such a structure can effectively suppress diffusion of the impurities into the transistors from the outside, and a highly reliable display device can be achieved.

In the pixel 230a illustrated in FIG. 1B, an electrode 171a is provided over the insulating layer 115. In the pixel 230a, the electrode 171a is electrically connected to one of a source electrode and a drain electrode of the transistor 251 through an opening provided in the insulating layer 115.

In the pixel 230b illustrated in FIG. 1B, an insulating layer 116 is provided over the insulating layer 115. The insulating layer 116 includes a region overlapping with an end portion of the electrode 171a. An electrode 171b is provided over the insulating layer 116. In the pixel 230b, the electrode 171b provided over the insulating layer 116 is electrically connected to one of the source electrode and the drain electrode of the transistor 251 through an opening provided in the insulating layer 115 and the insulating layer 116.

An insulating layer 114 is provided to cover end portions of the electrode 171a and the electrode 171b. The insulating layer 114 includes a region overlapping with part of the electrode 171a and a region overlapping with part of the electrode 171b. In FIG. 1B, the insulating layer 114 includes a region in contact with part of the electrode 171a and a region in contact with part of the electrode 171b.

An EL layer 172 is provided over the electrode 171a, the electrode 171b, and the insulating layer 114, and an electrode 173 is provided over the EL layer 172. The electrode 173 includes a region overlapping with the electrode 171a with part of the EL layer 172 provided therebetween, a region overlapping with the electrode 171b with another part of the EL layer 172 provided therebetween, and a region overlapping with the insulating layer 114.

The insulating layer 114 can serve as a partition wall. The insulating layer 114 is preferably formed so that its sidewall has a tapered shape or a tilted surface with a continuous curvature. The sidewall of the insulating layer 114 having the above-described shape enables favorable coverage with the electrode 173 formed later.

In the display device 100 illustrated in FIG. 1B, a wiring 125, an electrode 228, and an electrode 229 are provided. The wiring 125 and the electrode 228 are provided over the insulating layer 211. The electrode 229 is electrically connected to the electrode 228 through an opening that is provided in the insulating layer 210 and overlaps with the electrode 228. The wiring 125 and the electrode 228 can be formed concurrently with the electrode 224a and the electrode 224b in the same step. The electrode 229 can be formed concurrently with the electrode 226 in the same step.

The FPC 124 is electrically connected to the electrode 229 through a connection layer 138. The electrode 229 is electrically connected to the peripheral driver circuit.

As the connection layer 138, an anisotropic conductive film (ACF), an anisotropic conductive paste (ACP), or the like can be used.

The light-emitting element 170 illustrated in FIG. 1B is a top-emission light-emitting element. The light-emitting element 170a has a structure in which the electrode 171a, the EL layer 172, and the electrode 173 are stacked in this order from the insulating layer 115 side. The light-emitting element 170b has a structure in which the electrode 171b, the EL layer 172, and the electrode 173 are stacked in this order from the insulating layer 115 side.

The electrode 171a and the electrode 171b have a function of reflecting visible light, and the electrode 173 has a function of transmitting visible light. Part of the electrode 173 functions as a common electrode of the light-emitting element 170a and another part of the electrode 173 functions as a common electrode of the light-emitting element 170b.

The EL layer 172 includes at least a light-emitting layer. In addition to the light-emitting layer, the EL layer 172 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

The emission color of the light-emitting element 170 can be changed to white, red, green, blue, cyan, magenta, yellow, or the like depending on the material of the EL layer 172.

As a color display method, there are a method in which the light-emitting element 170 whose emission color is white is combined with a coloring layer and a method in which the light-emitting element 170 with a different emission color is provided in each pixel. The former method is more productive than the latter method. In other words, the latter method, which requires separate formation of the EL layer 172 pixel by pixel, is less productive than the former method. However, the latter method can produce the emission color with higher color purity than the emission color produced by the former method. When the light-emitting element 170 has a microcavity structure in the latter method, the color purity can be further increased.

For the EL layer 172, either a low molecular compound or a high molecular compound can be used, and an inorganic compound may also be used. The layers included in the EL layer 172 can be formed by any of the following methods: an evaporation method (including a vacuum evaporation method), a transfer method, a printing method, an inkjet method, a coating method, and the like.

The EL layer 172 may contain an inorganic compound such as quantum dots. For example, quantum dots used for the light-emitting layer can serve as light-emitting materials.

The display device 100 includes the light-emitting element 170 whose emission color is white. That is, the color of light 175a emitted from the light-emitting element 170a and the color of light 175b emitted from the light-emitting element 170b are both white. Note that in this specification and the like, light 175 refers to both the light 175a and the light 175b.

The light 175 is emitted from the light-emitting element 170 to the substrate 121 side through the coloring layer 131 and the like. The wavelength range of the light 175 that passes through the coloring layer 131 depends on the material of the coloring layer 131. That is, the hue of the light 175 can be changed to red, green, blue, cyan, magenta, yellow, or the like by making the light 175 pass through the coloring layer 131.

The color display can be achieved when the hue of light varies between pixels. To achieve color display, the colors of the coloring layers combined with the emission colors of the light-emitting element 170 may be yellow, cyan, and magenta, as well as red, green, and blue. The colors of the combined coloring layers may be determined as appropriate in accordance with the purpose, the uses, or the like.

[Substrate]

There is no particular limitation on a material used for the substrate 111 and the substrate 121. The material is determined according to the purpose in consideration of whether it has a light-transmitting property, heat resistance high enough to withstand heat treatment, or the like. For example, a glass substrate of barium borosilicate glass, aluminoborosilicate glass, or the like, a ceramic substrate, a quartz substrate, or a sapphire substrate can be used. Alternatively, a semiconductor substrate, a flexible substrate, an attachment film, a base film, or the like may be used.

As the semiconductor substrate, a semiconductor substrate of silicon, germanium, or the like or a compound semiconductor substrate of silicon carbide, silicon germanium, gallium arsenide, indium phosphide, zinc oxide, or gallium oxide, or the like is used, for example. For the semiconductor substrate, a single-crystal semiconductor or a polycrystalline semiconductor may be used.

To increase the flexibility of the display device 100, a flexible substrate, an attachment film, a base film, or the like may be used as each of the substrate 111 and the substrate 121.

Examples of materials of the flexible substrate, the attachment film, the base film, and the like include polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber.

When any of the above-described materials is used for the substrates, a lightweight display device can be provided. Furthermore, when any of the above-described materials is used for the substrates, a shock-resistant display device can be provided. Moreover, when any of the above-described materials is used for the substrates, a non-breakable display device can be provided.

The flexible substrate used as the substrate 111 or 121 preferably has a lower coefficient of linear expansion because a lower coefficient of linear expansion suppresses deformation due to an environment. The flexible substrate used as the substrate 111 or 121 is formed using, for example, a material whose coefficient of linear expansion is lower than or equal to $1\times10^{-3}$/K, lower than or equal to $5\times10^{-5}$/K, or lower than or equal to $1\times10^{-5}$/K. In particular, aramid is preferably used for the flexible substrate because of its low coefficient of linear expansion.

[Conductive Layer]

As conductive materials for a gate, a source, and a drain of a transistor, and a conductive layer such as a wiring or an electrode included in a display device, a metal element selected from aluminum, chromium, copper, silver, gold, platinum, tantalum, nickel, titanium, molybdenum, tungsten, hafnium (Hf), vanadium (V), niobium (Nb), manganese, magnesium, zirconium, beryllium, and the like; an alloy containing any of the above metal elements as a component; an alloy containing a combination of the above metal elements; or the like can be used. Alternatively, a semiconductor typified by polycrystalline silicon including an impurity element such as phosphorus, or silicide such as nickel silicide may be used. There is no particular limitation on the formation method of the conductive material, and a variety of formation methods such as an evaporation method, a CVD method, a sputtering method, and a spin coating method can be employed.

The conductive layer can be formed using a conductive material containing oxygen, such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Moreover, a conductive material containing nitrogen, such as titanium nitride, tantalum nitride, or tungsten nitride, can be used. In addition, a stacked-layer structure formed using a conductive material containing oxygen, a conductive material containing nitrogen, and a material containing any of the above metal elements can be used.

The conductive material that can be used for the conductive layer may have a single-layer structure or a stacked-layer structure of two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, and a three-layer structure in which a titanium layer, an aluminum layer, and a titanium layer are stacked in this order can be used. Alternatively, an aluminum alloy containing one or more elements selected from titanium, tantalum, tungsten, molybdenum, chromium, neodymium, and scandium may be used as the conductive material.

The electrode 171a and the electrode 171b are preferably formed using a conductive material that efficiently reflects light emitted from the EL layer 172. Note that the electrode 171a and the electrode 171b may have a stacked-layer structure of a plurality of layers without limitation to a single-layer structure. For example, in the case where each of the electrode 171a and the electrode 171b is used as an anode, a layer in contact with the EL layer 172 may be a light-transmitting layer, such as an indium tin oxide layer, and a layer having high reflectance (e.g., a layer formed using aluminum, an alloy containing aluminum, or silver) may be provided in contact with the layer.

For the conductive material that reflects visible light, for example, a metal material such as aluminum, gold, platinum, silver, nickel, tungsten, chromium, molybdenum, iron, cobalt, copper, or palladium or an alloy containing any of these metal materials can be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used. An alloy containing silver and copper is preferable because of its high heat resistance. Furthermore, a metal film or an alloy film may be stacked with a metal oxide film. For example, when a metal film or a metal oxide film is stacked in contact with an aluminum alloy film, oxidation of the aluminum alloy film can be suppressed. Other examples of the metal film and the metal oxide film are a titanium film and a titanium oxide film, respectively. Alternatively, as described above, a light-transmitting conductive film and a film containing metal materials may be stacked. For example, a stacked film of silver and indium tin oxide (ITO) or a stacked film of indium tin oxide and an alloy of silver and magnesium can be used.

The display device having a top-emission structure is described as an example in FIG. 1B. In the case of a display device having a bottom-emission structure, the electrode 171 is formed using a conductive material transmitting visible light and the electrode 173 is formed using a conductive material reflecting visible light. In the case of a display device having a dual-emission structure, the electrode 171 and the electrode 173 are formed using a conductive material transmitting visible light.

As a light-transmitting conductive material, a conductive oxide such as indium oxide, indium tin oxide, indium zinc oxide, zinc oxide, or zinc oxide to which gallium is added, or graphene can be used. Alternatively, as a light-transmitting conductive material, an oxide conductor can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. In the case of using the metal material or the alloy material (or the nitride thereof), the thickness is set small enough to transmit light. Alternatively, a stacked film of any of the above materials can be used for the conductive layers. For example, a stacked film of indium tin oxide and an alloy of silver and magnesium is preferably used because the conductivity can be increased. They can also be used for conductive layers such as a variety of wirings and electrodes included in a display device, and conductive layers (e.g., conductive layers serving as a pixel electrode or a common electrode) included in a display element.

Here, an oxide conductor, which is one type of metal oxide, is described. In this specification and the like, an oxide conductor may be referred to as OC. For example, the oxide conductor is obtained in the following manner. Oxygen vacancies are formed in a metal oxide, and then hydrogen is added to the oxygen vacancies, so that a donor level is formed in the vicinity of the conduction band. This increases the conductivity of the metal oxide; accordingly, the metal oxide becomes a conductor. The metal oxide having become a conductor can be referred to as an oxide conductor. An oxide semiconductor generally transmits visible light because of its large energy gap. Since an oxide conductor is a metal oxide having a donor level in the vicinity of the conduction band, the influence of absorption due to the donor level is small in the oxide conductor, and the oxide conductor has a visible light transmitting property comparable to that of an oxide semiconductor.

[Insulating Layer]

The insulating layers can be formed with a single layer or a stack of layers of one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like. Alternatively, a material in which two or more materials selected from an oxide material, a nitride material, an oxynitride material, and a nitride oxide material are mixed may be used.

Note that in this specification, a nitride oxide refers to a compound that includes more nitrogen than oxygen. An oxynitride refers to a compound that includes more oxygen than nitrogen. The content of each element can be measured by Rutherford backscattering spectrometry (RBS), for example.

In particular, the insulating layers 113 and 213 are preferably formed using an insulating material which is relatively impermeable to impurities. The insulating layers 113 and 213 may each be formed to have, for example, a single-layer structure or a stacked-layer structure including an insulating material containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Examples of such an insulating material that is relatively impermeable to impurities include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride.

When the insulating material that is relatively impermeable to impurities is used for the insulating layer 113, impurity diffusion from the substrate 111 side can be suppressed, and the reliability of the transistor can be improved. When the insulating material that is relatively impermeable to impurities is used for the insulating layer 213, impurity diffusion from the insulating layer 115 side can be suppressed, and the reliability of the transistor can be improved.

Furthermore, the insulating layer that can function as the planarization layer can be formed using an organic material having heat resistance, such as polyimide, an acrylic resin, a benzocyclobutene resin, polyamide, or an epoxy resin. Other than such organic materials, it is possible to use a low-dielectric constant material (a low-k material), a siloxane-based resin, phosphosilicate glass (PSG), borophosphosilicate glass (BPSG), or the like. Note that a plurality of insulating layers formed of these materials may be stacked.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. In addition, the organic group may include a fluoro group.

A surface of the insulating layer or the like may be subjected to CMP treatment. By the CMP treatment, unevenness of the sample surface can be reduced, and coverage with an insulating layer or a conductive layer formed later can be increased.

[Coloring Layer]

Examples of a material that can be used for the coloring layers include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

[Transistor]

There is no particular limitation on the structure of the transistor included in the display device of one embodiment of the present invention. For example, a planar transistor or a staggered transistor may be used. A top-gate transistor or a bottom-gate transistor may be used. Gate electrodes may be provided above and below a channel.

A transistor included in a peripheral driver circuit and a transistor included in a pixel circuit may have the same structure or different structures. Transistors included in the peripheral driver circuit may have the same structure or a combination of two or more kinds of structures. Similarly, transistors included in the pixel circuit may have the same structure or a combination of two or more kinds of structures.

Note that when one of the gate electrodes provided above and below a channel is referred to as a "gate electrode", the other is referred to as a "back gate electrode". In addition, when one of the gate electrodes provided above and below a channel is referred to as a "gate", the other is referred to as a "back gate". Note that the gate electrode may be referred to as a "front gate electrode". Similarly, the gate may be referred to as a "front gate".

For example, the electrode 221 included in the transistor 252 can function as a gate electrode. The electrode 226 included in the transistor 252 can function as a back gate electrode. Thus, the insulating layer 210 and the insulating layer 211 can each function as a gate insulating layer.

When the gate electrode and the back gate electrode are provided, a semiconductor layer of the transistor can be electrically surrounded by an electric field generated from the gate electrode and an electric field generated from the back gate electrode. Such a transistor structure in which electric fields generated from the gate electrode and the back gate electrode electrically surround the semiconductor layer where the channel is formed can be referred to as a surrounded-channel (S-channel) structure.

The back gate electrode can function in a manner similar to that of the gate electrode. The potential of the back gate electrode may be the same as that of the gate electrode or may be a ground potential or a predetermined potential. By changing the potential of the back gate electrode independently of the potential of the gate electrode, the threshold voltage of the transistor can be changed.

By providing the gate electrode and the back gate electrode and by setting the potentials of the gate electrode and the back gate electrode to be the same, a region of the semiconductor layer through which carriers flow is enlarged in the film thickness direction; thus, the amount of carrier transfer is increased. As a result, the on-state current and the field-effect mobility of the transistor are increased.

Accordingly, the transistor can have a high on-state current for its area. That is, the area occupied by the transistor can be small for required on-state current. Therefore, a semiconductor device having a high degree of integration can be provided.

The use of the transistor having a high on-state current for a display device can reduce signal delay in wirings and can suppress degradation of display quality even in the display device in which the number of wirings is increased because of an increase in size or definition.

Furthermore, the gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer to cover the semiconductor layer in the plan view, the electric field blocking function can be enhanced.

Since the gate electrode and the back gate electrode each have a function of blocking an electric field from the outside, charges of charged particles and the like generated above and below the transistor do not influence the channel formation region of the semiconductor layer. Thus, degradation due to a stress test (e.g., a negative gate bias temperature (NGBT) stress test where negative voltage is applied to a gate (this stress test is also referred to as NBT or NBTS)) can be reduced. In addition, the gate electrode and the back gate electrode can block an electric field generated from the drain electrode so as not to affect the semiconductor layer. Thus, changes in the rising voltage of on-state current due to changes in drain voltage can be suppressed. Note that this effect is significant when a potential is applied to the gate electrode and the back gate electrode.

Before and after a positive gate bias temperature (PGBT) stress test where positive voltage is applied to a gate (this stress test is also referred to as PBT or PBTS)), a transistor including a back gate electrode has a smaller change in threshold voltage than a transistor including no back gate electrode.

The BT stress test such as NGBT or PGBT is a kind of accelerated test and can evaluate, in a short time, a change by long-term use (i.e., a change over time) in characteristics of transistors. In particular, the amount of change in threshold voltage of the transistor between before and after the BT stress test is an important indicator when examining the reliability of the transistor. When the amount of change in the threshold voltage between before and after the BT stress test is small, the transistor has higher reliability.

By providing the gate electrode and the back gate electrode and by setting the potentials of the gate electrode and the back gate electrode to be the same, the change in threshold voltage is reduced. Accordingly, variation in electrical characteristics among a plurality of transistors is also reduced.

In the case where light is incident on the back gate electrode side, when the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

[Semiconductor Material]

There is no particular limitation on the crystallinity of a semiconductor material used for the semiconductor layer of the transistor. An amorphous semiconductor or a semiconductor having crystallinity (a microcrystalline semiconductor, a polycrystalline semiconductor, a single-crystal semiconductor, or a semiconductor partly including crystal regions) may be used. A semiconductor having crystallinity is preferably used, in which case deterioration of the transistor characteristics can be suppressed.

As a semiconductor material used for the semiconductor layer of the transistor, silicon or germanium can be used, for example. Alternatively, a compound semiconductor such as silicon carbide, gallium arsenide, a metal oxide, or a nitride semiconductor, an organic semiconductor, or the like can be used.

As a semiconductor material used for the transistor, polycrystalline silicon (polysilicon) or amorphous silicon can be used, for example. As a semiconductor material used for the transistor, an oxide semiconductor, which is one type of metal oxide, can be used. Typically, an oxide semiconductor containing indium or the like can be used.

In particular, a semiconductor material having a wider band gap and a lower carrier density than silicon is preferably used because off-state current between the source and the drain of the transistor can be reduced.

The semiconductor layer preferably includes, for example, a material represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in electrical characteristics of the transistor including the oxide semiconductor, the oxide semiconductor preferably contains a stabilizer in addition to In, Zn, and M.

Examples of the stabilizer, including metals that can be used as M, are gallium, tin, hafnium, aluminum, and zirconium. Other examples of the stabilizer are lanthanoid such as lanthanum, cerium, praseodymium, neodymium, samarium, europium, gadolinium, terbium, dysprosium, holmium, erbium, thulium, ytterbium, and lutetium.

As an oxide semiconductor included in the semiconductor layer, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, an "In—Ga—Zn-based oxide" means an oxide containing In, Ga, and Zn as its main components and there is no limitation on the ratio of In:Ga:Zn. Furthermore, a metal element in addition to In, Ga, and Zn may be contained.

An oxide semiconductor, which is one type of metal oxide, is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The semiconductor layer of any of the transistors disclosed in one embodiment of the present invention may include a cloud-aligned composite oxide semiconductor (CAC-OS).

The aforementioned non-single-crystal oxide semiconductor or CAC-OS is preferably used for the semiconductor layer of any of the transistors disclosed in one embodiment of the present invention. As the non-single-crystal oxide semiconductor, an nc-OS or a CAAC-OS is preferably used.

Figure 2A:
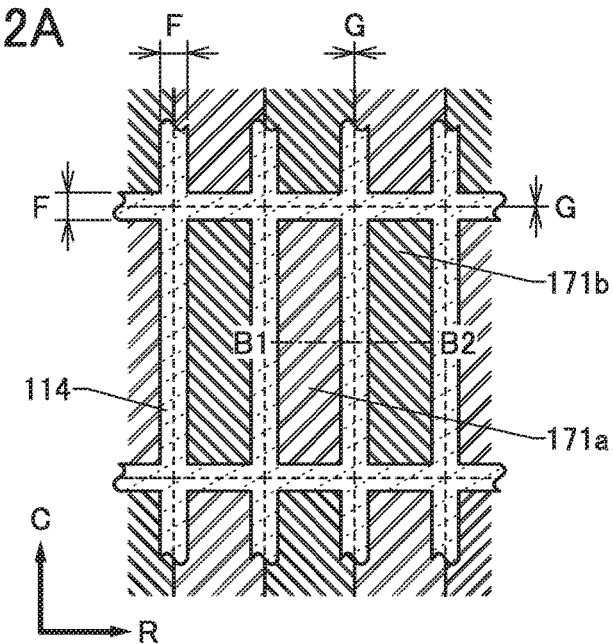
FIGS. 2A to 2C illustrate a display device.
Figure 2B:
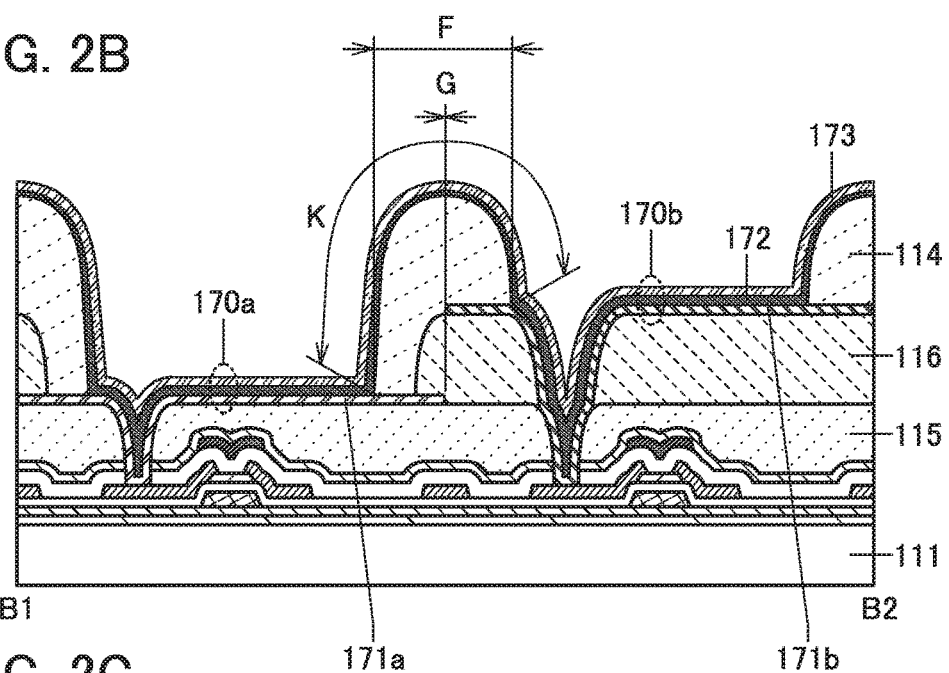

FIG. 2A is an enlarged plan view of part of the display region 235. FIG. 2A illustrates an arrangement example of the electrode 171a, the electrode 171b, and the insulating layer 114. FIG. 2B is a cross-sectional view taken along the dashed-dotted line B1-B2 in FIG. 2A. FIG. 2B illustrates a structure where the components up to the electrode 173 are formed over the substrate 111.

The pixel 230a and the pixel 230b are alternately arranged in a direction R. The pixel 230a and the pixel 230b are alternately arranged also in a direction C. That is, the electrode 171a and the electrode 171b are alternately arranged in both the direction R and the direction C. Note that in the plan view, the direction R is orthogonal to the direction C.

Figure 2C:
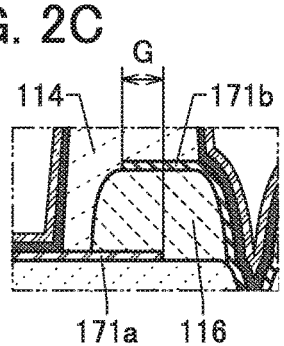

In the display device 100 of one embodiment of the present invention, the electrode 171a is formed over the insulating layer 115, and the electrode 171b is formed over the insulating layer 116. The formation of the electrode 171a and the electrode 171b over different layers can prevent a short circuit between the electrodes. As illustrated in FIG. 2C, the adjacent electrodes 171a and 171b can overlap with each other with the insulating layer 116 provided therebetween. Thus, a distance G between the adjacent electrodes 171a and 171b can be substantially zero.

Figure 3A:
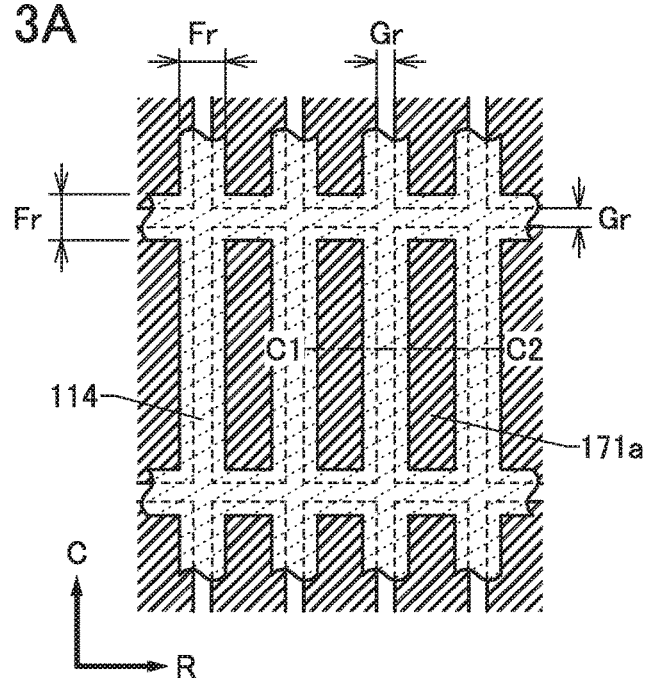
FIGS. 3A and 3B illustrate a display device.
Figure 3B:
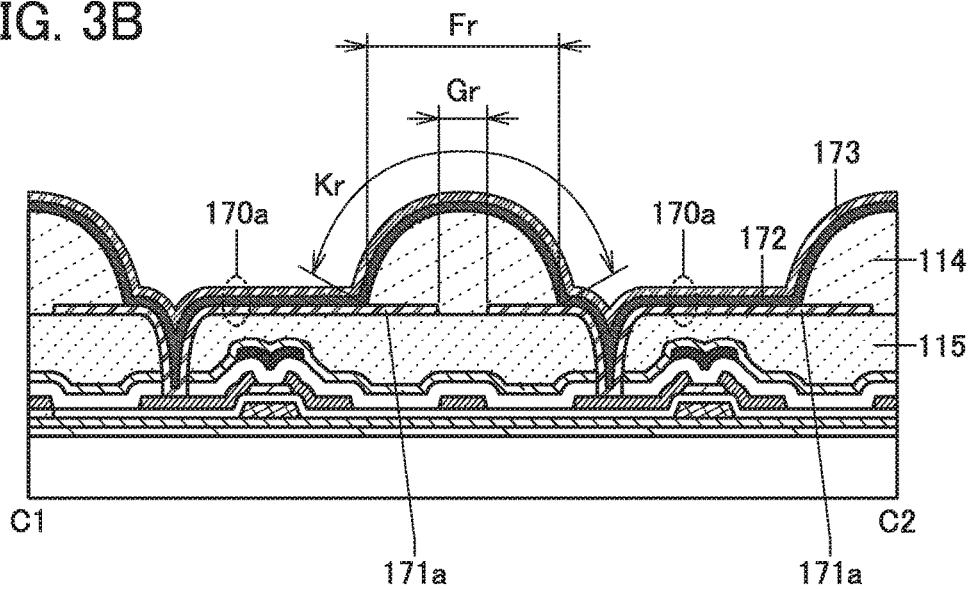

FIG. 3A is an enlarged plan view of part of the display region 235 without the insulating layer 116. FIG. 3A illustrates an arrangement example of the electrode 171a and the insulating layer 114. FIG. 3B is a cross-sectional view taken along the dashed-dotted line C1-C2 in FIG. 3A. FIG. 3B illustrates a structure where the components up to the electrode 173 except the insulating layer 116 are formed over the substrate 111. Without the insulating layer 116, the electrode 171b cannot be provided. Accordingly, the pixel 230b cannot be provided.

To prevent a short circuit between the adjacent electrodes 171a or an increase in parasitic capacitance in the structure in FIG. 3B, a distance Gr needs to keep a certain length or longer. An increase in the distance Gr leads to an increase in a width Fr of the insulating layer 114. However, the structure without the insulating layer 116 enables a reduction in manufacturing costs and an improvement in the productivity.

Since the distance G in the display device 100 of one embodiment of the present invention can be substantially zero, a width F of the insulating layer 114 can be smaller than the width Fr (see FIG. 2A and FIG. 3A). A decrease in the width F leads to an increase in the proportion of the light-emitting area of the light-emitting element 170 in the area occupied by the pixel 230 (also referred to as aperture ratio).

For example, in the case where the constant emission luminance (amount of light) is obtained, emission luminance per unit area can be lowered by increasing the light-emitting area of the light-emitting element 170. That is, the deterioration of the light-emitting element 170 is reduced by increasing the aperture ratio, which leads to an increase in the reliability of the display device. Moreover, the visibility of the display device can be increased. Furthermore, the display quality of the display device can be improved.

The insulating layer 114 functions as a partition for preventing an electrical short circuit between the electrode 171a and the electrode 171b adjacent to each other (or between the adjacent electrodes 171a). In the case of using a metal mask for formation of the EL layer 172, the insulating layer 114 has a function of preventing the contact of the metal mask with a region where the light-emitting element 170 is formed.

However, in some cases, electric charge is supplied to the adjacent light-emitting elements 170 through the EL layer 172 formed along the surface of the insulating layer 114 to cause undesired light emission (also referred to as crosstalk). As a distance Kr of the EL layer 172 formed along the surface of the insulating layer 114 becomes smaller, the crosstalk easily occurs. That is, as the width F and the width Fr become smaller, the crosstalk easily occurs.

Since the display device 100 of one embodiment of the present invention includes the insulating layer 116, a distance K of the EL layer 172 formed along the surface of the insulating layer 114 can be kept at a certain length or longer even when the width F becomes small (see FIG. 2B).

Owing to the insulating layer 116, a distance between the vertex of the insulating layer 114 and the surface of the electrode 171a (i.e., a step) can be increased. In addition, with the insulating layer 116, the EL layer 172 is likely to have low step coverage. Thus, the resistance of the EL layer 172 on the insulating layer 114 can be increased. With the insulating layer 116, the crosstalk can be reduced and the display quality of the display device can be improved.

A head-mounted display device (also referred to as head-mounted display or HMD) used while being mounted on the head of a user is known. The HMD is often used as a display device for virtual reality (VR) because the user can feel a strong sense of immersion.

The user of the HMD sees an image enlarged by a lens. Thus, even when a display device has high resolution, the wide width F makes the user strongly feel graininess of the image because each pixel is independently emphasized. In particular, a display device including a self-luminous element as a display element has a high contrast ratio; thus, the user easily feels strong graininess of the image.

According to one embodiment of the present invention, the width F of a display device can be reduced. Accordingly, graininess of a displayed image can be reduced. With the use of the display device of one embodiment of the present invention, an HMD that can provide a strong sense of immersion can be obtained.

Modification Example 1

Figure 4:
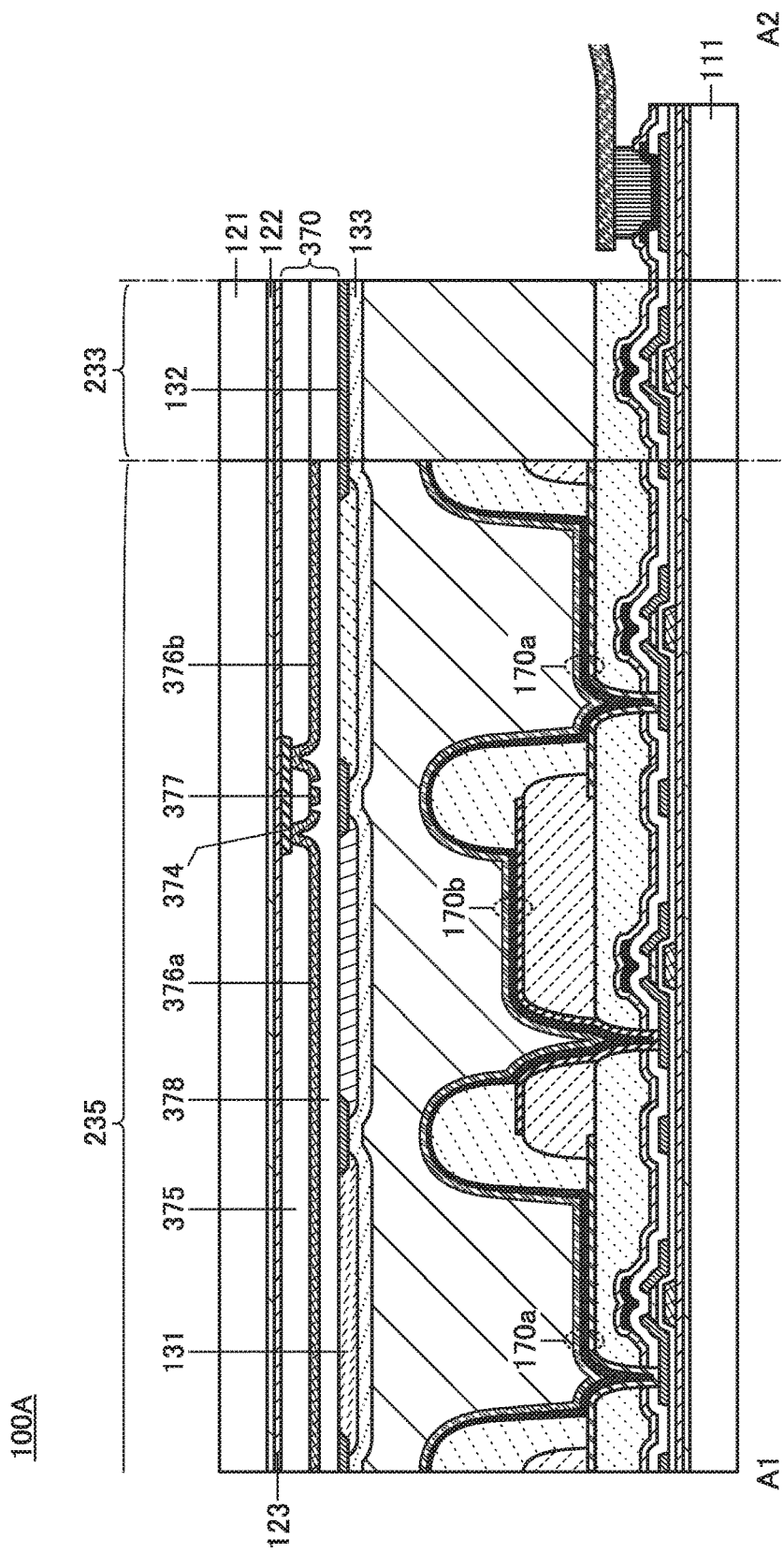
FIG. 4 illustrates a display device.

FIG. 4 illustrates a cross section of a display device 100A, which is a modification example of the display device 100. The display device 100A includes a touch sensor 370 between the substrate 121 and the coloring layer 131. In this embodiment, the touch sensor 370 includes a conductive layer 374, an insulating layer 375, a conductive layer 376a, a conductive layer 376b, a conductive layer 377, and an insulating layer 378.

The conductive layers 376a, 376b, and 377 are preferably formed using a light-transmitting conductive material. However, a light-transmitting conductive material generally has resistivity higher than that of a conductive material that does not have a light-transmitting property (a light-blocking conductive material). Thus, the conductive layers 376a, 376b, and 377 are formed using a metal material having low resistivity in some cases to increase the size and definition of the touch sensor.

When the conductive layers 376a, 376b, and 377 are formed using a metal material, the reflection of external light is preferably reduced. Although a metal material generally has high reflectivity, the reflectivity of the metal material can be reduced by oxidation treatment or the like to make the metal material darkened.

The conductive layers 376a, 376b, and 377 may be formed using a stack including a metal layer and a layer having low reflectivity (also referred to as a dark layer). The dark layer has high resistivity; thus, the stack including the metal layer and the dark layer is preferable. Examples of the dark layer include a layer containing copper oxide and a layer containing copper chloride or tellurium chloride. Alternatively, the dark layer may be formed using a metal particle such as an Ag particle, an Ag fiber, or a Cu particle, a carbon nanoparticle such as a carbon nanotube (CNT) or graphene, or a conductive high molecule such as PEDOT, polyaniline, or polypyrrole, for example.

As the touch sensor 370, an optical touch sensor including a photoelectric conversion element as well as a resistive touch sensor or a capacitive touch sensor may be used. Examples of the capacitive touch sensor include a surface capacitive touch sensor and a projected capacitive touch sensor. Examples of the projected capacitive touch sensor include a self-capacitive touch sensor and a mutual capacitive touch sensor, which differ mainly in the driving method. The use of a mutual capacitive touch sensor is preferable because multiple points can be sensed simultaneously.

Other components are similar to those of the display device 100 and thus are not described in detail.

Figure 5:
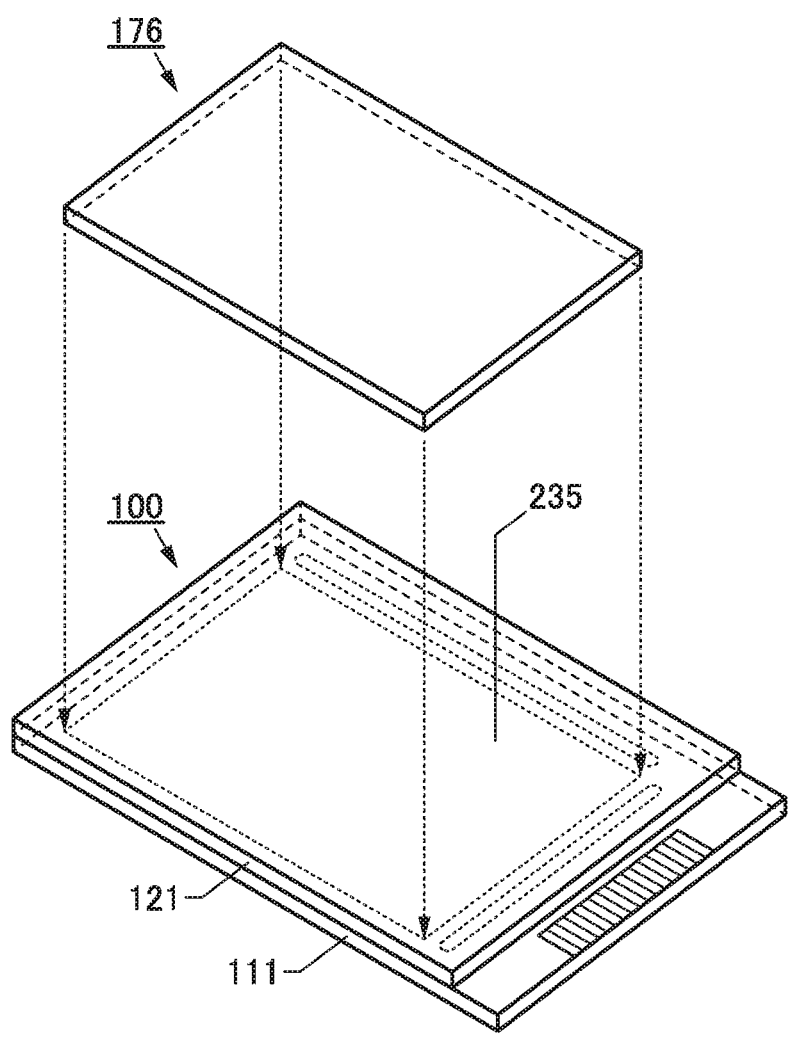
FIG. 5 illustrates a display device.

Alternatively, a touch sensor may be provided on the outer side of the substrate 121 without the formation of the touch sensor 370 between the substrate 121 and the coloring layer 131. For example, a sheet-like touch sensor 176 may be provided to overlap with the display region 235 (see FIG. 5).

Modification Example 2

Figure 6:
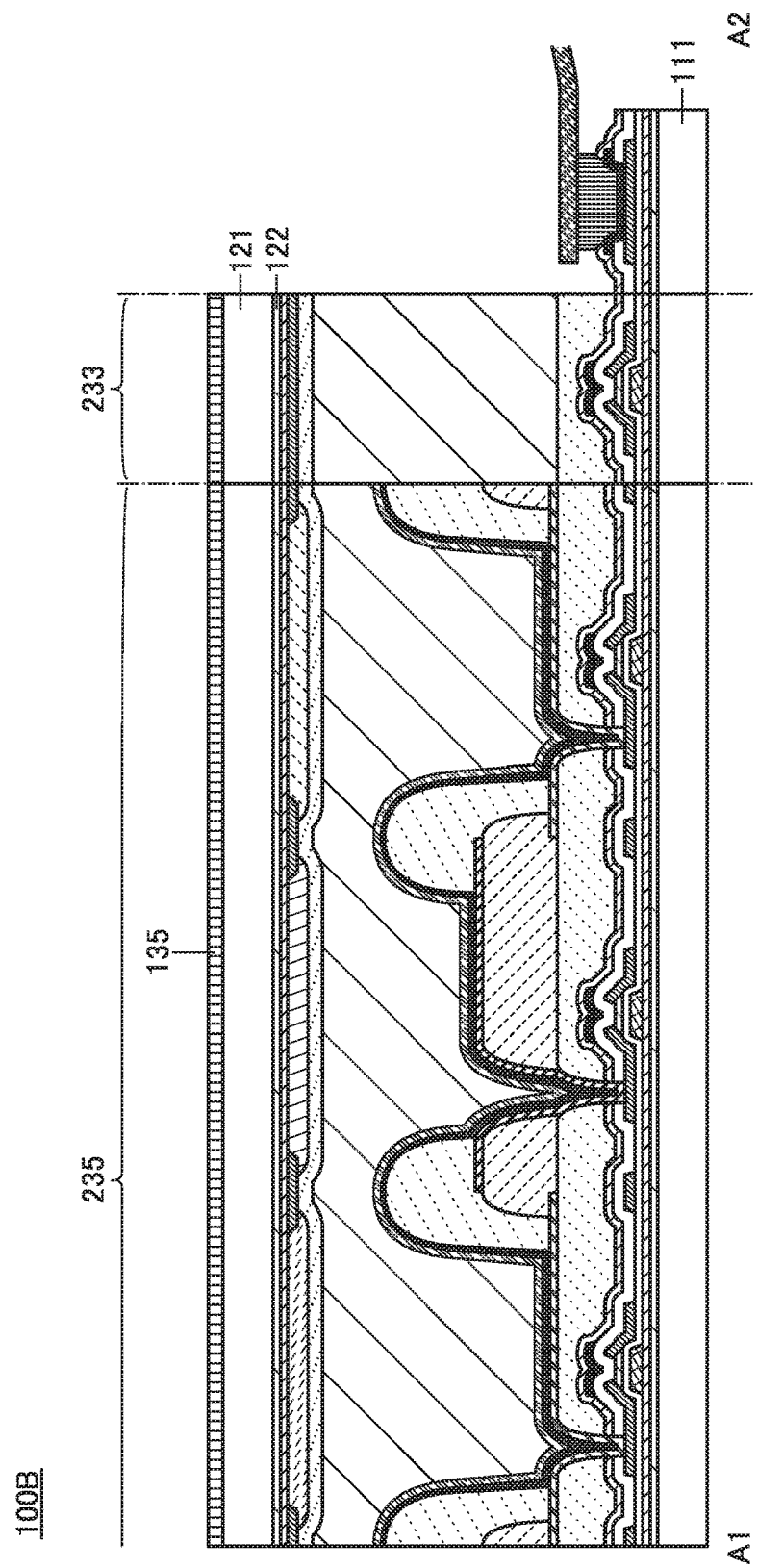
FIG. 6 illustrates a display device.

FIG. 6 illustrates a cross section of a display device 100B, which is another modification example of the display device 100. In the display device 100B, a functional member 135 is provided over the substrate 121.

Examples of the functional member 135 include optical members such as a polarizing plate, a retardation plate, a light diffusion layer (e.g., a diffusion film), an anti-reflection layer (also referred to as an AR layer), an anti-glare layer (also referred to as an AG layer), and a light-condensing film. Examples of the functional member except the optical members include an antistatic film preventing the attachment of dust, a water repellent film suppressing the attachment of stain, and a hard coat film suppressing generation of a scratch in use. As the functional member 135, some of the above members may be used in combination. For example, a circularly polarizing plate in which a linear polarizing plate and a retardation plate are combined may be used.

The AR layer has a function of reducing regular reflection (specular reflection) of external light by utilizing an optical interference effect. When the AR layer is used as the functional member 135, the AR layer is formed using a material with a refractive index different from that of the substrate 121. The AR layer can be formed using, for example, a material such as zirconium oxide, magnesium fluoride, aluminum oxide, or silicon oxide.

The anti-glare layer (AG layer) may be used instead of the AR layer. The AG layer has a function of reducing regular reflection (specular reflection) by diffusing incident external light.

As a method for forming the AG layer, a method in which fine unevenness is formed on a surface, a method in which materials with different refractive indices are mixed, a combination of both methods, and the like are known. For example, the AG layer can be formed by mixing a light-transmitting resin with nanofibers such as cellulose fibers, inorganic beads formed of silicon oxide or the like, resin beads, or the like.

The AG layer may be provided to overlap with the AR layer. When a stack including the AG layer and the AR layer is used, a function of preventing reflection and glare of external light can be enhanced. With the use of the AR layer and/or the AG layer, for example, the external-light reflectivity of a surface of the display device is preferably less than 1%, further preferably less than 0.3%.

Other components are similar to those of the display device 100 and thus are not described in detail.

Modification Example 3

Figure 7:
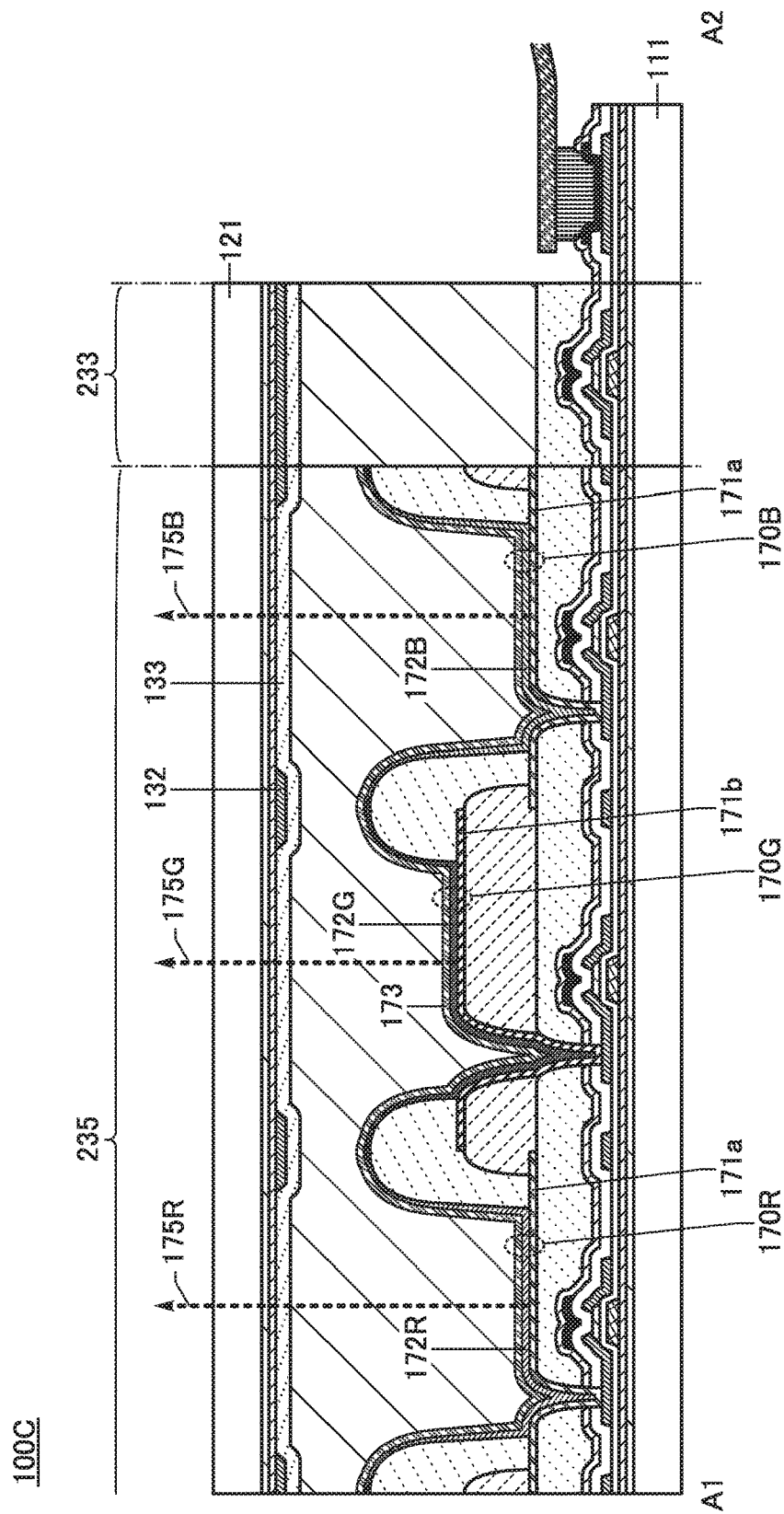
FIG. 7 illustrates a display device.

FIG. 7 illustrates a cross section of a display device 100C, which is another modification example of the display device 100. The display device 100C includes the light-emitting elements 170 emitting light of different colors in the respective pixels. FIG. 7 illustrates a light-emitting element 170R emitting red light 175R, a light-emitting element 170G emitting green light 175G, and a light-emitting element 170B emitting blue light 175B, for example.

The light-emitting element 170R includes the electrode 171a, an EL layer 172R, and the electrode 173. The light-emitting element 170G includes the electrode 171b, an EL layer 172G, and the electrode 173. The light-emitting element 170B includes the electrode 171a (which is different from the electrode 171a of the light-emitting element 170R), an EL layer 172B, and the electrode 173.

The EL layers 172 (the EL layer 172R, the EL layer 172G, and the EL layer 172B in FIG. 7) that emit light of different colors are provided in the respective pixels, whereby the emission colors with high color purity can be obtained. Thus, the coloring layer 131 is not necessarily formed. In addition, as described above, when the light-emitting element 170R, the light-emitting element 170G, and the light-emitting element 170B each have a microcavity structure, the color purity can be further increased.

Modification Example 4

Figure 8:
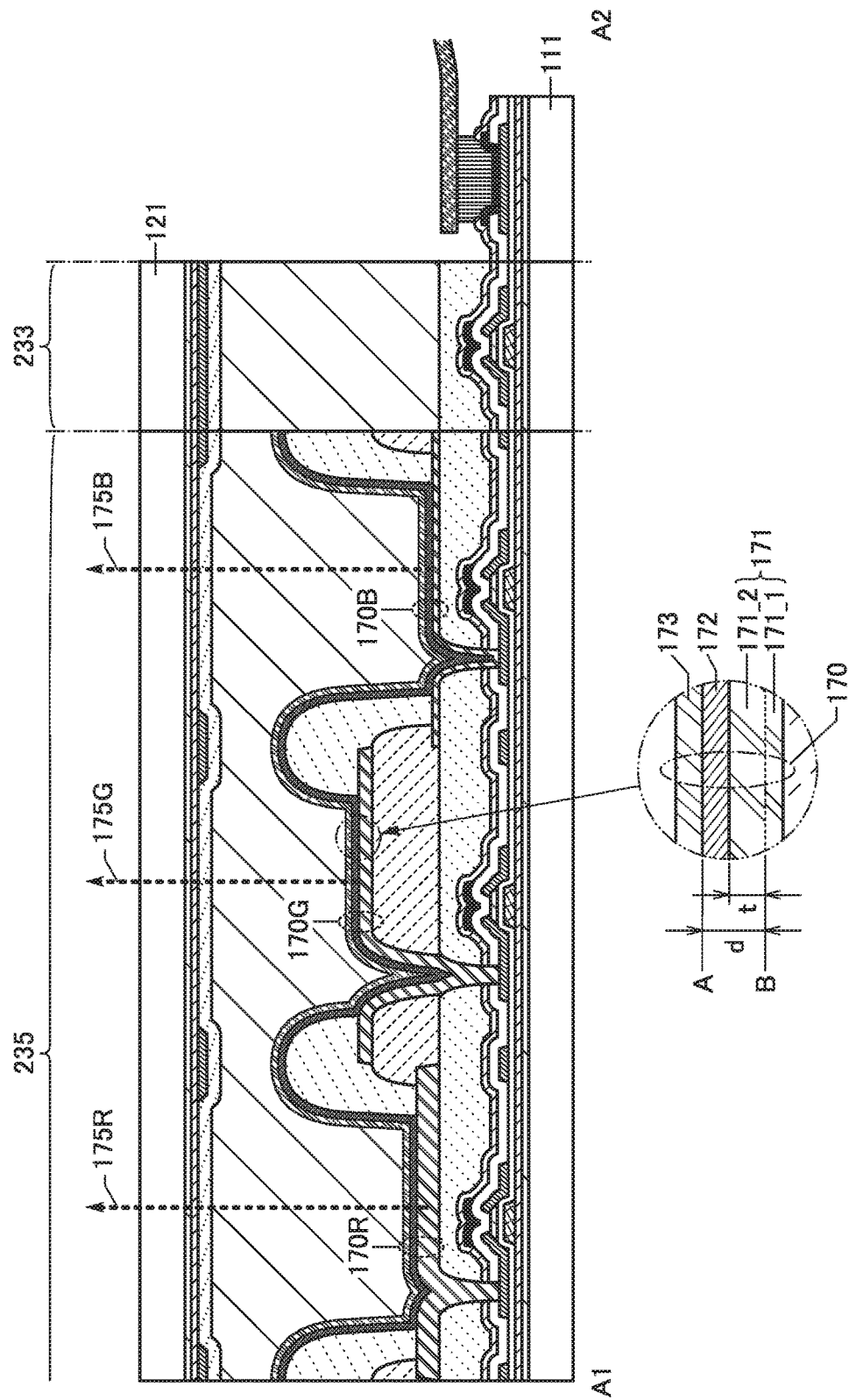
FIG. 8 illustrates a display device.

FIG. 8 illustrates a cross section of a display device 100D, which is another modification example of the display device 100. The display device 100D includes the light-emitting element 170 having a microcavity structure.

With the use of the light-emitting elements 170 each having a microcavity structure, a different emission color for each pixel can be obtained even when the EL layers 172 emitting light of the same color (e.g., white) are provided in the respective pixels. FIG. 8 illustrates the light-emitting element 170R emitting the red light 175R, the light-emitting element 170G emitting the green light 175G, and the light-emitting element 170B emitting the blue light 175B, for example.

In the case where the light-emitting element 170 has a microcavity structure, the electrode 173 is formed using a conductive material (a semi-transmissive material) which transmits and reflects a certain proportion of light, and the electrode 171 is formed by stacking a conductive material having high reflectance (the reflectance of visible light is preferably higher than or equal to 80% and lower than or equal to 100%, further preferably higher than or equal to 90% and lower than or equal to 100%) and a conductive material having high transmittance (the transmittance of visible light is preferably higher than or equal to 70% and lower than or equal to 100%, further preferably higher than or equal to 90% and lower than or equal to 100%). Here, the electrode 171 has a stacked structure of an electrode 171_1 formed using a conductive material having a function of reflecting visible light and an electrode 171_2 formed using a conductive material having a function of transmitting visible light. The electrode 171_2 is provided between the EL layer 172 and the electrode 171_1 that can function as a reflective electrode.

For example, the electrode 173 may be formed using a conductive material containing silver (Ag) or a conductive material containing aluminum (Al) having a thickness of 1 nm to 30 nm, or preferably 1 nm to 15 nm. For example, the electrode 173 is formed using a 10-nm-thick conductive material containing silver and magnesium.

The electrode 171_1 may be formed using a conductive material containing silver (Ag) or a conductive material containing aluminum (Al) having a thickness of 50 nm to 500 nm, or preferably 50 nm to 200 nm, for example. For example, the electrode 171_1 is formed using a 100-nm-thick conductive material containing silver.

The electrode 171_2 may be formed using a conductive oxide containing indium (In) or a conductive oxide containing zinc (Zn) having a thickness of 1 nm to 200 nm, preferably 5 nm to 100 nm, for example. For example, the electrode 171_2 is formed using indium tin oxide. Furthermore, a conductive oxide may be provided under the electrode 171_1.

By changing the thickness t of the electrode 171_2, a distance d from the interface A between the electrode 173 and the EL layer 172 to the interface B between the electrode 171_1 and the electrode 171_2 can be set to a given value. In other words, an optical path length from the interface A to the interface B can be set to a given value.

When the wavelength of light generated in the EL layer 172 is set to $\lambda$, the light-emitting element 170 having a microcavity structure emits light whose optical path length is equal to an integer multiple of $\lambda/2$. Thus, light emission with a narrow spectral width can be obtained. When the thickness t of the electrode 171_2 varies between pixels, light with a different wavelength for each pixel can be obtained even with the use of the EL layers 172 emitting light of the same color.

The use of a microcavity structure makes it possible to have high color purity of each emission color, and a display device achieves favorable color reproducibility. It is not necessary to independently form the EL layer 172 in each pixel depending on the emission color; thus, the productivity of a display device can be improved. Furthermore, a high-definition display device can be achieved easily.

Note that a method for adjusting the distance d is not limited to the above method. For example, the distance d may be adjusted by changing the thickness of the EL layer 172.

The light-emitting element 170 having a microcavity structure and the coloring layer 131 may be used in combination. In that case, glare of light that enters from the outside (also referred to as external light) can be reduced.

For example, the case where the light-emitting element 170 that emits the red light 175R with a microcavity structure and the coloring layer 131 that transmits red light are used in combination is described. The wavelength range other than a red wavelength range of external light is absorbed by the coloring layer 131 that transmits the red light. The red external light that passes through the coloring layer 131 and enters the light-emitting element 170 almost disappears by the effect of the microcavity structure.

When the light-emitting element 170 having a microcavity structure and the coloring layer 131 are used in combination, glare of external light can be reduced, leading to improved visibility of a display device. Furthermore, a display device having a high display quality can be achieved. Moreover, since a functional member for preventing glare is not necessarily provided, the productivity of a display device can be increased.

This embodiment can be implemented in an appropriate combination with any of the structures described in the other embodiments and the like.

Embodiment 2

An example of a method for manufacturing the display device 100 is described with reference to drawings. In this embodiment, the display region 235 is focused on in the description of the manufacturing method.

Note that insulating layers, semiconductor layers, conductive layers for forming electrodes and wirings, and the like included in the display device can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As the thermal CVD method, for example, a metal organic chemical vapor deposition (MOCVD) method may be used.

The insulating layers, the semiconductor layers, the conductive layers for forming the electrodes and the wirings, or the like included in the display device may be formed by a method such as spin coating, dipping, spray coating, inkjetting, dispensing, screen printing, or offset printing, or with a slit coater, a roll coater, a curtain coater, or a knife coater.

By using the PECVD method, a high-quality film can be formed at relatively low temperatures. By using a deposition method that does not use plasma for deposition, such as the MOCVD method, the ALD method, or the thermal CVD method, damage is not easily caused on a surface on which the film is deposited. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. Such plasma damage is not caused in the case of using a deposition method without using plasma, and thus the yield of a semiconductor device can be increased. In addition, since plasma damage does not occur in the deposition, a film with few defects can be obtained.

Unlike in a deposition method in which particles ejected from a target or the like are deposited, in the CVD method and the ALD method, a film is formed by reaction at a surface of an object. Thus, the CVD method and the ALD method enable favorable step coverage almost regardless of the shape of an object. In particular, the ALD method enables excellent step coverage and excellent thickness uniformity and can be suitably used for covering a surface of an opening with a high aspect ratio, for example. On the other hand, the ALD method has a relatively low deposition rate; thus, it is sometimes preferable to combine the ALD method with another deposition method with a high deposition rate, such as the CVD method.

When the CVD method or the ALD method is used, composition of a film to be formed can be controlled with a flow rate ratio of source gases. For example, by the CVD method or the ALD method, a film with a desired composition can be formed by adjusting the flow rate ratio of the source gases. Moreover, by changing the flow rate ratio of the source gases during deposition by the CVD method or the ALD method, a film whose composition is continuously changed can be formed. In the case where a film is formed while the flow rate ratio of the source gases is changed, the time for deposition can be shorter than in the case where a film is formed using a plurality of deposition chambers because time for transfer and pressure adjustment can be saved. Thus, semiconductor devices can be manufactured with improved productivity in some cases.

In the case where a film is formed by the ALD method, a gas that does not contain chlorine is preferably used as a material gas.

When an oxide semiconductor is formed by a sputtering method, each chamber of a sputtering apparatus is preferably evacuated to a high vacuum (to the degree of approximately $5\times10^{-7}$ Pa to $1\times10^{-4}$ Pa) by an adsorption vacuum pump such as a cryopump so that water and the like acting as impurities for the oxide semiconductor can be removed as much as possible. In particular, the partial pressure of gas molecules corresponding to $H_2O$ (gas molecules corresponding to m/z=18) in the chamber in the standby mode of the sputtering apparatus is preferably lower than or equal to $1\times10^{-4}$ Pa, further preferably $5\times10^{-5}$ Pa. The deposition temperature is preferably higher than or equal to RT and lower than or equal to 500° C., further preferably higher than or equal to RT and lower than or equal to 300° C., still further preferably higher than or equal to RT and lower than or equal to 200° C.

In addition, increasing the purity of a sputtering gas is necessary. For example, as an oxygen gas or an argon gas used as a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor film can be minimized.

In the case where the insulating layers, the conductive layers, the semiconductor layers, or the like are formed by a sputtering method using a sputtering gas containing oxygen, oxygen can be supplied to a layer over which these layers are formed. As the amount of oxygen contained in the sputtering gas increases, the amount of oxygen supplied to the layer over which these layers are formed tends to increase.

The layers (thin films) included in the display device can be processed by a photolithography method or the like. Alternatively, island-shaped layers may be formed by a film formation method using a blocking mask. Alternatively, the layers may be processed by a nanoimprinting method, a sandblasting method, a lift-off method, or the like. Examples of the photolithography method include a method in which a resist mask is formed over a layer (thin film) to be processed, part of the layer (thin film) is selectively removed by using the resist mask as a mask, and the resist mask is removed, and a method in which a photosensitive layer is formed and exposed to light and developed to be processed into a desired shape.

In the case of using light in the photolithography method, any of an i-line (light with a wavelength of 365 nm), a g-line (light with a wavelength of 436 nm), and an h-line (light with a wavelength of 405 nm), or combined light of any of them can be used for exposure. Alternatively, ultraviolet light, KrF laser light, ArF laser light, or the like can be used. Exposure may be performed by liquid immersion exposure technique. As the light for the exposure, extreme ultra-violet (EUV) light or X-rays may be used. Instead of the light for the exposure, an electron beam can be used. It is preferable to use extreme ultra-violet (EUV) light, X-rays, or an electron beam because extremely minute processing can be performed. Note that in the case of performing exposure by scanning of a beam such as an electron beam, a photomask is not needed.

For the removal (etching) of the layers (thin films), a dry etching method, a wet etching method, a sandblast method, or the like can be used. Alternatively, these etching methods may be employed in combination.

Manufacturing Method Example

Figure 14:
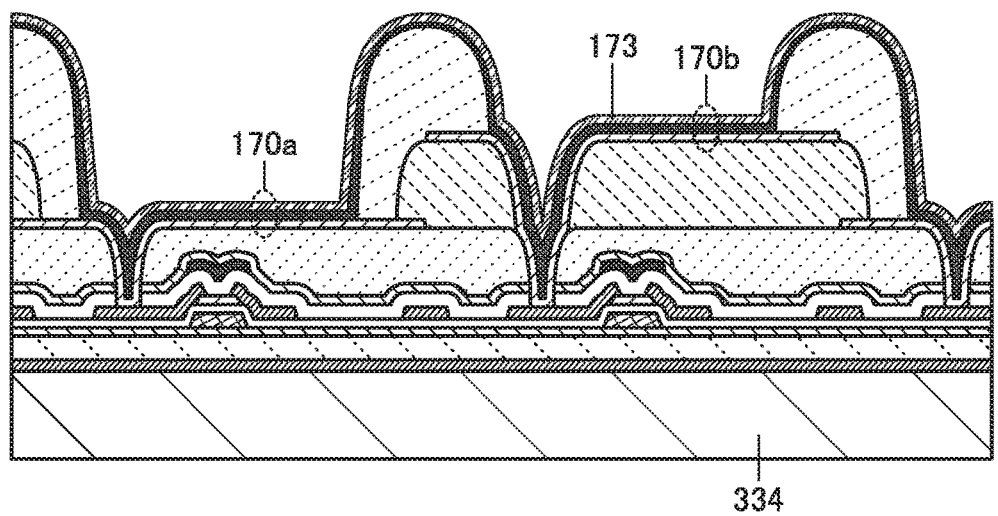
FIG. 14 illustrates a method for manufacturing a display device.

The display device 100 described in this embodiment is manufactured by combining a first element substrate 181 (see FIG. 9D) and a second element substrate 182 (see FIG. 14).

[First Element Substrate 181]

First, a method for forming the first element substrate 181 is described.

[Step A1]

Figure 9A:
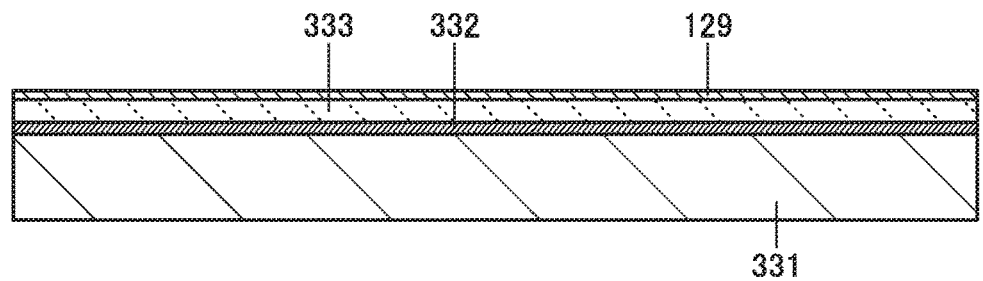
FIGS. 9A to 9D illustrate a method for manufacturing a display device.

A separation layer 332 is formed over a support substrate 331, and a layer 333 is formed over the separation layer 332 (see FIG. 9A). The support substrate 331 can be formed using a material similar to that of the substrate 111 or 121. The support substrate 331 preferably has a function of transmitting ultraviolet light.

In this embodiment, a glass substrate is used as the support substrate 331. The support substrate 331 preferably has mechanical strength high enough to withstand a manufacturing process of the display device 100. In other words, the support substrate 331 preferably has rigidity high enough to facilitate the transfer and has resistance to heat applied in the manufacturing process.

The separation layer 332 preferably has a function of absorbing light for separation performed later in Step C6. As the separation layer 332, a metal layer, a metal oxide layer, or the like can be used. For example, titanium oxide (TAX), molybdenum oxide, aluminum oxide, tungsten oxide, indium tin oxide containing silicon (ITSO), indium zinc oxide, and an In—Ga—Zn oxide can be used for the separation layer 332.

There is no particular limitation on a method for forming the separation layer 332. For example, the separation layer 332 can be formed by a sputtering method, a plasma-enhanced CVD method, an evaporation method, a sol-gel method, an electrophoretic method, a spray method, or the like.

In the case where the separation layer 332 includes a metal oxide, the separation layer 332 can be formed in such a manner that a metal layer is formed and then oxygen is introduced into the metal layer. At this time, only a surface of the metal layer or the entire metal layer is oxidized. In the former case, the introduction of oxygen into the metal layer forms a structure in which the metal layer and the metal oxide layer are stacked.

The metal layer may be oxidized by heating in an oxygen-containing atmosphere. In this case, the metal layer is preferably heated while an oxygen-containing gas is supplied. The temperature at which the metal layer is heated is preferably higher than or equal to 100° C. and lower than or equal to 500° C., further preferably higher than or equal to 100° C. and lower than or equal to 450° C., still further preferably higher than or equal to 100° C. and lower than or equal to 400° C., yet still further preferably higher than or equal to 100° C. and lower than or equal to 350° C.

The temperature at which the metal layer is heated is preferably lower than or equal to the maximum temperature in manufacturing the transistor. In that case, the maximum temperature in manufacturing the display device can be prevented from increasing. When the temperature at which the metal layer is heated is set to lower than or equal to the maximum temperature in manufacturing the transistor, a manufacturing apparatus for the manufacturing process of the transistor, for example, can also be utilized, which reduces additional capital investment and the like. As a result, the display device can be manufactured at reduced costs. When the manufacturing temperature of the transistor is lower than or equal to 350° C., for example, the temperature of the heat treatment is preferably lower than or equal to 350° C.

Alternatively, the separation layer 332 may be formed in such a manner that a metal layer is formed and then radical treatment is performed on a surface of the metal layer. In the radical treatment, the surface of the metal layer is preferably exposed to an atmosphere containing an oxygen radical and/or a hydroxyl radical. For example, plasma treatment is preferably performed in an atmosphere containing oxygen and/or water vapor ($H_2O$).

The radical treatment can be performed with a plasma generation apparatus or an ozone generation apparatus. For example, oxygen plasma treatment, hydrogen plasma treatment, water plasma treatment, ozone treatment, or the like can be performed. Oxygen plasma treatment can be performed by generating plasma in an oxygen-containing atmosphere. Hydrogen plasma treatment can be performed by generating plasma in a hydrogen-containing atmosphere. Water plasma treatment can be performed by generating plasma in an atmosphere containing water vapor ($H_2O$). Water plasma treatment is particularly preferable because it makes a large amount of moisture present on the surface of the separation layer 332 or in the separation layer 332.

Plasma treatment may be performed in an atmosphere containing two or more of oxygen, hydrogen, water (water vapor), and an inert gas (typically, argon). Examples of the plasma treatment include plasma treatment in an atmosphere containing oxygen and hydrogen, plasma treatment in an atmosphere containing oxygen and water, plasma treatment in an atmosphere containing water and argon, plasma treatment in an atmosphere containing oxygen and argon, and plasma treatment in an atmosphere containing oxygen, water, and argon. An argon gas is preferably used for the plasma treatment, in which case the separation layer 332 can be damaged during the plasma treatment.

Two or more kinds of plasma treatment may be performed sequentially without exposure to the air. For example, argon plasma treatment may be followed by water plasma treatment.

In the above manner, hydrogen, oxygen, a hydrogen radical (H*), an oxygen radical (O*), a hydroxyl radical (OH*), and the like can be present on the surface of the separation layer 332 or in the separation layer 332. These elements are changed into $H_2O$ by being heated by heat treatment or light irradiation.

The separation layer 332 preferably has a thickness of, for example, greater than or equal to 1 nm and less than or equal to 200 nm, further preferably greater than or equal to 5 nm and less than or equal to 100 nm, and still further preferably greater than or equal to 5 nm and less than or equal to 50 nm.

In the case where the separation layer 332 is formed by oxidizing the metal layer, the completed separation layer 332 sometimes becomes thicker than the initially formed metal layer.

Before or during a separation between the separation layer 332 and the layer 333, performed in a later step, the force required for the separation can be reduced by feeding a water-containing liquid to the interface between the separation layer 332 and the layer 333. The smaller the contact angle between the separation layer 332 and the liquid is, the smaller the force required for the separation can be. Specifically, the contact angle between the separation layer 332 and the water-containing liquid is preferably greater than 0° and less than or equal to 60°, further preferably greater than 0° and less than or equal to 50°. When the wettability with respect to the water-containing liquid is extremely high (e.g., when the contact angle is approximately 20° or less), it is sometimes difficult to obtain an accurate value of the contact angle. The wettability of the separation layer 332 with respect to the water-containing liquid is preferably as high as possible. Therefore, the wettability with respect to the water-containing liquid may be high enough to prevent an accurate value of the contact angle from being obtained.

Titanium oxide, tungsten oxide, or the like is suitable for the separation layer 332. Titanium oxide is preferably used because the costs can be lower than that when tungsten oxide is used.

The separation layer 332 may have a photocatalyst function. When the separation layer 332 having a photocatalyst function is irradiated with light, photocatalytic reaction can be caused. As a result, the bonding strength between the separation layer 332 and the layer 333 is weakened to facilitate the separation in some cases. The separation layer 332 can be appropriately irradiated with light with a wavelength for activating the separation layer 332. For example, the separation layer 332 is irradiated with ultraviolet light. For example, after the separation layer 332 is formed, the separation layer 332 may be directly irradiated with ultraviolet light not through another layer. An ultraviolet light lamp can be suitably used for the ultraviolet light irradiation. Examples of the ultraviolet light lamp include a mercury lamp, a mercury xenon lamp, and a metal halide lamp. Alternatively, the separation layer 332 may be activated through the laser irradiation step which is performed before the separation.

The separation layer 332 may be formed using titanium oxide to which a metal element or nitrogen is added. When the separation layer 332 is formed using titanium oxide to which such an element is added, visible light can be used for the separation between the separation layer 332 and the layer 333 instead of ultraviolet light.

The layer 333 can be formed using any of a variety of resin materials (including resin precursors). The layer 333 is preferably formed using a thermosetting material. The layer 333 may be formed using a material with photosensitivity or a material without photosensitivity (also called a non-photosensitive material).

When a photosensitive material is used, part of the layer 333 is removed by a photolithography method, whereby the layer 333 having a desired shape can be formed.

The layer 333 is preferably formed using a material containing a polyimide resin or a polyimide resin precursor. The layer 333 can be formed using, for example, a material containing a polyimide resin and a solvent or a material containing polyamic acid and a solvent. A polyimide is a material suitable for a planarization film or the like of a display device, and therefore, the film formation apparatus and the material can be shared. Thus, there is no need to prepare another apparatus and another material to obtain the structure of one embodiment of the present invention.

Examples of resin materials that can be used to form the layer 333 include an acrylic resin, an epoxy resin, a polyamide resin, a polyimide-amide resin, a siloxane resin, a benzocyclobutene-based resin, a phenol resin, and precursors of these resins.

The layer 333 is preferably formed with a slit coater or a spin coater. By a spin coating method, a thin film can be uniformly formed over a large-sized substrate.

The layer 333 is preferably formed using a solution having a viscosity of greater than or equal to 5 cP and less than 500 cP, further preferably greater than or equal to 5 cP and less than 100 cP, still further preferably greater than or equal to 10 cP and less than or equal to 50 cP. The lower the viscosity of the solution is, the easier the coating is. Furthermore, the lower the viscosity of the solution is, the more the entry of air bubbles can be inhibited and thus the higher the quality of a formed layer can be.

The layer 333 may be formed using an inorganic material that releases hydrogen by heating. For example, the layer 333 may be formed using amorphous silicon containing hydrogen.

Next, the layer 333 is cured by heat treatment. The heat treatment can be performed while a gas containing one or more of oxygen, nitrogen, and a rare gas (e.g., argon) is supplied into a chamber of a heating apparatus, for example. Alternatively, the heat treatment can be performed in an air atmosphere with the use of a chamber of a heating apparatus, a hot plate, or the like.

When the heat treatment is performed in an air atmosphere or performed while a gas containing oxygen is supplied, the layer 333 is sometimes colored by oxidation to have decreased visible-light transmitting property. For that reason, heating is preferably performed while a nitrogen gas is supplied. Thus, the visible-light transmitting property of the layer 333 can be increased.

The temperature of the heat treatment is preferably set to lower than or equal to the maximum temperature in manufacturing the transistor. When the manufacturing temperature of the transistor is lower than or equal to 350° C., for example, the temperature of the heat treatment is preferably lower than or equal to 350° C.

The duration of the heat treatment is preferably longer than or equal to 5 minutes and shorter than or equal to 24 hours, further preferably longer than or equal to 30 minutes and shorter than or equal to 12 hours, still further preferably longer than or equal to 1 hour and shorter than or equal to 6 hours, for example. Note that the duration of the heat treatment is not particularly limited to these examples. For example, the duration of the heat treatment that is performed by a rapid thermal annealing (RTA) method may be shorter than five minutes.

As the heating apparatus, it is possible to use, for example, an electric furnace or any apparatus for heating an object by heat conduction or heat radiation from a heating element such as a resistance heating element. For example, an RTA apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. With such an RTA apparatus, the treatment time can be shortened and thus the RTA apparatus is preferred for mass production. Alternatively, an in-line heating apparatus may be used in the heat treatment.

Before the heat treatment, heat treatment (also referred to as prebaking treatment) for removing the solvent contained in the layer 333 may be performed. The temperature of the prebaking treatment can be set as appropriate according to the material to be used. For example, the temperature of the prebaking treatment can be higher than or equal to 50° C. and lower than or equal to 180° C., higher than or equal to 80° C. and lower than or equal to 150° C., or higher than or equal to 90° C. and lower than or equal to 120° C. The heat treatment may double as the prebaking treatment, in which case the solvent contained in the layer 333 can be removed by the heat treatment.

The layer 333 preferably has a thickness of greater than or equal to 0.01 μm and less than 10 μm, further preferably greater than or equal to 0.1 μm and less than or equal to 5 μm, still further preferably greater than or equal to 0.5 μm and less than or equal to 3 μm. By forming the layer 333 thin, the display device can be manufactured at low costs.

The layer 333 preferably has a thermal expansion coefficient of greater than or equal to 0.1 ppm/° C. and less than or equal to 50 ppm/° C., further preferably greater than or equal to 0.1 ppm/° C. and less than or equal to 20 ppm/° C., still further preferably greater than or equal to 0.1 ppm/° C. and less than or equal to 10 ppm/° C. The lower the thermal expansion coefficient of the layer 333 is, the more the generation of a crack in a layer included in a transistor or the like and breakage of a transistor or the like which are caused owing to the heating can be prevented.

The separation layer 332 can be physically separated from the layer 333 instead of being irradiated with light.

In the case where the separation layer 332 is physically separated from the layer 333, a stack including a layer containing a high-melting-point metal material such as tungsten and a layer containing oxide of the metal material is used as the separation layer 332, for example. A metal layer that contains a high-melting-point metal material and has a surface oxidized by oxygen plasma treatment or the like may also be used.

In addition, in the case where the separation layer 332 is physically separated from the layer 333, an inorganic insulating material containing oxygen, such as silicon oxide, silicon oxynitride, or silicon nitride oxide, is used for the layer 333.

The separation layer 332 can be separated from the layer 333 by applying a perpendicular tensile force to the support substrate 331 over which the separation layer 332 is formed.

As in the separation by the light irradiation, the physical separation can be easily performed in such a manner that a water-containing liquid such as water or an aqueous solution is fed to the separation interface so that the liquid penetrates into the separation interface. Furthermore, an adverse effect of static electricity caused at the separation on a functional element such as a transistor (e.g., damage to a semiconductor element from static electricity) can be suppressed.

The liquid to be fed can be water (preferably pure water), a neutral, alkaline, or acidic aqueous solution, an aqueous solution in which a salt is dissolved, or the like. Other examples of the liquid include ethanol and acetone. Any of a variety of organic solvents may also be used.

When the separation is performed by the light irradiation, the separation layer 332 is not necessarily formed. Note that the formation of the separation layer 332 leads to an increase in the absorption amount of irradiation light. In addition, the formation of the separation layer 332 leads to an increase in the yield of a separation step. Accordingly, the productivity of the display device can be improved.

The layer 333 may be formed using a water-soluble resin material. When the layer 333 is formed using a water-soluble resin material, a cleaning step can also serve as a step of separating the support substrate 331. Accordingly, a light irradiation step, a physical separation step, and the like can be omitted. A step of removing the layer 333, which is performed later, can also be omitted.

[Step A2]

Next, an insulating layer 129 is formed over the layer 333.

[Step A3]

Figure 9B:
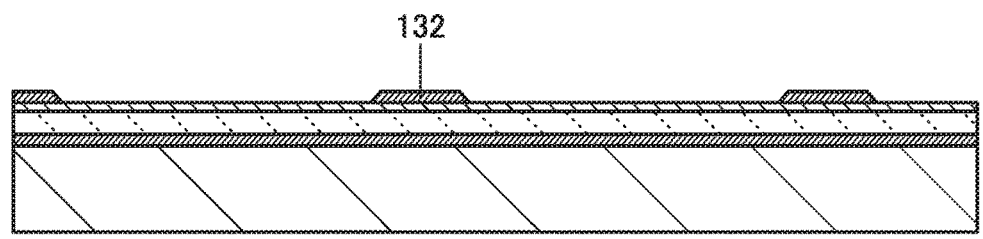

Then, the light-blocking layer 132 is formed over the insulating layer 129 (see FIG. 9B).

[Step A4]

Figure 9C:
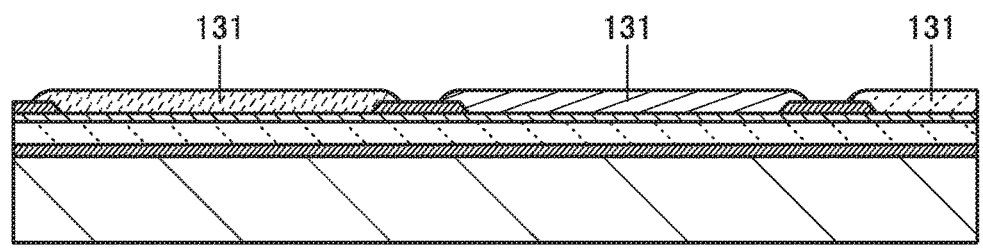

Next, the coloring layer 131 is formed over the insulating layer 129 and the light-blocking layer 132 (see FIG. 9C).

The coloring layer 131 is formed using a photosensitive material, in which case the processing into an island shape can be performed by a photolithography method or the like. The coloring layer 131 and the light-blocking layer 132 are formed as needed. Thus, at least one of the coloring layer 131 and the light-blocking layer 132 is not formed in some cases. Note that in the display device 100, the light-blocking layer 132 is formed to overlap with the peripheral circuit region 232, the peripheral circuit region 233, and the like.

[Step A5]

Figure 9D:
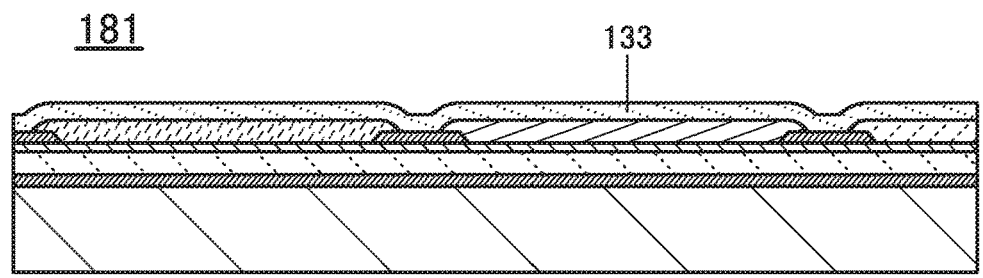

Then, the insulating layer 133 is formed over the coloring layer 131 and the light-blocking layer 132 (see FIG. 9D).

The insulating layer 133 preferably functions as a planarization layer. A resin material such as an acrylic resin or an epoxy resin is suitably used for the insulating layer 133. An inorganic insulating layer may be used as the insulating layer 133.

Through the above steps, the first element substrate 181 can be formed.

[Second Element Substrate 182]

Next, a method for forming the second element substrate 182 is described.

[Step B1]

Figure 10A:
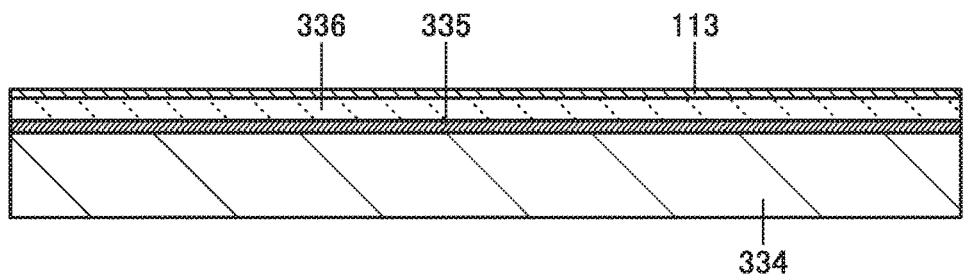
FIGS. 10A to 10D illustrate a method for manufacturing a display device.

A separation layer 335 is formed over a support substrate 334, a layer 336 is formed over the separation layer 335, and the insulating layer 113 is formed over the layer 336 (see FIG. 10A). For the support substrate 334, a material similar to that of the support substrate 331 can be used. The separation layer 335 is formed using a material and a method similar to those of the separation layer 332. The layer 336 is formed using a material and a method similar to those of the layer 333. The insulating layer 113 is formed using a material and a method similar to those of the insulating layer 129.

[Step B2]

Figure 10B:
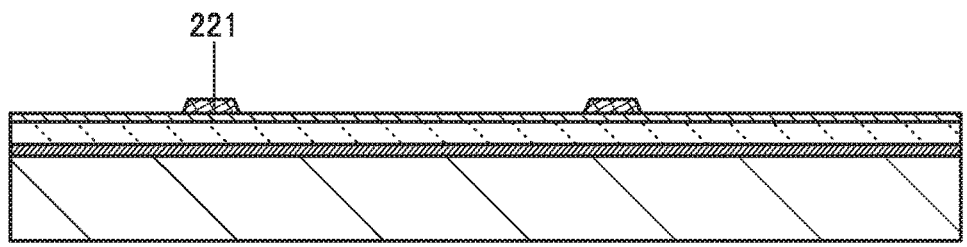

Then, the electrode 221 is formed over the insulating layer 113. The electrode 221 can be formed in the following manner: a conductive film is formed, a resist mask is formed, the conductive film is etched, and the resist mask is removed (see FIG. 10B).

[Step B3]

Figure 10C:
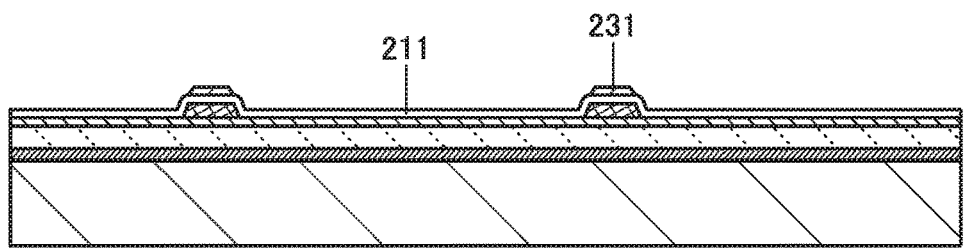

Next, the insulating layer 211 is formed over the insulating layer 113 and the electrode 221 (see FIG. 10C). For the insulating layer 211, for example, an inorganic insulating film such as a silicon nitride film, a silicon oxynitride film, a silicon oxide film, a silicon nitride oxide film, an aluminum oxide film, or an aluminum nitride film can be used. Alternatively, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An inorganic insulating film is preferably formed at high temperatures because the film can have higher density and a higher barrier property as the deposition temperature becomes higher. The substrate temperature during the deposition of the inorganic insulating film is preferably higher than or equal to room temperature (25° C.) and lower than or equal to 350° C., further preferably higher than or equal to 100° C. and lower than or equal to 300° C.

When an oxide semiconductor is used for the semiconductor layer 231, an insulating layer including a region in contact with the semiconductor layer 231 is preferably an insulating layer from which oxygen is released by heating (hereinafter, such an insulating layer is also referred to as an insulating layer containing excess oxygen). Therefore, when an oxide semiconductor is used for the semiconductor layer 231, the insulating layer 211 is preferably the insulating layer containing excess oxygen.

Note that in this specification and the like, oxygen released from a layer by heating is referred to as excess oxygen. The insulating layer containing excess oxygen may be an insulating layer in which the amount of released oxygen converted into oxygen atoms is $1.0 \times 10^{18}$ atoms/cm$^3$ or more, $1.0 \times 10^{19}$ atoms/cm$^3$ or more, or $1.0 \times 10^{20}$ atoms/cm$^3$ or more, in thermal desorption spectroscopy (TDS) analysis performed under such a condition that a surface of the insulating layer is heated at a temperature higher than or equal to 100° C. and lower than or equal to 700° C., preferably higher than or equal to 100° C. and lower than or equal to 500° C.

[Step B4]

Then, the semiconductor layer 231 is formed (see FIG. 10C). In this embodiment, an oxide semiconductor layer is formed as the semiconductor layer 231. The oxide semiconductor layer can be formed in the following manner: an oxide semiconductor film is formed, a resist mask is formed, the oxide semiconductor film is etched, and the resist mask is removed.

The substrate temperature during the formation of the oxide semiconductor film is preferably lower than or equal to 350° C., further preferably higher than or equal to room temperature and lower than or equal to 200° C., still further preferably higher than or equal to room temperature and lower than or equal to 130° C.

The oxide semiconductor film can be formed using one of an inert gas and an oxygen gas. Note that there is no particular limitation on the flow rate ratio of oxygen (the partial pressure of oxygen) at the time of forming the oxide semiconductor film. To fabricate a transistor having high field-effect mobility, the flow rate ratio of oxygen (the partial pressure of oxygen) at the time of forming the oxide semiconductor film is preferably higher than or equal to 0% and lower than or equal to 30%, further preferably higher than or equal to 5% and lower than or equal to 30%, still further preferably higher than or equal to 7% and lower than or equal to 15%.

An oxide semiconductor film preferably contains at least indium or zinc. In particular, indium and zinc are preferably contained.

The energy gap of the oxide semiconductor is preferably 2 eV or more, further preferably 2.5 eV or more, and still further preferably 3 eV or more. The use of such an oxide semiconductor having a wide energy gap leads to a reduction in off-state current of a transistor.

A semiconductor material having an energy gap of 2.5 eV or more is particularly preferable because of its high visible-light transmittance.

The oxide semiconductor film can be formed by a sputtering method. Alternatively, a PLD method, a PECVD method, a thermal CVD method, an ALD method, a vacuum evaporation method, or the like may be used.

[Step B5]

Figure 10D:
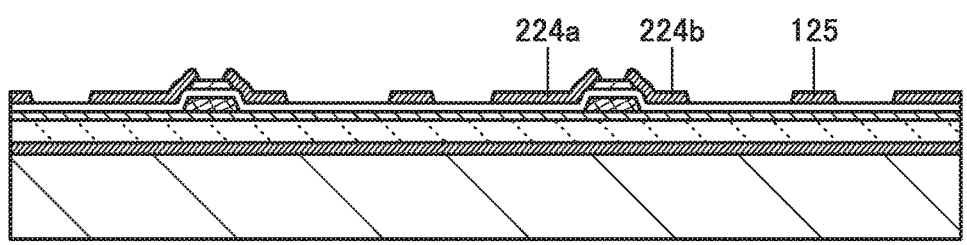

Next, the electrode 224a, the electrode 224b, and the wiring 125 are formed (see FIG. 10D). The electrode 224a, the electrode 224b, and the wiring 125 can be formed in the following manner: a conductive film is formed, a resist mask is formed, the conductive film is etched, and the resist mask is removed. Each of the electrode 224a and the electrode 224b is connected to the semiconductor layer 231.

Note that during the formation of the electrode 224a and the electrode 224b, the semiconductor layer 231 might be partly etched to be thin in a region not covered by the resist mask.

[Step B6]

Figure 11A:
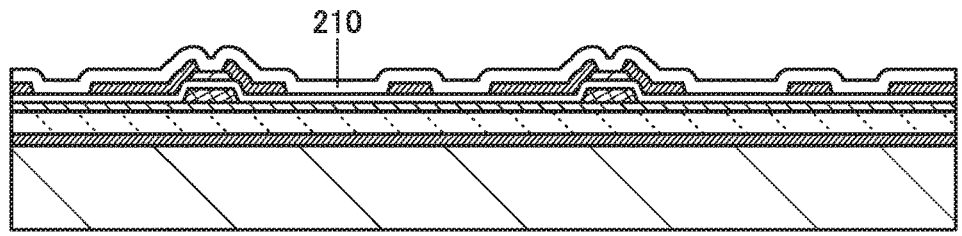
FIGS. 11A to 11D illustrate a method for manufacturing a display device.

Next, the insulating layer 210 is formed (see FIG. 11A). It is preferable to use an oxide insulating layer formed in an oxygen-containing atmosphere, such as a silicon oxide layer or a silicon oxynitride layer, as the insulating layer 210. The oxide insulating layer is formed in an oxygen-containing atmosphere, whereby the insulating layer containing excess oxygen can be formed.

[Step B7]

Figure 11B:
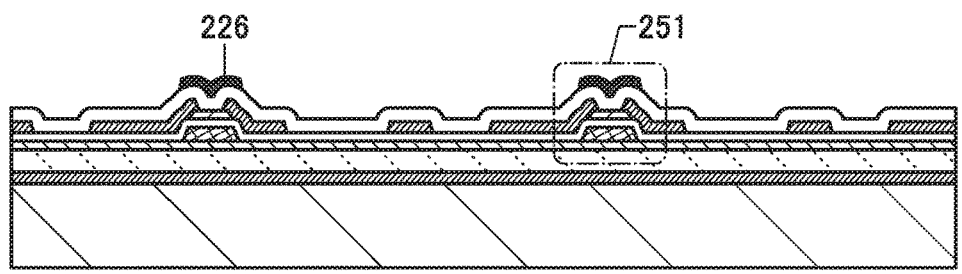

Next, the electrode 226 is formed over the insulating layer 210 (see FIG. 11B). The electrode 226 includes a region overlapping with the semiconductor layer 231. Through the above steps, the transistor 251 can be formed. Although not illustrated, the transistor 252 is formed in a similar manner.

[Step B8]

Figure 11C:
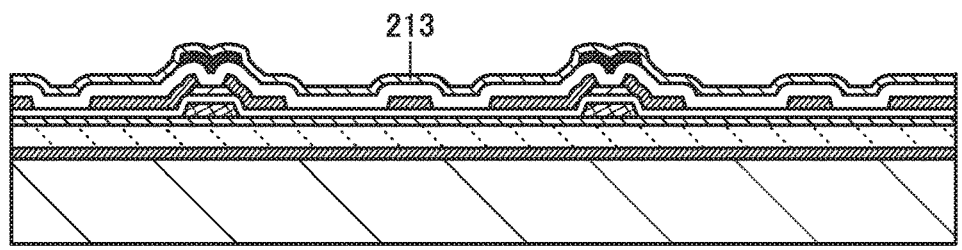

Next, the insulating layer 213 is formed (see FIG. 11C). The insulating layer 213 is preferably formed using an insulating material with low oxygen diffusibility and low oxygen permeability, such as silicon nitride.

When the insulating layer 210 is the insulating layer containing excess oxygen, a stack including the insulating layer 210 and an insulating film with low oxygen diffusibility and low oxygen permeability is heated, whereby oxygen can be efficiently supplied to the oxide semiconductor layer. As a result, oxygen vacancies in the oxide semiconductor layer can be filled and defects at the interface between the oxide semiconductor layer and the insulating layer 210 can be repaired, leading to a reduction in defect levels. Accordingly, an extremely highly reliable transistor can be fabricated. The use of such a transistor in a display device can increase the reliability of the display device.

[Step B9]

Figure 11D:
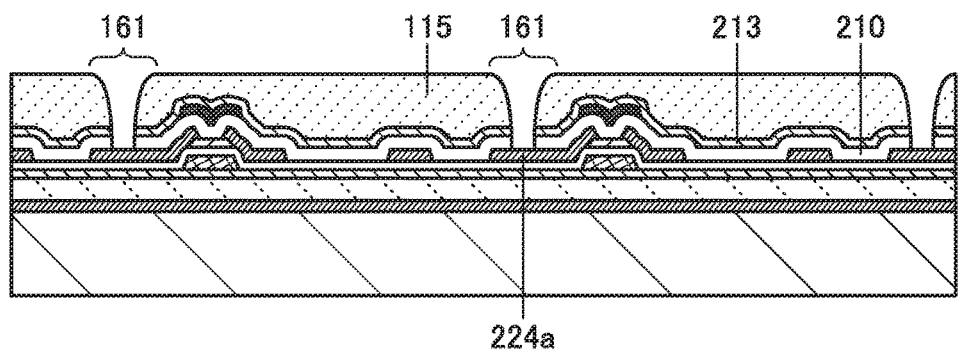

Then, the insulating layer 115 is formed (see FIG. 11D). The display element is formed on the insulating layer 115 in a later step; thus, the insulating layer 115 preferably functions as a planarization layer.

[Step B10]

Next, an opening 161 that reaches the electrode 224a is formed in the insulating layer 115, the insulating layer 213, and the insulating layer 210 (see FIG. 11D).

[Step B11]

Figure 12A:
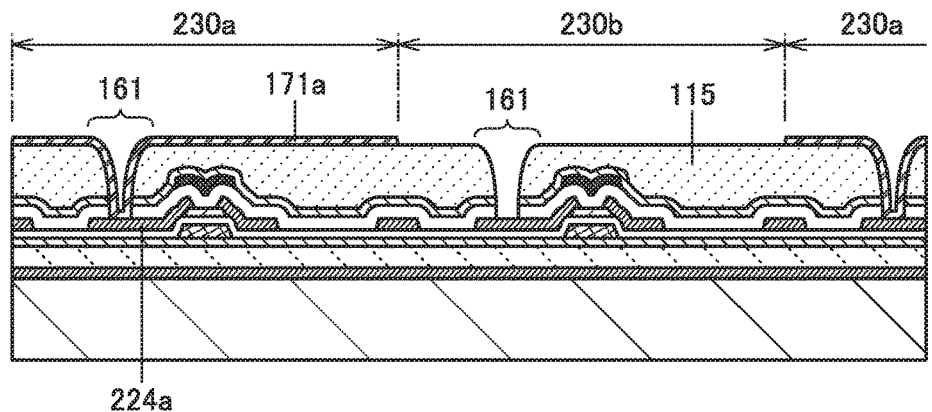
FIGS. 12A to 12C illustrate a method for manufacturing a display device.

Then, the electrode 171a is formed over a region, which is to be the pixel 230a, of the insulating layer 115 (see FIG. 12A). The electrode 171a can be formed in the following manner: a conductive film is formed, a resist mask is formed, the conductive film is etched, and the resist mask is removed. Note that the electrode 171a is electrically connected to the electrode 224a included in the transistor 251 in the region to be the pixel 230a. The electrode 171a is formed using a conductive material that reflects visible light.

[Step B12]

Figure 12B:
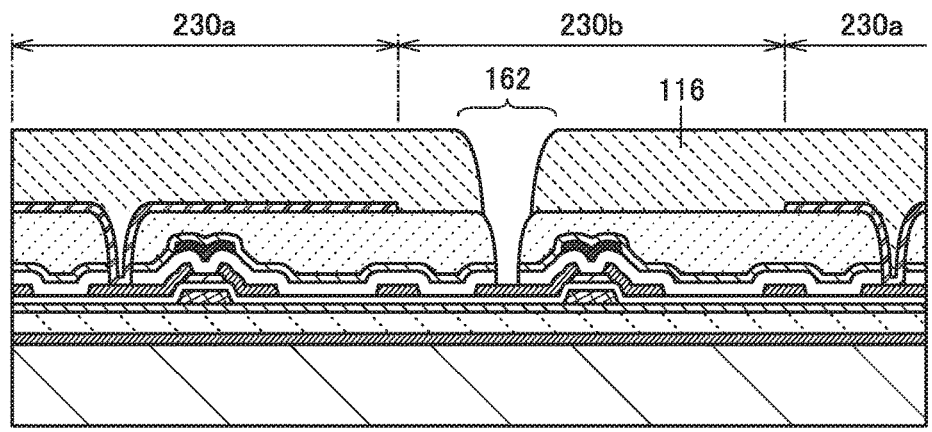

Next, the insulating layer 116 is formed (see FIG. 12B). The display element is formed on the insulating layer 116 in a later step; thus, the insulating layer 116 preferably functions as a planarization layer. The insulating layer 116 is formed using a material and a method similar to those of the insulating layer 115.

[Step B13]

Then, an opening 162 is formed in the insulating layer 116 (see FIG. 12B). The opening 162 is formed to overlap with the opening 161 in a region to be the pixel 230b.

[Step B14]

Figure 12C:
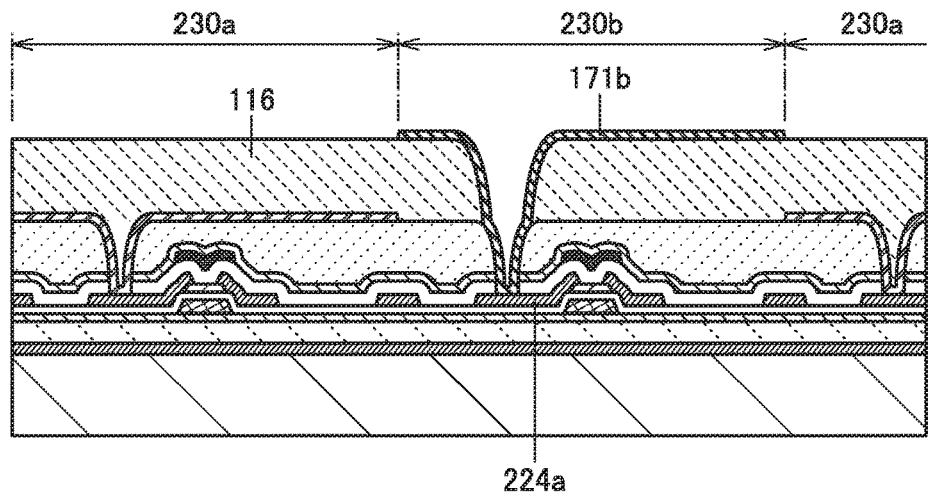

Then, the electrode 171b is formed over the region, which is to be the pixel 230b, of the insulating layer 116 (see FIG. 12C). The electrode 171b can be formed in the following manner: a conductive film is formed, a resist mask is formed, the conductive film is etched, and the resist mask is removed. Note that the electrode 171b is electrically connected to the electrode 224a included in the transistor 251 in the region to be the pixel 230b. The electrode 171b is formed using a material and a method similar to those of the electrode 171a.

[Step B15]

Figure 13A:
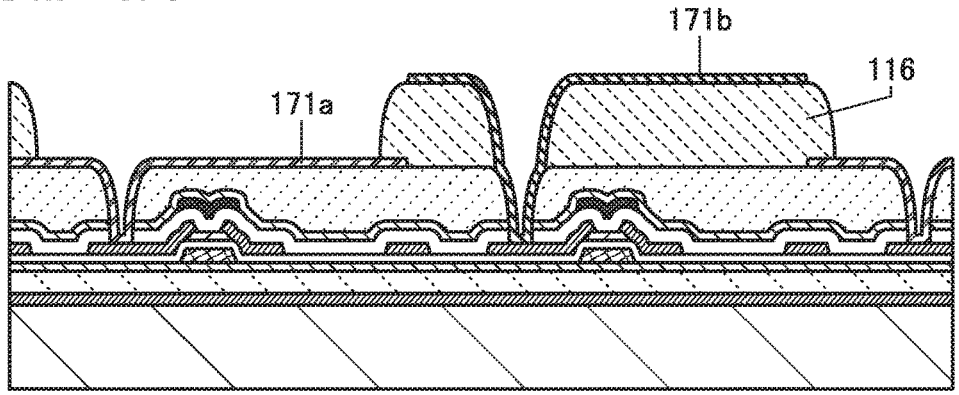
FIGS. 13A to 13C illustrate a method for manufacturing a display device.

Next, part of the insulating layer 116 that overlaps with the electrode 171a is removed to expose the surface of the electrode 171a (see FIG. 13A).

[Step B16]

Figure 13B:
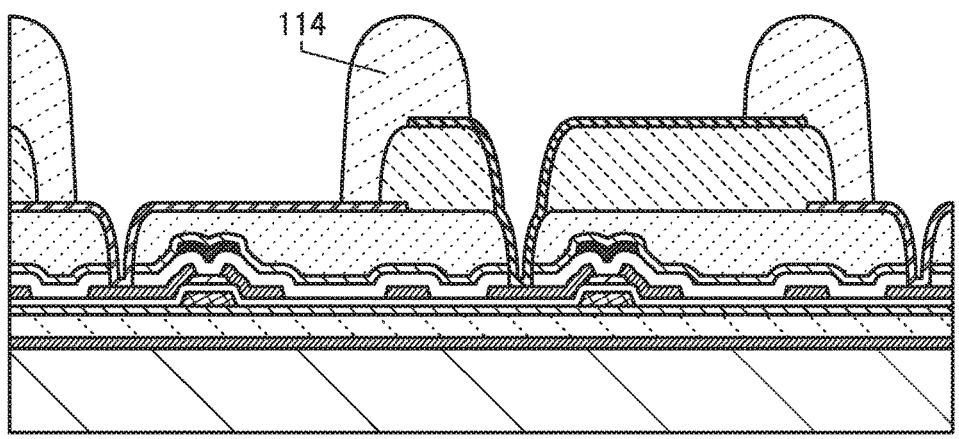

Then, the insulating layer 114 that covers end portions of the electrode 171a and the electrode 171b is formed (see FIG. 13B). The insulating layer 114 includes an opening overlapping with the electrode 171a and an opening overlapping with the electrode 171b.

[Step B17]

Figure 13C:
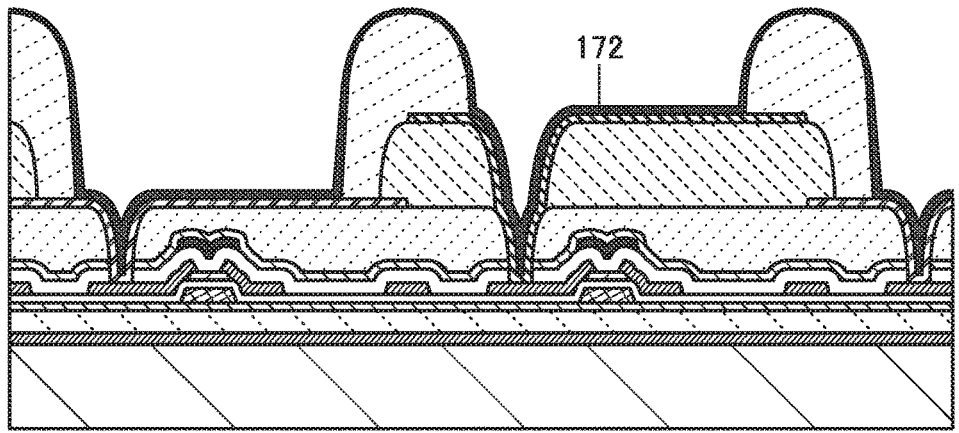

Next, the EL layer 172 is formed (see FIG. 13C). In this embodiment, the EL layer 172 is formed using an organic EL material. Thus, the EL layer 172 in this embodiment is an organic layer. The EL layer 172 can be formed by an evaporation method, a coating method, a printing method, a discharge method, or the like. In the case where the EL layer 172 is formed for each individual pixel, an evaporation method using a shadow mask such as a metal mask, an ink-jet method, or the like can be used. In the case of sharing the EL layer 172 by some pixels, an evaporation method not using a metal mask can be used.

Steps after the formation of the EL layer 172 are performed such that temperatures higher than the upper temperature limit of the EL layer 172 are not applied to the EL layer 172.

[Step B18]

Then, the electrode 173 is formed (see FIG. 14). Part of the electrode 173 functions as the common electrode of the light-emitting element 170a and another part of the electrode 173 functions as the common electrode of the light-emitting element 170b. The electrode 173 is formed using a conductive material that transmits visible light.

Through the above steps, the second element substrate 182 can be formed.

Note that the use of a multi-tone mask in a photolithography process can increase the productivity of a display device. Here, a multi-tone mask is described with reference to FIGS. 15A to 15D. A multi-tone mask is a mask capable of light exposure of three levels to provide an exposed region, a half-exposed region, and an unexposed region. A multi-tone mask is a light-exposure mask through which light is transmitted to have a plurality of intensities. One-time light exposure and development process allows a resist mask with a plurality of thicknesses (typically, two kinds of thicknesses) to be formed. Accordingly, the use of a multi-tone mask can reduce the number of light-exposure masks (photomasks).

Figure 15A:
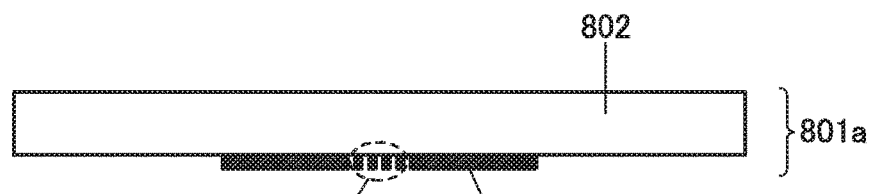
FIGS. 15A to 15D illustrate examples of multi-tone masks.
Figure 15B:
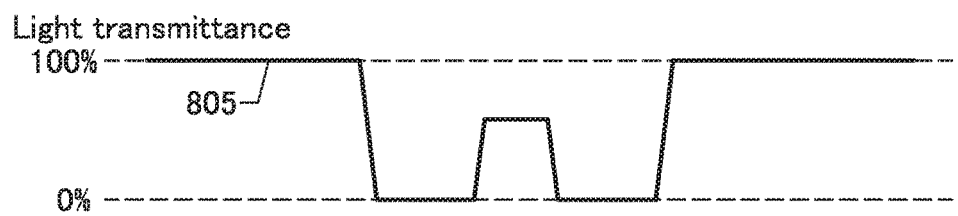
Figure 15C:
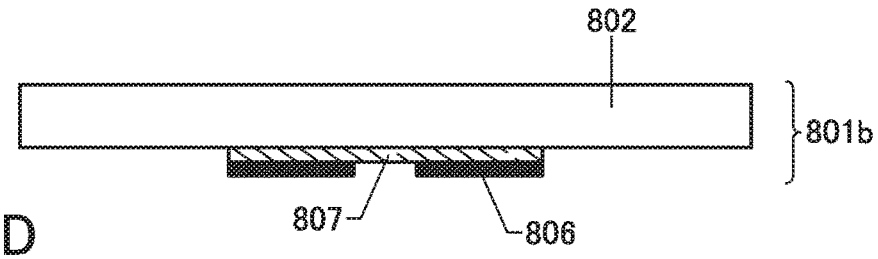

Typical examples of the multi-tone mask include a gray-tone mask 801a illustrated in FIG. 15A and a half-tone mask 801b illustrated in FIG. 15C.

As illustrated in FIG. 15A, the gray-tone mask 801a includes a light-transmitting substrate 802, and a light-blocking portion 803 and a diffraction grating 804 which are formed over the light-transmitting substrate 802. The light transmittance of the light-blocking portion 803 is 0%. On the other hand, in the diffraction grating 804, a gap in a light-transmitting portion in a slit form, a dot form, a mesh form, or the like is adjusted to be less than or equal to the resolution limit of light for exposure; thus, the light transmittance can be adjusted. The slits, dots, or mesh of the diffraction grating 804 can be either periodic or nonperiodic.

As the light-transmitting substrate 802, a light-transmitting substrate such as a quartz substrate can be used. The light-blocking portion 803 and the diffraction grating 804 can be formed using a light-blocking material which absorbs light, such as chromium or chromium oxide.

When the gray-tone mask 801a is irradiated with light for exposure, light transmittance 805 of the light-blocking portion 803 is 0% and the light transmittance 805 of a region where neither the light-blocking portion 803 nor the diffraction grating 804 is provided is 100%, as shown in FIG. 15B. The light transmittance of the diffraction grating 804 can be adjusted in the range from 10% to 70%. The light transmittance of the diffraction grating 804 can be adjusted by adjusting the gap and pitch of slits, dots, or mesh of the diffraction grating.

As illustrated in FIG. 15C, the half-tone mask 801b includes the light-transmitting substrate 802, and a semi-transmissive portion 807 and a light-blocking portion 806 which are formed over the light-transmitting substrate 802. The semi-transmissive portion 807 can be formed using MoSiN, MoSi, MoSiO, MoSiON, CrSi, or the like. The light-blocking portion 806 can be formed using a light-blocking material which absorbs light, such as chromium or chromium oxide.

Figure 15D:
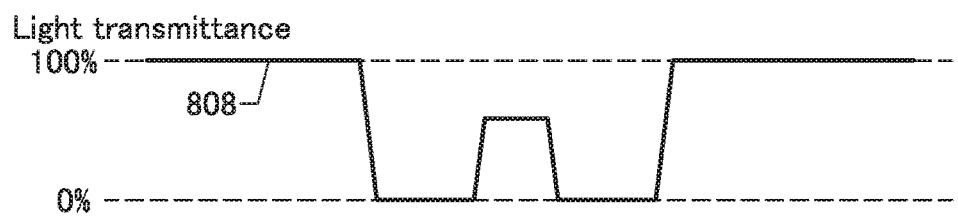

When the half-tone mask 801b is irradiated with light for exposure, light transmittance 808 of the light-blocking portion 806 is 0% and the light transmittance 808 of a region where neither the light-blocking portion 806 nor the semi-transmissive portion 807 is provided is 100%, as shown in FIG. 15D. The light transmittance of the semi-transmissive portion 807 can be adjusted in the range from 10% to 70%. The light transmittance of the semi-transmissive portion 807 can be adjusted with the material of the semi-transmissive portion 807.

The resist mask formed using a multi-tone mask is a resist mask including a plurality of regions (here, two regions) with different thicknesses; a region having a large thickness and a region having a small thickness. In the resist mask formed using a multi-tone mask, a region having a large thickness is referred to as a projected portion of the resist mask, and a region having a small thickness is referred to as a depressed portion of the resist mask.

[Display Device 100]

Next, a method for manufacturing the display device 100 including the first element substrate 181 and the second element substrate 182 is described.

[Step C1]

Figure 16A:
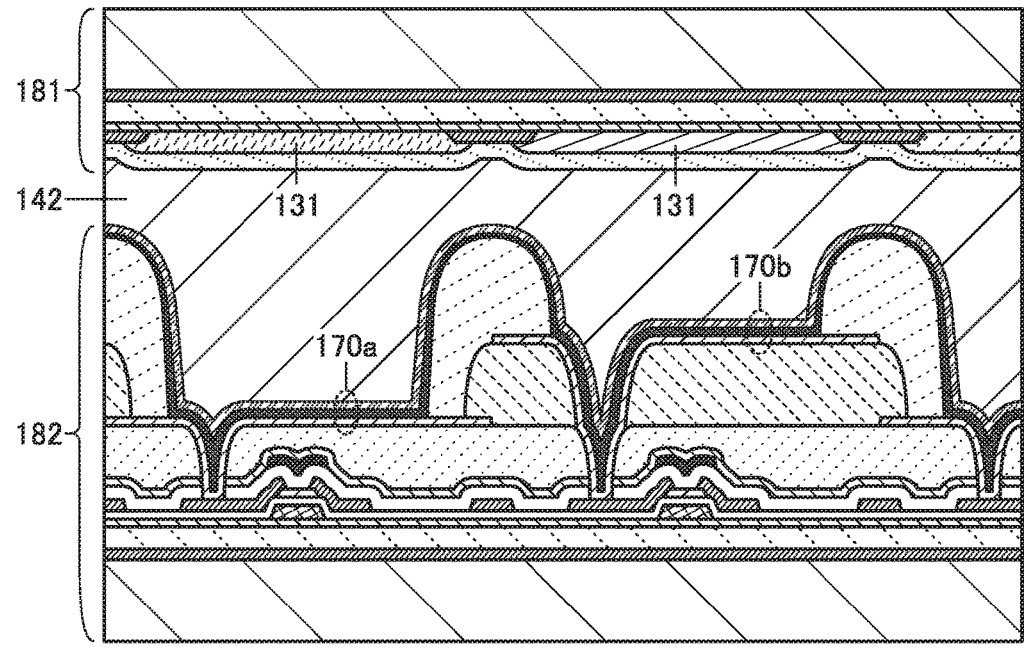
FIGS. 16A and 16B illustrate a method for manufacturing a display device.

The first element substrate 181 and the second element substrate 182 are attached to each other with the adhesive layer 142 so that the coloring layer 131 faces the light-emitting element 170 (see FIG. 16A). At this time, the attachment is performed so that the light-emitting region of the light-emitting element 170 overlaps with the coloring layer 131.

As the adhesive layer 142, any of a variety of curable adhesives such as a reactive curable adhesive, a thermosetting adhesive, an anaerobic adhesive, and a photocurable adhesive such as an ultraviolet curable adhesive can be used. Alternatively, an adhesive sheet or the like may be used.

[Step C2]

Figure 16B:
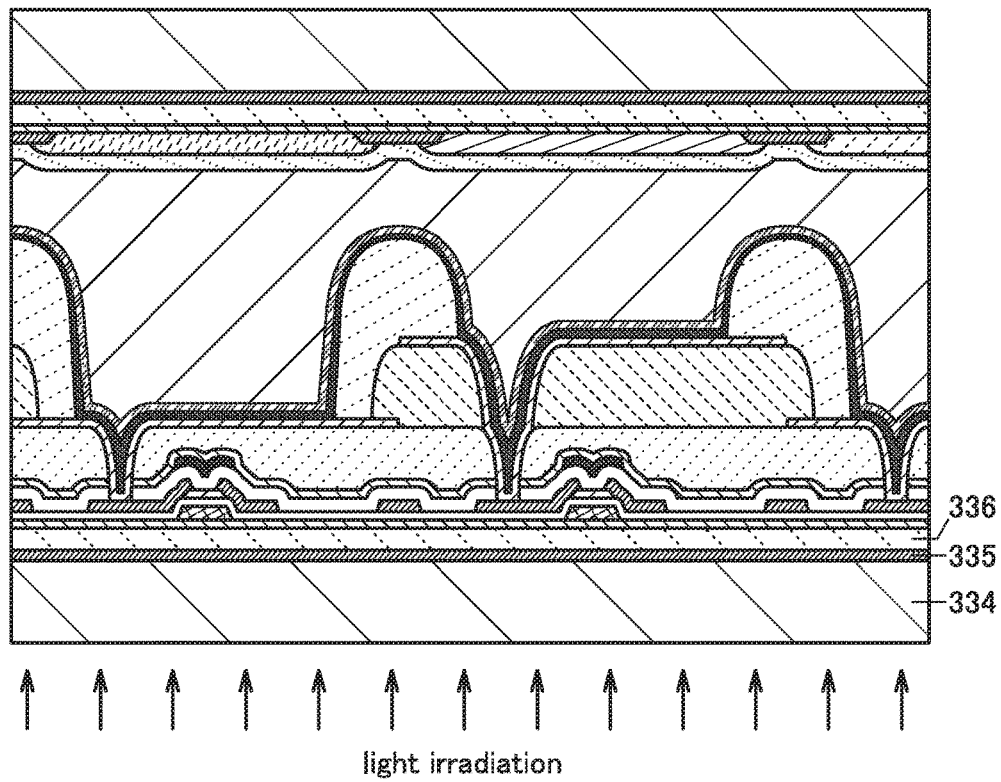

Then, the separation layer 335 is irradiated with ultraviolet light from the support substrate 334 side to separate the support substrate 334 and the separation layer 335 from the layer 336 (see FIG. 16B).

Note that the separation of the support substrate 334 can be performed by light irradiation or can be physically performed. In both cases, before the separation, a separation trigger may be formed by separating part of the layer 336 from the support substrate 334 or the separation layer 335. For example, the separation trigger may be formed by inserting a sharp instrument such as a knife between the support substrate 334 and the layer 336. The separation trigger may be formed by a method that uses a laser, such as a laser ablation method.

In this embodiment, the separation by light irradiation is described. The ultraviolet light irradiation is preferably performed with a linear laser apparatus. The linear laser apparatuses are used in the manufacturing lines for low-temperature polysilicon (LTPS) and the like, which enables effective use of the manufacturing lines for LTPS and the like. A linear laser is laser light condensed into a long rectangular shape (shaped into a linear laser beam).

In this embodiment, the linear laser apparatus is used. Specifically, the support substrate 334 and the linear laser light are moved relative to the direction perpendicular to the long-axis direction of the linear laser light and parallel to the surface of the support substrate 334. In a region irradiated with the laser light, the bonding strength between the separation layer 335 and the layer 336 is weakened.

The light for the irradiation preferably has a wavelength of greater than or equal to 180 nm and less than or equal to 450 nm. The light for the irradiation particularly preferably has a wavelength of 308 nm or around 308 nm. The energy density of the light is preferably greater than or equal to 250 mJ/cm$^2$ and less than or equal to 400 mJ/cm$^2$, further preferably greater than or equal to 250 mJ/cm$^2$ and less than or equal to 360 mJ/cm$^2$.

In the case where the light irradiation is performed with a laser apparatus, the number of shots of laser light with which one portion is irradiated can be greater than or equal to 1 and less than or equal to 50, preferably greater than 1 and less than or equal to 10, further preferably greater than 1 and less than or equal to 5.

There are portions with low light intensity on both ends of the short axis of the laser beam. Accordingly, it is preferable that one shot and another shot overlap with each other by greater than or equal to the width of the portion with low light intensity. Therefore, the number of laser shots is preferably greater than or equal to 1.1, further preferably greater than or equal to 1.25.

In this specification, the number of laser shots refers to the number of times a point (region) is irradiated with laser light, and is determined by a beam width, scanning speed, a frequency, an overlap percentage, or the like. There is a portion between a pulse and another pulse when a linear beam is moved in a scanning direction, that is, a portion where one shot and another shot partly overlap with each other, and their overlapping ratio is referred to as an overlap percentage. Note that as the overlap percentage becomes closer to 100%, the number of shots is increased, and as the overlap percentage becomes further from 100%, the number of shots is decreased. The higher the scanning speed, the smaller the number of shots.

The expression "the number of shots of the laser light is 1.1" means that there is an overlap equivalent to approximately one-tenth of the beam width between two successive shots, and can mean that the overlap percentage is 10%. Similarly, the expression "the number of shots of the laser light is 1.25" means that there is an overlap equivalent to approximately one-fourth of the beam width between two successive shots, and can mean that the overlap percentage is 25%.

Note that the energy density of light used for irradiation in the laser crystallization step of LTPS is high, e.g., greater than or equal to 350 mJ/cm$^2$ and less than or equal to 400 mJ/cm$^2$. Furthermore, the number of laser shots needs to be large, e.g., greater than or equal to 10 and less than or equal to 100.

Meanwhile, in this embodiment, light irradiation for separating the separation layer 335 and the layer 336 from each other can be performed at a lower energy density or with a smaller number of shots than that performed in the laser crystallization step. Accordingly, the number of substrates which can be processed by a laser apparatus can be increased. The running costs of a laser apparatus can be reduced by reducing the frequency of maintenance of the laser apparatus, for example. Consequently, the manufacturing costs of display devices and the like can be reduced.

Since the light irradiation is performed at a lower energy density or with a smaller number of shots than that performed in the laser crystallization step, damage to the substrate caused by the laser light irradiation can be reduced. Accordingly, after being used once, the substrate is less likely to decrease in strength and thus can be reused, which results in cost reduction.

In this embodiment, the separation layer 335 is provided between the support substrate 334 and the layer 336. Owing to the separation layer 335, in some cases, the light irradiation can be performed at a lower energy density or with a smaller number of shots than that in the case where the separation layer 335 is not used.

If a foreign matter such as dust is adhered to the surface of the support substrate that is subjected to light irradiation at the time of the light irradiation through the support substrate, in some cases, nonuniformity occurs in the light irradiation and part with low separability is generated, leading to a reduction in yield of the step of separating the separation layer 335 and the layer 336 from each other. For that reason, it is preferable that the light irradiation surface be cleaned before or during the light irradiation. For example, the light irradiation surface of the support substrate can be cleaned with an organic solvent such as acetone, water, or the like. The light irradiation may be performed while a gas is sprayed with an air knife. Thus, nonuniformity in the light irradiation can be reduced and the yield of the separation can be increased.

[Step C3]

Figure 17A:
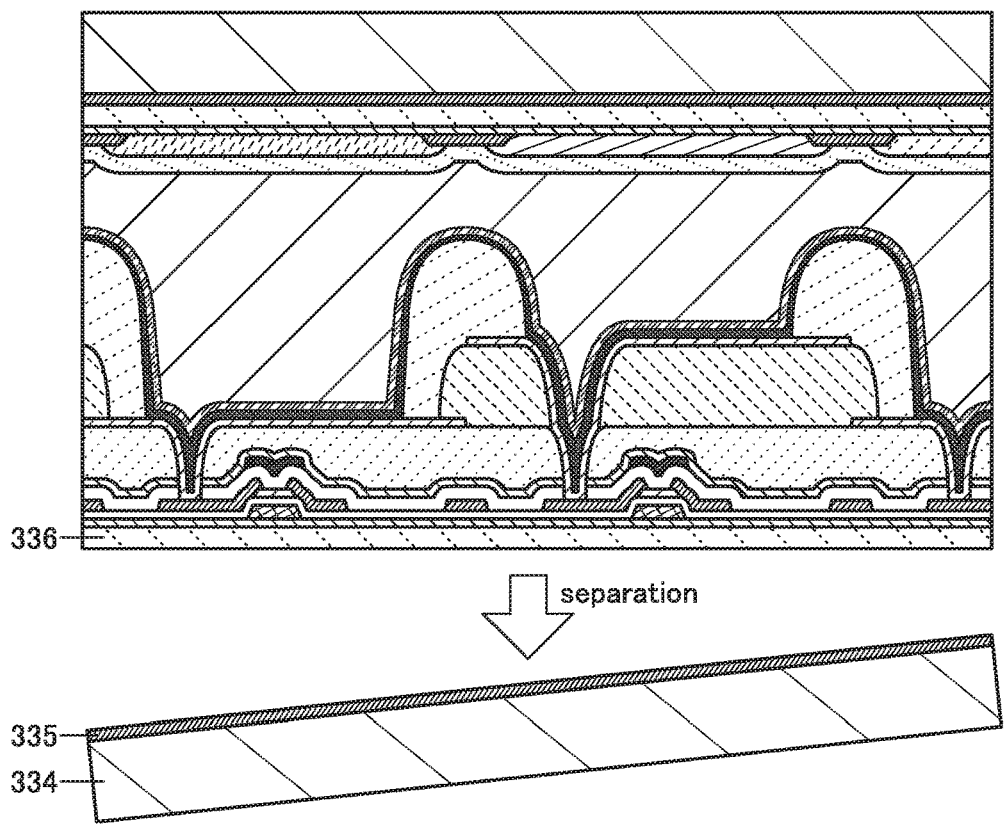
FIGS. 17A and 17B illustrate a method for manufacturing a display device.

Next, the support substrate 334 and the separation layer 335 are separated from the layer 336 (see FIG. 17A).

Before or during the separation, a water-containing liquid is preferably fed to the separation interface. Water present at the separation interface further reduces adhesion or adhesiveness between the separation layer 335 and the layer 336 and reduces the force required for the separation. Furthermore, feeding a water-containing liquid to the separation interface sometimes weakens or breaks a bond between the separation layer 335 and the layer 336. A chemical bond with the liquid is utilized to break a bond between the separation layer 335 and the layer 336, which allows the separation to proceed. For example, in the case where there is a hydrogen bond between the separation layer 335 and the layer 336, it can be assumed that feeding the water-containing liquid forms a hydrogen bond between the water and the separation layer 335 or the layer 336 to break the hydrogen bond between the separation layer 335 and the layer 336.

The separation layer 335 preferably has low surface tension and high wettability with respect to a water-containing liquid. In that case, the water-containing liquid can be distributed over the entire surface of the separation layer 335 and can be easily fed to the separation interface. Distribution of the water over the entire separation layer 335 leads to uniform separation.

The water-containing liquid present at the separation interface can inhibit an adverse effect of static electricity that is caused at the time of separation on a functional element included in the second element substrate 182 (e.g., damage to a semiconductor element from static electricity). Static electricity on a surface of the second element substrate 182 which is exposed by the separation may be removed with an ionizer or the like.

In the case where a liquid is fed to the separation interface, the surface of the second element substrate 182 which is exposed by the separation may be dried.

[Step C4]

Figure 17B:
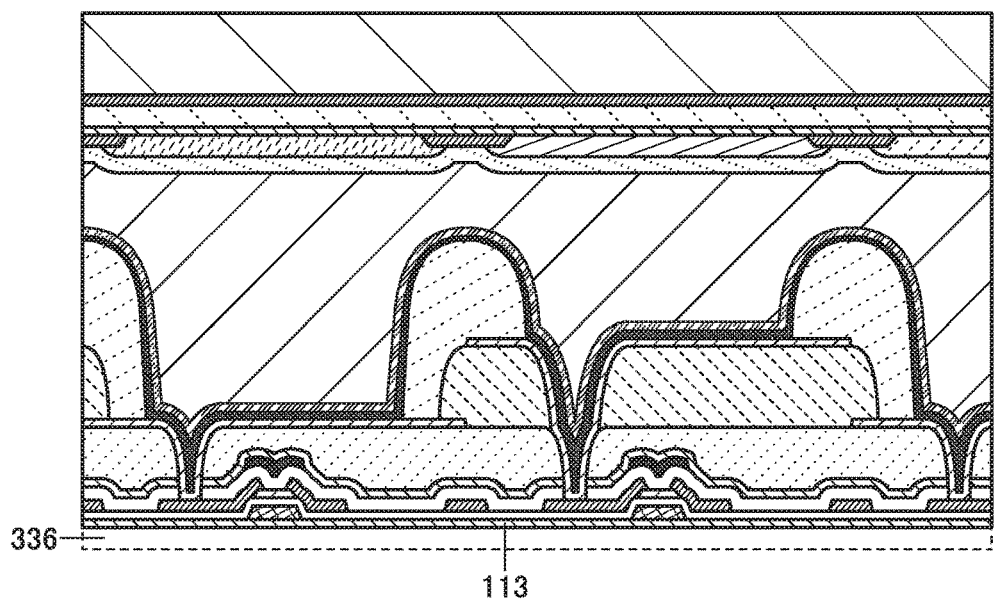

Next, the layer 336 is removed. The layer 336 can be removed by a dry etching method, for example (see FIG. 17B). Accordingly, the insulating layer 113 is exposed. In FIG. 17B, the removed layer 336 is shown by a dashed line.

[Step C5]

Figure 18A:
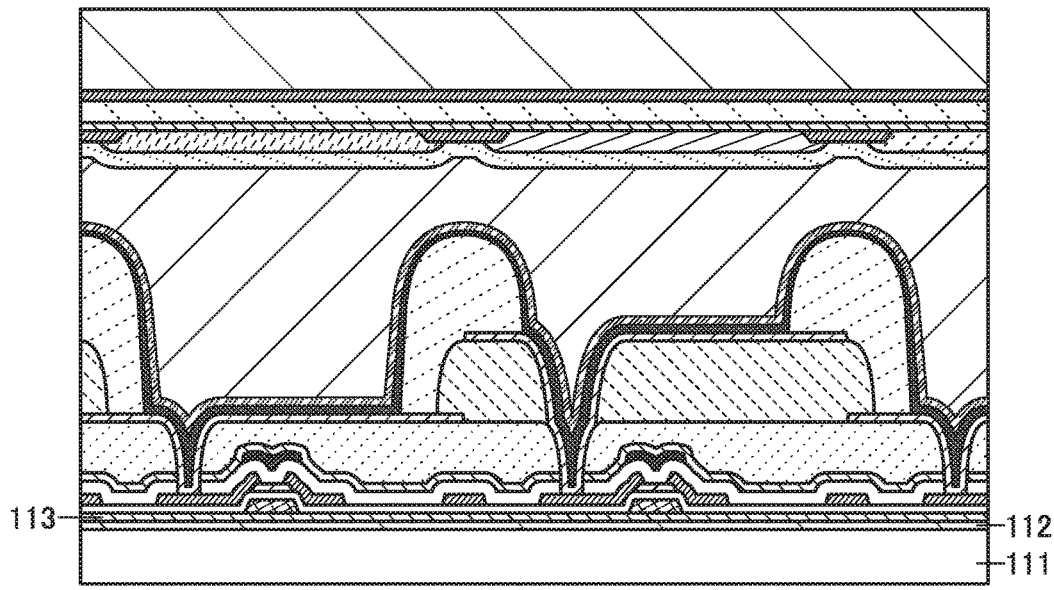
FIGS. 18A and 18B illustrate a method for manufacturing a display device.

Then, the substrate 111 is attached to the insulating layer 113 with the adhesive layer 112 (see FIG. 18A). The adhesive layer 112 is formed using a material similar to that of the adhesive layer 142. In this embodiment, a PET film is used as the substrate 111. In that case, the display device can be reduced in weight and thickness. The display device using a film substrate such as a PET film is more robust than a display device using glass, metal, or the like. The display device can have higher flexibility.

[Step C6]

Figure 18B:
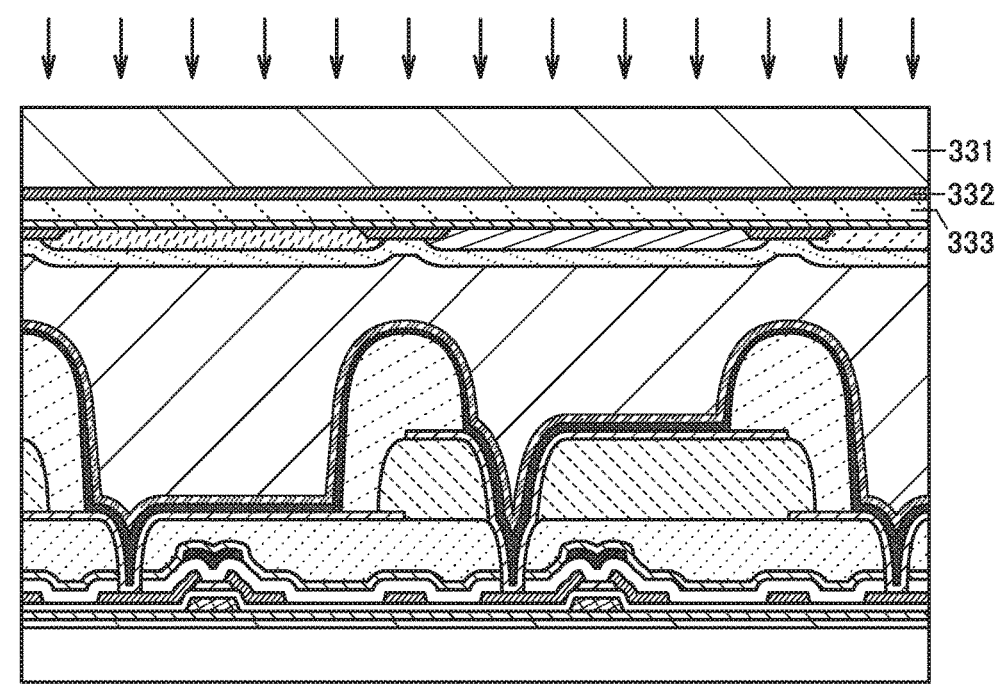

Then, the separation layer 332 is irradiated with ultraviolet light from the support substrate 331 side to separate the support substrate 331 and the separation layer 332 from the layer 333 (see FIG. 18B). This step is similar to Step C2.

[Step C7]

Figure 19A:
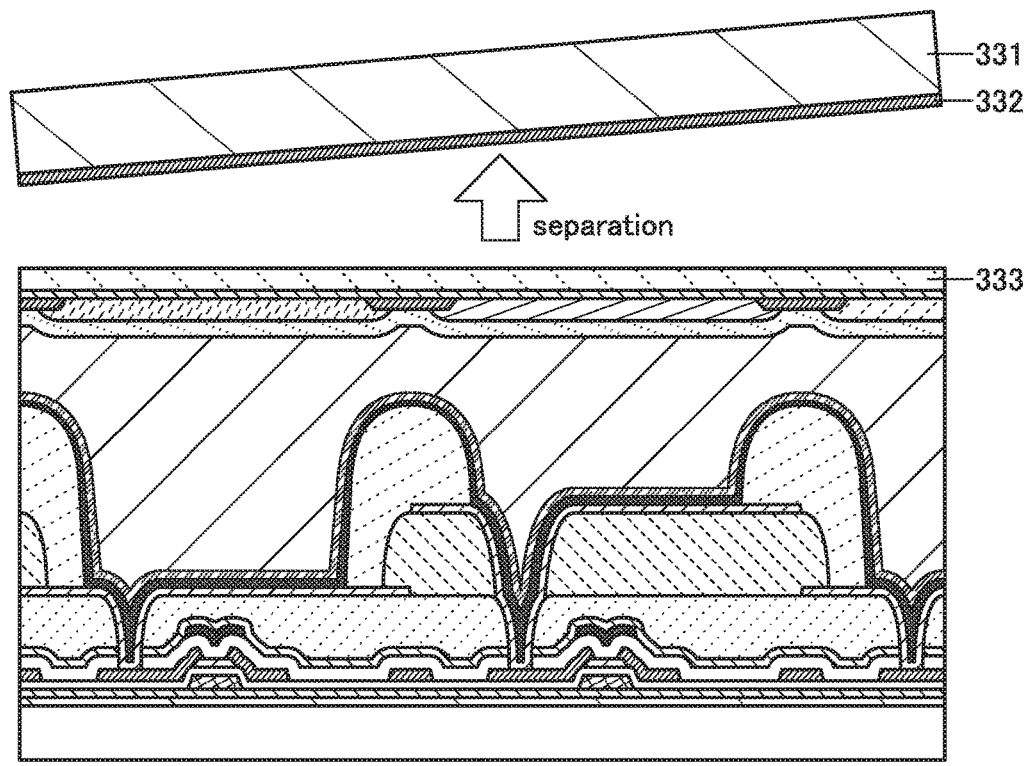
FIGS. 19A and 19B illustrate a method for manufacturing a display device.

Next, the support substrate 331 and the separation layer 332 are separated from the layer 333 (see FIG. 19A). This step is similar to Step C3.

[Step C8]

Figure 19B:
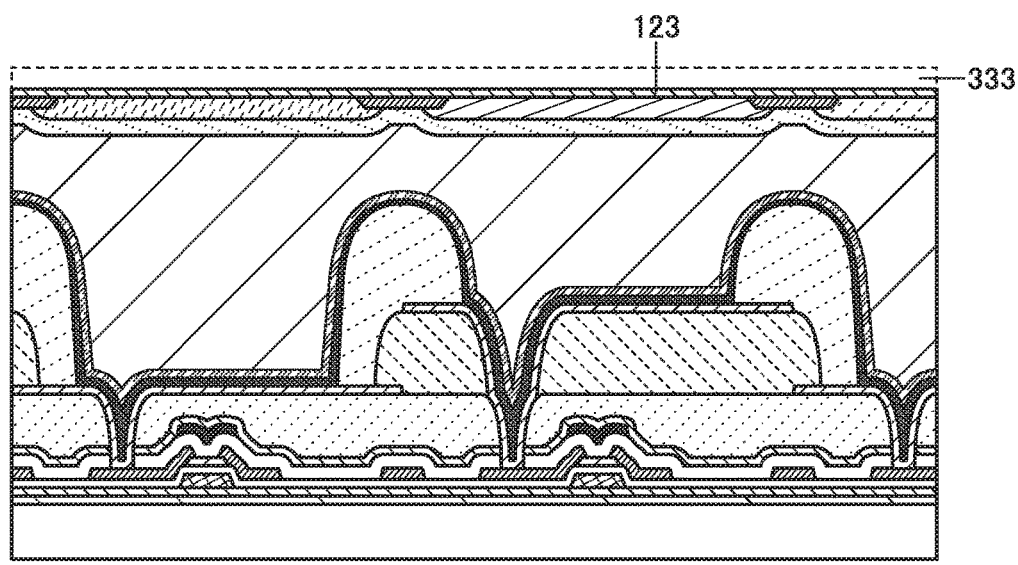

Next, the layer 333 is removed (see FIG. 19B). Accordingly, the insulating layer 123 is exposed. In FIG. 19B, the removed layer 333 is shown by a dashed line. This step is similar to Step C4.

[Step C9]

Figure 20:
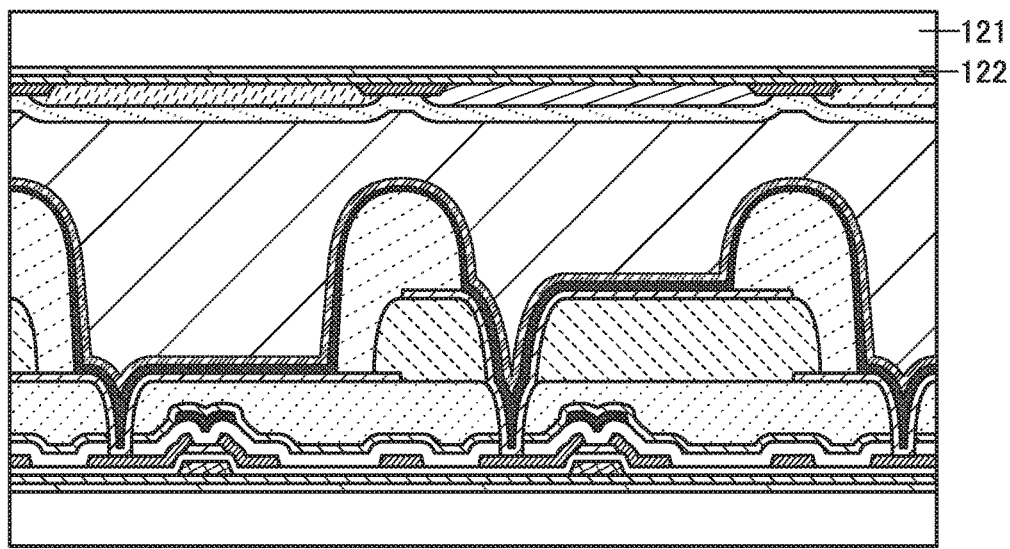
FIG. 20 illustrates a method for manufacturing a display device.

Next, the substrate 121 is attached to the insulating layer 123 with the adhesive layer 122 (see FIG. 20). The adhesive layer 122 is formed using a material similar to that of the adhesive layer 142. The substrate 121 is formed using a material similar to that of the substrate 111.

Through the above steps, the display device 100 can be manufactured.

This embodiment can be implemented in appropriate combination with any of the structures described in the other embodiments and the like.

Embodiment 3

In this embodiment, a display device 150 having a structure different from the structure of the display device 100 is described. Note that description is made mainly on portions different from those of the display device 100 to avoid repeated description.

Structure Example

The display device 150 includes a transistor having a structure different from the structure of the transistor included in the display device 100. FIG. 21A illustrates an example of a cross section of the display device 150. FIG. 21A is a cross-sectional view taken along the dashed-dotted line A1-A2 in FIG. 1A. The display device 150 includes a transistor 251S, a transistor 252S, the light-emitting element 170, the coloring layer 131, the light-blocking layer 132, and the like between the substrate 111 and the substrate 121. Note that the transistor 251S corresponds to the transistor 251, and the transistor 252S corresponds to the transistor 252.

The transistor 251S and the transistor 252S included in the display device 150 are top-gate transistors. FIG. 21B is an enlarged view of the transistor 252S. Note that the transistor 252S can have a structure similar to that of the transistor 251S.

Manufacturing Method Example

Next, an example of a method for manufacturing the display device 150 is described. The display device 150 is manufactured by combining the first element substrate 181 and a second element substrate 182A.

[First Element Substrate 181]

The first element substrate 181 used for manufacturing the display device 150 is formed in a manner similar to that of the first element substrate 181 used for manufacturing the display device 100.

[Second Element Substrate 182A]

A method for forming the second element substrate 182A used for manufacturing the display device 150 is described. Note that description is made mainly on portions different from those of the method for forming the second element substrate 182 used for manufacturing the display device 100 to avoid repeated description.

Figure 22A:
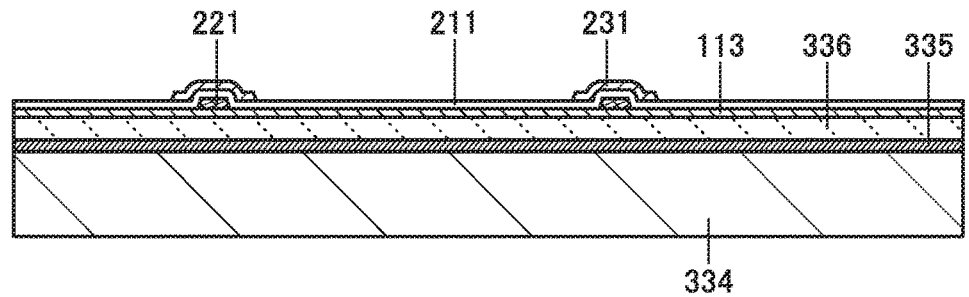
FIGS. 22A to 22D illustrate a method for manufacturing a display device.

First, the steps up to Step B4 in Embodiment 2 are performed (see FIG. 22A).

[Step D1]

Figure 22B:
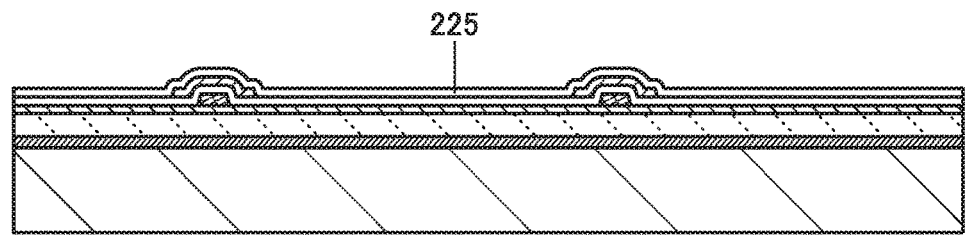

Then, an insulating layer 225 is formed (see FIG. 22B). The insulating layer 225 can be formed using a material and a method similar to those of the insulating layer 211. The insulating layer 225 can function as a gate insulating layer of the transistor.

[Step D2]

Figure 22C:
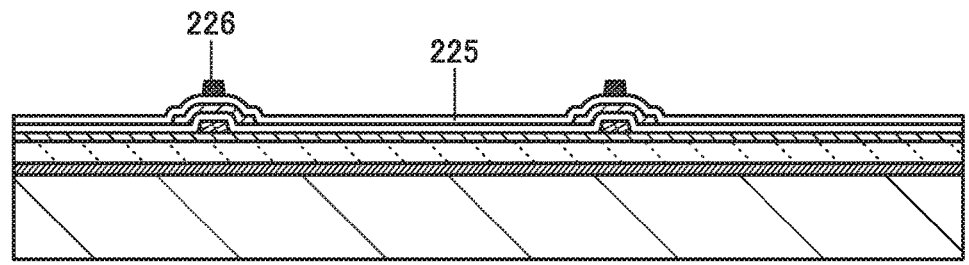

Next, the electrode 226 including a region overlapping with the semiconductor layer 231 is formed over the insulating layer 225 (see FIG. 22C). The electrode 226 can be formed in the following manner: a conductive film is formed, a resist mask is formed, the conductive film is etched, and the resist mask is removed.

[Step D3]

Figure 22D:
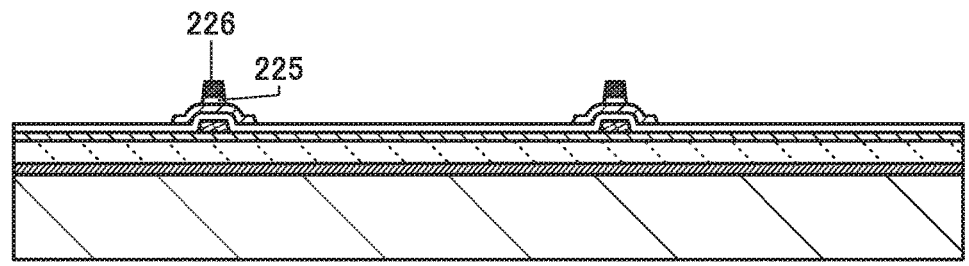

Then, part of the insulating layer 225 is selectively removed by using the electrode 226 as a mask (see FIG. 22D). Through Step D3, the island-shaped insulating layer 225 is formed, and a region of the semiconductor layer 231 that does not overlap with the electrode 226 is exposed.

[Step D4]

Figure 23A:
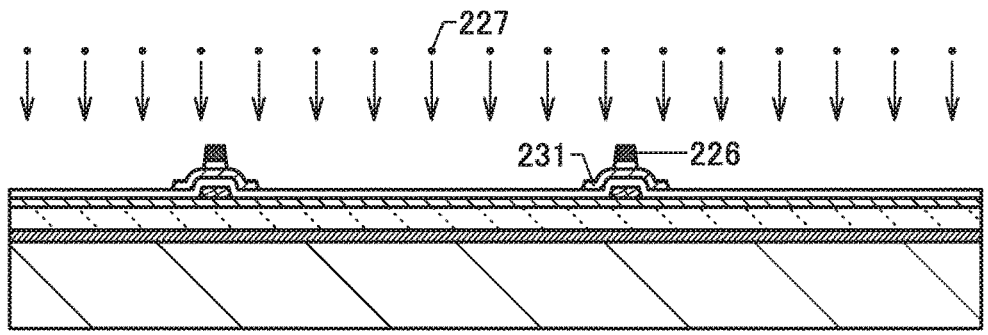
FIGS. 23A to 23D illustrate a method for manufacturing a display device.

Next, an impurity 227 for increasing conductivity is added to the region of the semiconductor layer 231 that has been exposed in Step D3 (see FIG. 23A). Since the oxide semiconductor is used for the semiconductor layer 231 in this embodiment, the impurity for forming an oxygen vacancy to increase the conductivity is added to the semiconductor layer 231 (the oxide semiconductor layer). As the impurity for forming the oxygen vacancy in the oxide semiconductor layer, one or more of the following can be used, for example: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen enters an oxide semiconductor in which an oxygen vacancy is formed by addition of an impurity element, hydrogen enters an oxygen vacant site and forms a donor level in the vicinity of the conduction band. As a result, the conductivity of the oxide semiconductor can be increased. In other words, the resistivity of the oxide semiconductor can be reduced.

The region of the semiconductor layer 231 that has increased conductivity due to the addition of the impurity 227 can function as a source region or a drain region of the transistor. In this embodiment, the impurity 227 is added by using the electrode 226 as a mask. In other words, the source region or the drain region of the transistor is formed in a self-aligned manner.

[Step D5]

Figure 23B:
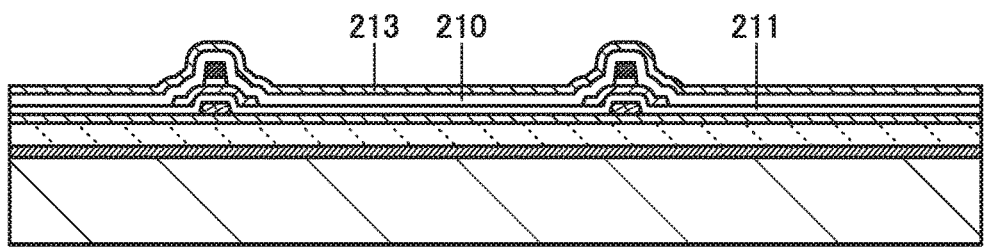

Next, the insulating layer 210 is formed, and the insulating layer 213 is formed over the insulating layer 210 (see FIG. 23B). The insulating layer 210 can be formed using a material and a method similar to those of the insulating layer 211.

Note that it is preferable to use an insulating film formed in an oxygen-containing atmosphere, such as a silicon oxide film or a silicon oxynitride film, for the insulating layer 210. The insulating layer 210 is preferably an insulating layer containing excess oxygen.

The insulating layer 213 is preferably an insulating layer with low oxygen diffusibility and low oxygen permeability, such as a silicon nitride film. An insulating layer formed in an oxygen-containing atmosphere and an insulating layer containing excess oxygen easily release a large amount of oxygen by heating. When a stack including such an insulating layer that releases oxygen and an insulating layer with low oxygen diffusibility and low oxygen permeability is heated, oxygen can be supplied to a channel formation region of the semiconductor layer 231. As a result, oxygen vacancies in the channel formation region can be filled and defects at the interface between the channel formation region and the insulating layer 225 can be repaired, leading to a reduction in defect levels. Accordingly, an extremely highly reliable transistor can be fabricated. Thus, an extremely highly reliable display device can be manufactured.

[Step D6]

Figure 23C:
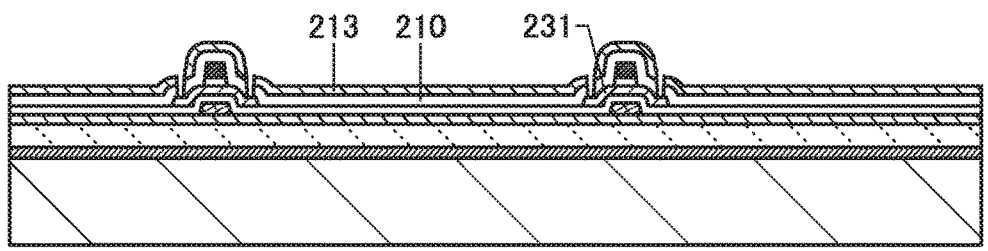

Next, part of the insulating layer 210 and part of the insulating layer 213 are selectively removed to form an opening that reaches the source region of the semiconductor layer 231 and an opening that reaches the drain region of the semiconductor layer 231 (see FIG. 23C).

[Step D7]

Figure 23D:
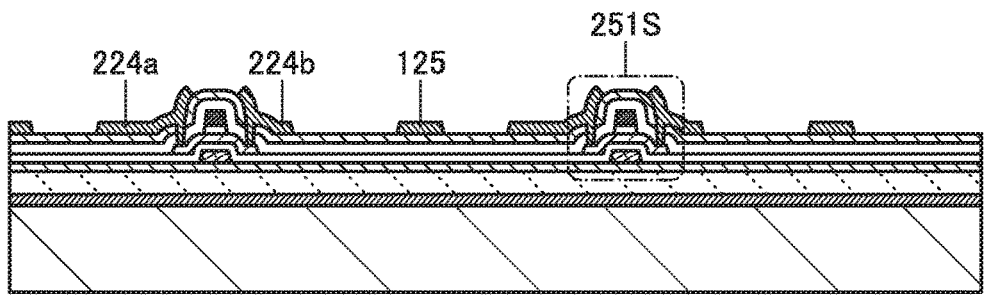

Then, the electrode 224a, the electrode 224b, and the wiring 125 are formed over the insulating layer 213 (see FIG. 23D). The electrode 224a, the electrode 224b, and the wiring 125 are formed in a manner similar to that of Step B5 in Embodiment 2.

Through the above steps, the top-gate transistor 251S can be formed. Although not illustrated, the top-gate transistor 252S can be formed at the same time. The subsequent steps are performed in a manner similar to that of the steps including and after Step B8 in Embodiment 2, whereby the second element substrate 182A can be formed.

[Display Device 150]

The first element substrate 181 and the second element substrate 182A are attached to each other with the adhesive layer 142 so that the coloring layer 131 faces the light-emitting element 170, whereby the display device 150 can be manufactured.

The display device 150 including the first element substrate 181 and the second element substrate 182A is manufactured in a manner similar to that of the steps including and after Step C1 in Embodiment 2.

This embodiment can be implemented in appropriate combination with any of the structures described in the other embodiments and the like.

Embodiment 4

In this embodiment, a display device 200 having a structure different from the structure of the display device 100 is described. Note that description is made mainly on portions different from those of the display device 100 to avoid repeated description.

Structure Example

The display device 200 includes a transistor 251T in the display region 235 that has a structure different from the structure of the transistor 251 included in the display device 100. FIG. 24A illustrates an example of a cross section of the display device 200. FIG. 24A is a cross-sectional view taken along the dashed-dotted line A1-A2 in FIG. 1A. The display device 200 includes the transistor 251T, the transistor 252, the light-emitting element 170, and the like between the substrate 111 and the substrate 121. FIG. 24B is an enlarged view of the transistor 252T. FIG. 24C is an enlarged view of the transistor 252.

The transistor 251T includes an electrode 221T, an electrode 226T, an electrode 224aT, and an electrode 224bT. At least one of (preferably, all of) the electrode 221T, the electrode 226T, the electrode 224aT, and the electrode 224bT is formed using a conductive material having a function of transmitting visible light. Thus, the transistor 251T has a function of transmitting visible light.

The display device 200 includes the bottom-emission light-emitting element 170. Thus, the light 175 emitted from the light-emitting element 170 is extracted through the substrate 111. As in the above-described display device 100C, the EL layers 172 that emit light of different colors are provided in the respective pixels, so that the coloring layer 131 is not necessarily formed.

The transistor 251T overlapping with the light-emitting element 170 has a function of transmitting visible light. Thus, the light 175 emitted from the light-emitting element 170 can be extracted through the substrate 111 without being blocked by the transistor 251T. FIG. 24D is a schematic perspective view of the pixel 230 that illustrates a state where the light 175 emitted from the light-emitting element 170 is extracted through the transistor 251T.

Although not illustrated, an electrode of a capacitor included in each pixel is preferably formed using a conductive material having a function of transmitting visible light. In addition, conductive layers electrically connected to the transistor, the capacitor, and the like in each pixel are preferably formed using a conductive material having a function of transmitting visible light.

In general, a display device having a bottom-emission structure is difficult to have a high aperture ratio because light emitted from a light-emitting element is blocked by a transistor, a capacitor, and the like included in each pixel. According to one embodiment of the present invention, even a display device having a bottom-emission structure can have a high aperture ratio.

Note that as a light-transmitting conductive material, a conductive oxide such as indium oxide, indium tin oxide, indium zinc oxide, zinc oxide, or zinc oxide to which gallium is added is used, for example. A conductive material having an energy band gap of 2.5 eV or more is particularly preferable because of its high visible-light transmittance.

However, the light-transmitting conductive material has resistivity higher than that of a light-blocking conductive material such as copper or aluminum. To prevent signal delay, bus lines such as a scan line, a signal line, and a power supply line are preferably formed using a light-blocking conductive material (metal material) having low resistivity. Note that the bus lines may be formed using the light-transmitting conductive material in some cases depending on the size of the display region 235, the widths of the bus lines, and the thicknesses of the bus lines, for example.

The transistor 252 included in the peripheral circuit region 233 should operate at high speed and thus is preferably formed using a light-blocking conductive material (metal material) having low resistivity.

As described above, part of the electrode 173 functions as the common electrode of the light-emitting element 170a and another part of the electrode 173 functions as the common electrode of the light-emitting element 170b. Thus, the resistivity of the electrode 173 is preferably as low as possible. In particular, in order to increase the size and definition of a display device, the resistivity of the electrode 173 is preferably as low as possible. The electrode 173 included in a display device having a bottom-emission structure can be formed using a light-blocking conductive material having low resistivity; thus, the electrode 173 can have reduced resistivity.

Modification Example 1

Figure 25:
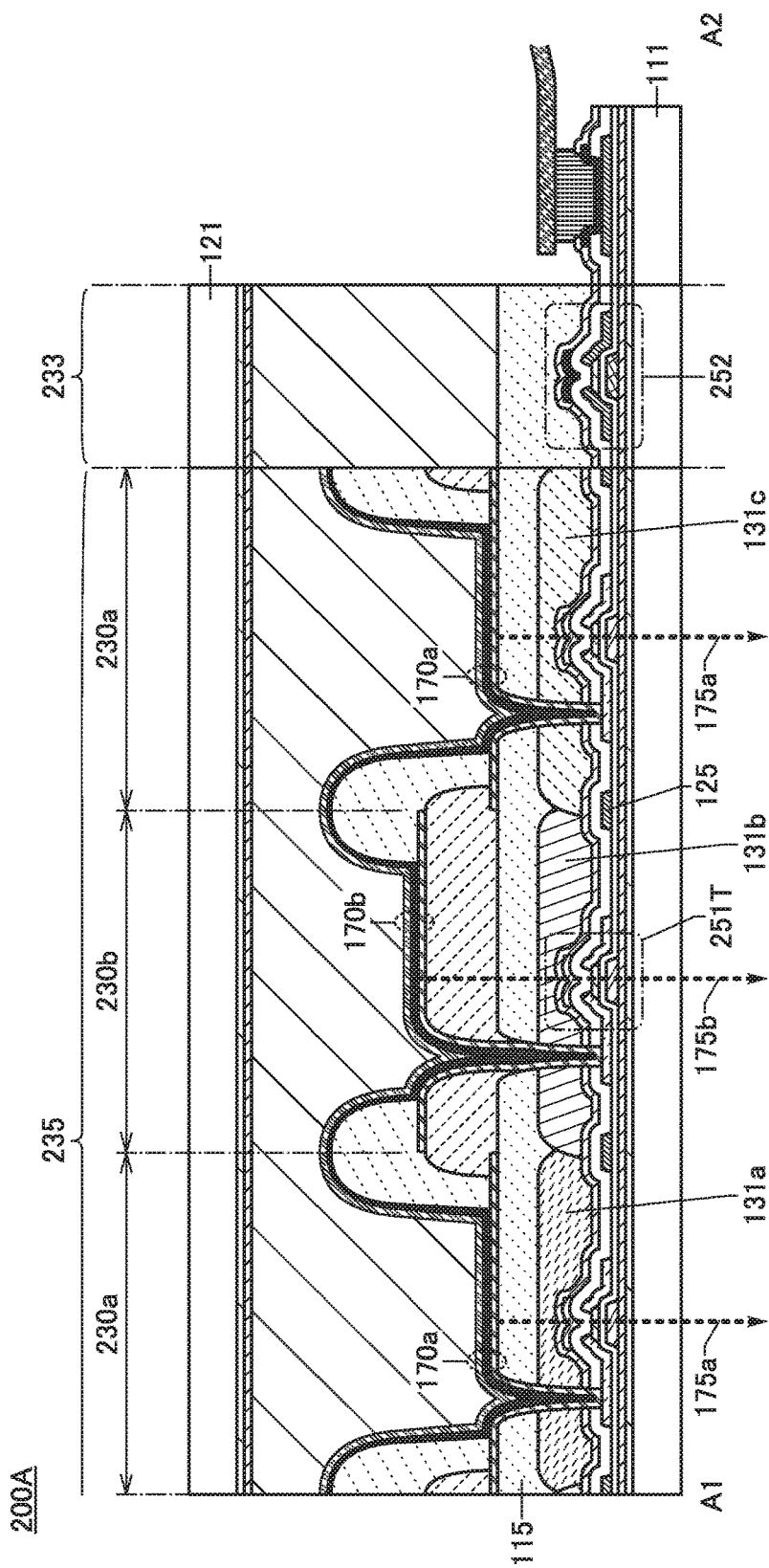
FIG. 25 illustrates a display device.

FIG. 25 illustrates a cross section of a display device 200A, which is a modification example of the display device 200. The display device 200A includes the coloring layer 131 between the transistor 251T and the insulating layer 115. The display device 200A also includes the light-emitting element 170 whose emission color is white.

The light 175 is emitted from the light-emitting element 170 to the substrate 111 side through the coloring layer 131 and the like. The hue of the light 175 emitted from the light-emitting element 170 can be changed to red, green, blue, cyan, magenta, yellow, or the like depending on the material of the coloring layer 131.

Modification Example 2

In the case where the electrode 171 is provided to overlap with the wiring 125, the potential of the electrode 171 is changed unintentionally in some cases in response to a change in the potential of the wiring 125. For example, in the case where the wiring 125 is a wiring for supplying a video signal, after the writing of a video signal to the specific pixel 230, the potential written to the pixel 230 is changed unintentionally in some cases in response to a change in the potential of the wiring 125 overlapping with the pixel 230. Thus, the display quality of the display device is decreased in some cases.

Figure 26:
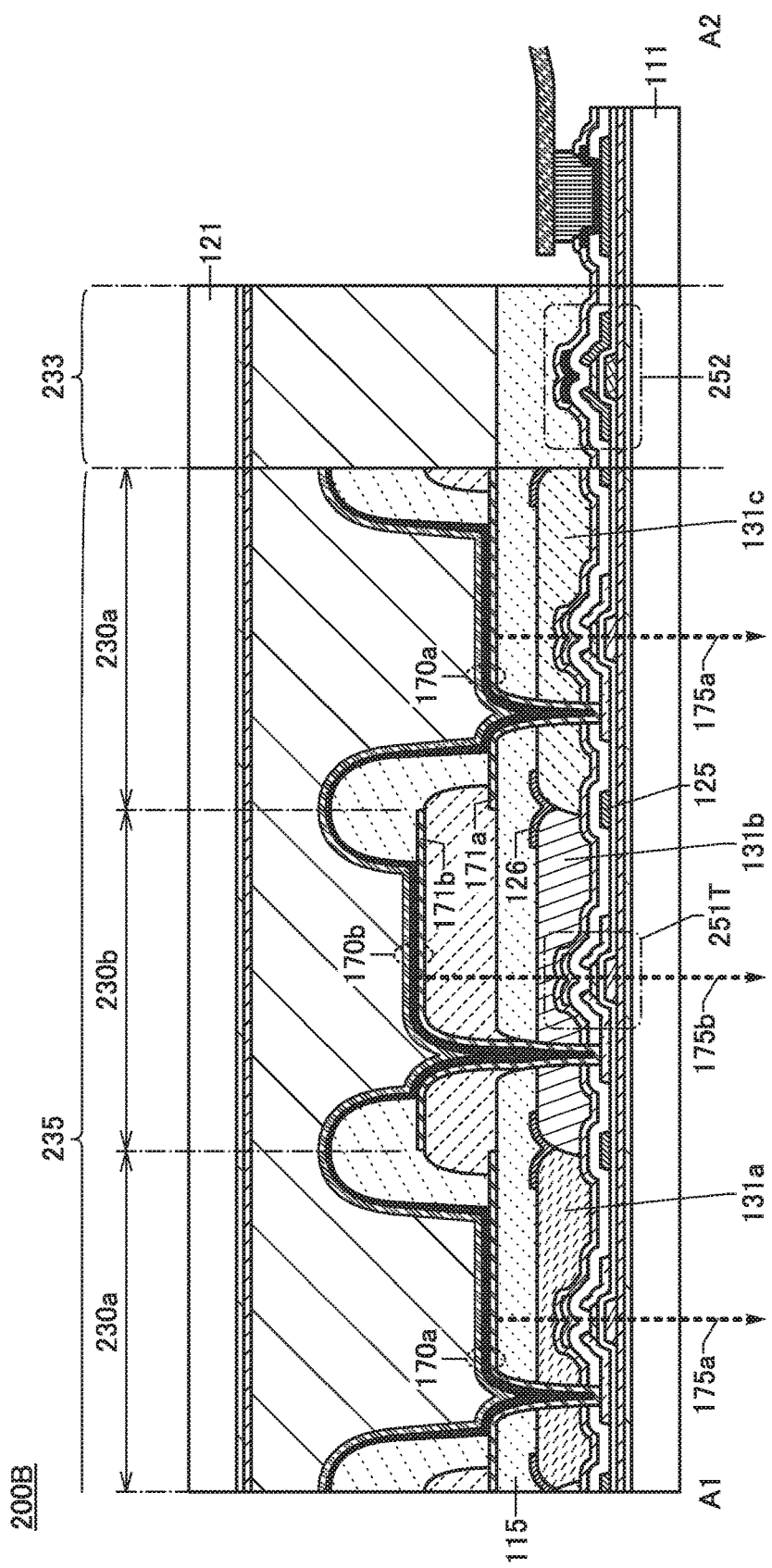
FIG. 26 illustrates a display device.

FIG. 26 illustrates a cross section of a display device 200B, which is a modification example of the display device 200A. In the display device 200B, an electrode 126 is formed over a region of the coloring layer 131 that overlaps with the wiring 125. The electrode 126 is covered with the insulating layer 115. The electrode 126 is supplied with a fixed potential such as a common potential or a power supply potential.

In a region where the electrode 171 overlaps with the wiring 125, the electrode 126 is provided between the electrode 171 and the wiring 125, whereby an unintentional change in the potential of the electrode 171 can be suppressed because the potential of the electrode 171 is not affected by a change in the potential of the wiring 125.

Note that an example in which the electrode 126 is provided over the coloring layer 131 is described in this embodiment; however, one embodiment of the present invention is not limited to this example. For example, the electrode 126 may be provided over the insulating layer 213 or the insulating layer 210.

The electrode 126 may be formed using a light-transmitting conductive material or a light-blocking conductive material.

This embodiment can be implemented in appropriate combination with any of the structures described in the other embodiments and the like.

Embodiment 5

In this embodiment, a specific structure example of the display device 100 is described. FIG. 27A is a block diagram illustrating the display device 100. As described in Embodiment 1, the display device 100 includes the display region 235, the peripheral circuit region 232, and the peripheral circuit region 233.

The circuit included in the peripheral circuit region 232 functions as, for example, a scan line driver circuit. The circuit included in the peripheral circuit region 232 functions as, for example, a signal line driver circuit. Some sort of circuit may be provided to face the peripheral circuit region 232 with the display region 235 positioned therebetween. Some sort of circuit may be provided to face the peripheral circuit region 233 with the display region 235 positioned therebetween. As described above, the circuits included in the peripheral circuit region 232 and the peripheral circuit region 233 are collectively referred to as a peripheral driver circuit in some cases.

Any of a variety of circuits such as a shift register, a level shifter, an inverter, a latch, an analog switch, and a logic circuit can be used as the peripheral driver circuit. A transistor, a capacitor, and the like can be used in the peripheral driver circuit. A transistor included in the peripheral driver circuit can be formed in the same steps as the transistors included in the pixel 230.

The display device 200 includes m wirings 236 which are arranged substantially parallel to each other and whose potentials are controlled by the circuits included in the peripheral circuit region 232, and n wirings 237 which are arranged substantially parallel to each other and whose potentials are controlled by the circuits included in the peripheral circuit region 233.

The display region 235 includes the plurality of pixels 230 arranged in a matrix. Full-color display can be achieved by making the pixel 230 that adjusts red light, the pixel 230 that adjusts green light, and the pixel 230 that adjusts blue light collectively function as one pixel 240 and by adjusting the amount of light (emission luminance) emitted from each pixel 230. Thus, the three pixels 230 each function as a sub-pixel. That is, three sub-pixels adjust, for example, the amount of light of red light, green light, and blue light (see FIG. 27B1). The light colors adjusted by the three sub-pixels are not limited to red (R), green (G), and blue (B) and may be cyan (C), magenta (M), and yellow (Y) (see FIG. 27B2).

Four sub-pixels may collectively function as one pixel. For example, a sub-pixel that adjusts white light may be added to the three sub-pixels that adjust red light, green light, and blue light (see FIG. 27B3). The addition of the sub-pixel that adjusts white light can increase the luminance of the display region. Alternatively, a sub-pixel that adjusts yellow light may be added to the three sub-pixels that adjust red light, green light, and blue light (see FIG. 27B4). Alternatively, a sub-pixel that adjusts white light may be added to the three sub-pixels that adjust cyan light, magenta light, and yellow light (see FIG. 27B5).

When sub-pixels that adjust light of colors such as red, green, blue, cyan, magenta, and yellow are combined as appropriate with more sub-pixels functioning as one pixel, the reproducibility of halftones can be increased. Thus, the display quality can be improved.

The display device of one embodiment of the present invention can reproduce the color gamut of various standards. For example, the display device of one embodiment of the present invention can reproduce the color gamut of the following standards: the Phase Alternating Line (PAL) or National Television System Committee (NTSC) standard used for TV broadcasting; the standard RGB (sRGB) or Adobe RGB standard used widely for display devices in electronic devices such as personal computers, digital cameras, and printers; the International Telecommunication Union Radiocommunication Sector Broadcasting Service (Television) 709 (ITU-R BT.709) standard used for high-definition televisions (HDTV, also referred to Hi-Vision); the Digital Cinema Initiatives P3 (DCI-P3) standard used for digital cinema projection; and the ITU-R BT.2020 (Recommendation 2020 (REC.2020)) standard used for ultra-high-definition televisions (UHDTV, also referred to as Super Hi-Vision); and the like.

Using the pixels 240 arranged in a matrix of 1920×1080, the display device 100 can achieve full color display with full high definition (also referred to as 2K resolution, 2K1K, 2K, and the like). Using the pixels 240 arranged in a matrix of 3840×2160, the display device 100 can achieve full color display with ultra high definition (also referred to as 4K resolution, 4K2K, 4K, and the like). Using the pixels 240 arranged in a matrix of 7680×4320, the display device 100 can achieve full color display with super high definition (also referred to as 8K resolution, 8K4K, 8K, and the like). Using a larger number of pixels 240, the display device 100 can achieve full color display with 16K or 32K resolution.

<Circuit Configuration Example of Pixel 230>

Figure 28A:
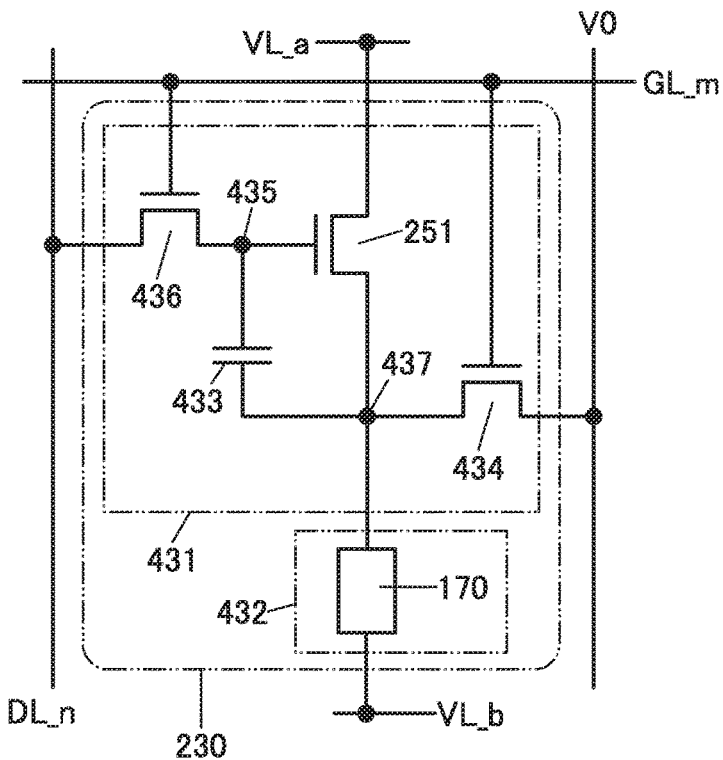
FIGS. 28A and 28B each illustrate a circuit configuration example of a pixel.
Figure 28B:
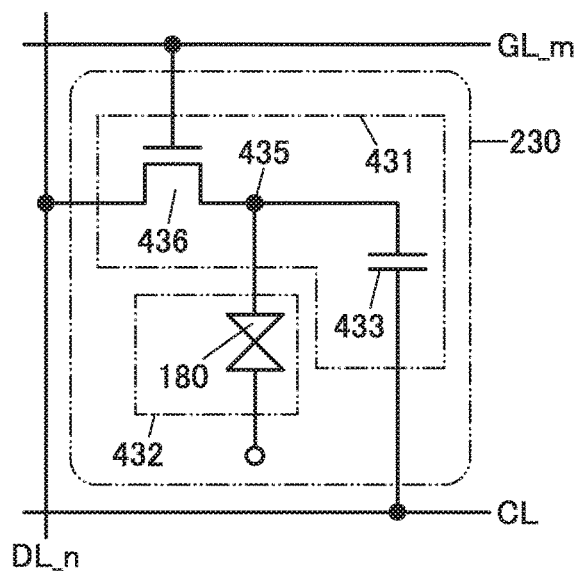

FIGS. 28A and 28B illustrate circuit configuration examples of the pixel 230. The pixel 230 includes a pixel circuit 431 and a display element 432.

Each of the wirings 236 is electrically connected to the n pixel circuits 431 in a given row among the pixel circuits 431 arranged in m rows and n columns in the display region 235. Each of the wirings 237 is electrically connected to the m pixel circuits 431 in a given column among the pixel circuits 431 arranged in m rows and n columns. Note that m and n are each an integer of 1 or more.

[Example of Pixel Circuit for Light-Emitting Display Device]

FIG. 28A illustrates an example of a circuit configuration that can be used for the pixel 230 in the display device 100. The pixel circuit 431 illustrated in FIG. 28A includes a transistor 436, a capacitor 433, the transistor 251, and a transistor 434. The pixel circuit 431 is electrically connected to the light-emitting element 170 that can function as the display element 432.

One of a source electrode and a drain electrode of the transistor 436 is electrically connected to a wiring to which a data signal (also referred to as a video signal) is supplied (hereinafter, referred to as a signal line DL_n). A gate electrode of the transistor 436 is electrically connected to a wiring to which a gate signal is supplied (hereinafter, referred to as a scan line GL_m). The signal line DL_n and the scan line GL_m correspond to the wiring 237 and the wiring 236, respectively.

The transistor 436 has a function of controlling whether to write a data signal to a node 435.

One of a pair of electrodes of the capacitor 433 is electrically connected to the node 435, and the other of the pair of electrodes of the capacitor 433 is electrically connected to a node 437. The other of the source electrode and the drain electrode of the transistor 436 is electrically connected to the node 435.

The capacitor 433 functions as a storage capacitor for storing data written to the node 435.

One of a source electrode and a drain electrode of the transistor 251 is electrically connected to a potential supply line VL_a, and the other of the source electrode and the drain electrode of the transistor 251 is electrically connected to the node 437. A gate electrode of the transistor 251 is electrically connected to the node 435.

One of a source electrode and a drain electrode of the transistor 434 is electrically connected to a potential supply line V0, and the other of the source electrode and the drain electrode of the transistor 434 is electrically connected to the node 437. A gate electrode of the transistor 434 is electrically connected to the scan line GL_m.

One of an anode and a cathode of the light-emitting element 170 is electrically connected to a potential supply line VL_b, and the other is electrically connected to the node 437.

As the light-emitting element 170, an organic electroluminescent element (also referred to as an organic EL element) or the like can be used, for example. Note that the light-emitting element 170 is not limited thereto and may be an inorganic EL element containing an inorganic material, for example.

As a power supply potential, a potential on the relatively high potential side or a potential on the relatively low potential side can be used, for example. A power supply potential on the high potential side is referred to as a high power supply potential (also referred to as VDD), and a power supply potential on the low potential side is referred to as a low power supply potential (also referred to as VSS). A ground potential can be used as the high power supply potential or the low power supply potential. For example, in the case where a ground potential is used as the high power supply potential, the low power supply potential is a potential lower than the ground potential, and in the case where a ground potential is used as the low power supply potential, the high power supply potential is a potential higher than the ground potential.

A high power supply potential VDD is supplied to one of the potential supply line VL_a and the potential supply line VL_b, and a low power supply potential VSS is supplied to the other, for example.

In the display device including the pixel circuit 431 in FIG. 28A, the pixel circuits 431 are sequentially selected row by row by the circuit included in the peripheral circuit region 232, whereby the transistors 436 and the transistors 434 are turned on and a data signal is written to the nodes 435.

When the transistors 436 and the transistors 434 are turned off, the pixel circuits 431 in which the data has been written to the nodes 435 are brought into a holding state. Furthermore, the amount of current flowing between the source electrode and the drain electrode of the transistor 251 is controlled in accordance with the potential of the data written to the node 435. The light-emitting element 170 emits light with a luminance corresponding to the amount of current flow. This operation is sequentially performed row by row; thus, an image can be displayed.

[Example of Pixel Circuit for Liquid Crystal Display Device]

The pixel circuit 431 in FIG. 28B includes the transistor 436 and the capacitor 433. The pixel circuit 431 is electrically connected to a liquid crystal element 180 functioning as the display element 432.

The potential of one of a pair of electrodes of the liquid crystal element 180 is set in accordance with the specifications of the pixel circuit 431 as appropriate. The alignment state of the liquid crystal element 180 depends on data written to the node 435. A common potential may be applied to one of the pair of electrodes of the liquid crystal element 180 included in each of the plurality of pixel circuits 431. The potential applied to one of the pair of electrodes of the liquid crystal element 180 in the pixel circuit 431 may differ between rows.

The liquid crystal element 180 can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element 180 can employ a variety of modes. For example, a liquid crystal element using, instead of a VA mode, a twisted nematic (TN) mode, an in-plane switching (IPS) mode, a VA-IPS mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, a guest-host mode, or the like can be used.

The liquid crystal element controls transmission or non-transmission of light utilizing an optical modulation action of a liquid crystal. The optical modulation action of the liquid crystal is controlled by an electric field applied to the liquid crystal (including a horizontal electric field, a vertical electric field, and an oblique electric field). As the liquid crystal used for the liquid crystal element, a thermotropic liquid crystal, a low-molecular liquid crystal, a high-molecular liquid crystal, a polymer dispersed liquid crystal (PDLC), a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, a positive liquid crystal or a negative liquid crystal may be used, and an appropriate liquid crystal material can be used depending on the mode or design to be used.

An alignment film can be provided to adjust the alignment of a liquid crystal. In the case where a horizontal electric field mode is employed, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral material is mixed to account for several weight percent or more is used for the liquid crystal in order to improve the temperature range. The liquid crystal composition which includes a liquid crystal exhibiting a blue phase and a chiral material has a short response time and optical isotropy, which makes the alignment process unneeded. In addition, the liquid crystal composition which includes a liquid crystal exhibiting a blue phase and a chiral material has a small viewing angle dependence. An alignment film does not need to be provided and rubbing treatment is thus not necessary; accordingly, electrostatic discharge damage caused by the rubbing treatment can be prevented and defects and damage of a liquid crystal display device in the manufacturing process can be reduced.

Note that when a guest-host mode liquid crystal material is used for the liquid crystal element 180, a functional member such as a light diffusion layer or a polarizing plate is not necessarily provided. Accordingly, the productivity of the display device can be improved. In addition, since a functional member such as a polarizing plate is unnecessary, the luminance of reflected light of the liquid crystal element 180 can be increased. Accordingly, the visibility of the display device can be increased.

The on and off states (bright and dark states) of a reflective liquid crystal display device including a circularly polarizing plate are switched depending on the alignment direction of the major axes of liquid crystal molecules: a direction substantially perpendicular to a substrate or a direction substantially parallel to the substrate. In general, it is difficult to use a liquid crystal element that operates in a horizontal electric field mode such as an IPS mode in a reflective liquid crystal display device because the major axes of liquid crystal molecules in the liquid crystal element are aligned in a direction substantially parallel to a substrate in both of the on and off states.

The on and off states of a liquid crystal element that operates in a horizontal electric field mode such as a VA-IPS mode are switched depending on the alignment direction of the major axes of liquid crystal molecules: a direction substantially perpendicular to a substrate or a direction substantially parallel to the substrate. Thus, when a liquid crystal element that operates in a horizontal electric field mode is used in a reflective liquid crystal display device, the liquid crystal element preferably operates in a VA-IPS mode.

Note that, as described later, a display element other than the light-emitting element 170 and the liquid crystal element 180 can be used.

In the pixel circuit 431 in the m-th row and the n-th column, one of the source electrode and the drain electrode of the transistor 436 is electrically connected to the signal line DL_n, and the other of the source electrode and the drain electrode of the transistor 436 is electrically connected to the node 435. The gate electrode of the transistor 436 is electrically connected to the scan line GL_m. The transistor 436 has a function of controlling whether to write a data signal to the node 435.

One of the pair of electrodes of the capacitor 433 is electrically connected to a wiring to which a specific potential is supplied (hereinafter, referred to as a capacitor line CL), and the other of the pair of electrodes of the capacitor 433 is electrically connected to the node 435. The other of the pair of electrodes of the liquid crystal element 180 is electrically connected to the node 435. The potential of the capacitor line CL is set in accordance with the specifications of the pixel circuit 431 as appropriate. The capacitor 433 functions as a storage capacitor for storing data written to the node 435.

For example, in the display device including the pixel circuit 431 in FIG. 28B, the pixel circuits 431 are sequentially selected row by row by the circuit included in the peripheral circuit region 232, whereby the transistors 436 are turned on and a data signal is written to the nodes 435.

When the transistors 436 are turned off, the pixel circuits 431 in which the data signal has been written to the nodes 435 are brought into a holding state. This operation is sequentially performed row by row; thus, an image can be displayed on the display region 235.

[Display Element]

The display device of one embodiment of the present invention can employ various modes and include various display elements. The display element includes at least one of an electroluminescent (EL) element (e.g., an EL element including organic and inorganic materials, an organic EL element, or an inorganic EL element) including an LED (e.g., a white LED, a red LED, a green LED, or a blue LED), a transistor (a transistor that emits light depending on current), a plasma display panel (PDP), an electron emitter, a liquid crystal element, an electrophoretic element, a display element using micro electro mechanical systems (MEMS) such as a grating light valve (GLV), a digital micromirror device (DMD), a digital micro shutter (DMS) element, a MIRASOL (registered trademark) display, an interferometric modulator display (IMOD) element, and a piezoelectric ceramic display, an electrowetting element, and the like. Other than the above, display media whose contrast, luminance, reflectivity, transmittance, or the like is changed by an electrical or magnetic effect may be included. Alternatively, quantum dots may be used as the display element.

Note that examples of display devices having EL elements include an EL display. Examples of a display device including an electron emitter include a field emission display (FED) and an SED-type flat panel display (SED: surface-conduction electron-emitter display). Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device including an electrophoretic element include electronic paper. Examples of a display device including quantum dots include a quantum dot display.

In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

This embodiment can be implemented in an appropriate combination with any of the structures described in the other embodiments.

Embodiment 6

In this embodiment, structure examples of a light-emitting element that can be used as the light-emitting element 170 are described. Note that an EL layer 320 described in this embodiment corresponds to the EL layer 172 described in the other embodiments.

<Structure of Light-Emitting Element>

Figure 29A:
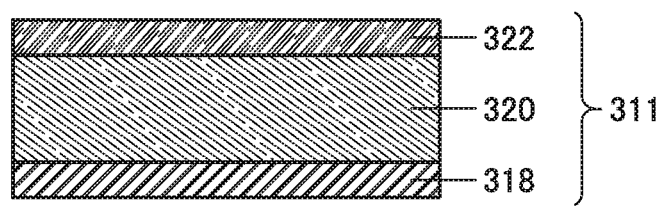
FIGS. 29A and 29B illustrate structure examples of light-emitting elements.

In the light-emitting element 311 illustrated in FIG. 29A, the EL layer 320 is provided between a pair of electrodes (an electrode 318 and an electrode 322). The electrode 318, the electrode 322, and the EL layer 320 respectively correspond to the electrode 171, the electrode 173, and the EL layer 172 of the aforementioned embodiments. Note that the electrode 318 is used as an anode and the electrode 322 is used as a cathode as an example in the following description of this embodiment.

The EL layer 320 includes at least a light-emitting layer and may have a stacked-layer structure including a functional layer other than the light-emitting layer.

As the functional layer other than the light-emitting layer, a layer containing a substance having a high hole-injection property, a substance having a high hole-transport property, a substance having a high electron-transport property, a substance having a high electron-injection property, a bipolar substance (a substance having high electron- and hole-transport properties), or the like can be used. Specifically, functional layers such as a hole-injection layer, a hole-transport layer, an electron-transport layer, and an electron-injection layer can be used in combination as appropriate.

The light-emitting element 311 illustrated in FIG. 29A emits light when current flows because of a potential difference generated between the electrode 318 and the electrode 322 and holes and electrons are recombined in the EL layer 320. That is, the light-emitting region is formed in the EL layer 320.

In the present invention, light emitted from the light-emitting element 311 is extracted to the outside from the electrode 318 side or the electrode 322 side. Therefore, one of the electrode 318 and the electrode 322 is formed of a light-transmitting substance.

Figure 29B:
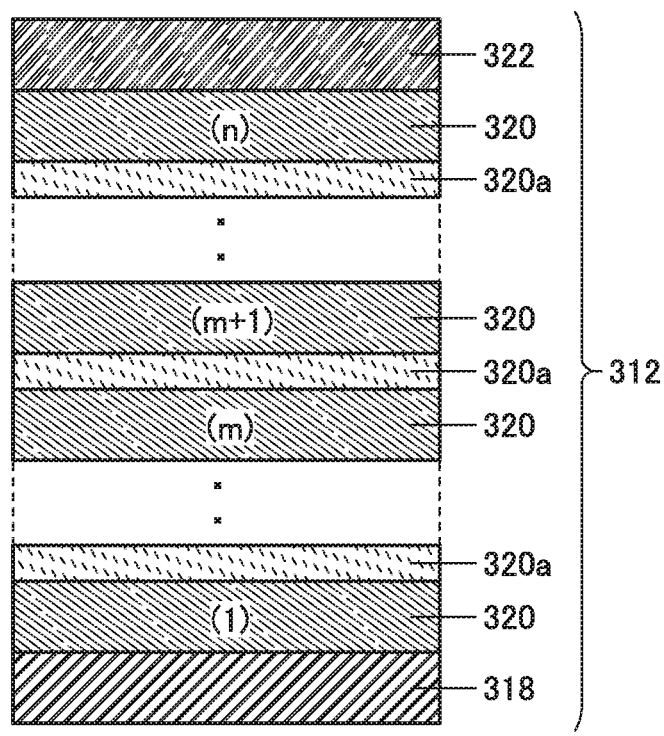

Note that a plurality of EL layers 320 may be stacked between the electrode 318 and the electrode 322 as in a light-emitting element 312 illustrated in FIG. 29B. In the case where n (n is a natural number of 2 or more) layers are stacked, a charge generation layer 320a is preferably provided between an m-th EL layer 320 and an (m+1)-th EL layer 320. Note that m is a natural number greater than or equal to 1 and less than n. The components except the electrode 318 and the electrode 322 correspond to the EL layer 172 of the aforementioned embodiments.

The charge generation layer 320a can be formed using a composite material of an organic compound and a metal oxide. Examples of the metal oxide include vanadium oxide, molybdenum oxide, and tungsten oxide. As the organic compound, a variety of compounds can be used; for example, an aromatic amine compound, a carbazole derivative, an aromatic hydrocarbon, and an oligomer, a dendrimer, and a polymer which have a basic skeleton of any of these compounds can be used. As the organic compound, it is preferable to use the organic compound which has a hole-transport property and has a hole mobility of $10^{-6}$ cm$^2$/Vs or higher. Note that other substances may be used as long as their hole-transport properties are higher than their electron-transport properties. These materials used for the charge generation layer 320a have excellent carrier-injection properties and carrier-transport properties; thus, the light-emitting element 312 can be driven with low current and with low voltage. Other than the composite material, a material obtained by adding an alkali metal, an alkaline earth metal, a compound of the alkali metal, a compound of an alkaline earth metal, or the like to the above-described composite material can be used for the charge generation layer 320a.

Note that the charge generation layer 320a may be formed with a combination of a composite material of an organic compound and a metal oxide with another material. For example, a layer containing the composite material of an organic compound and a metal oxide may be combined with a layer containing a compound of a substance selected from electron-donating substances and a compound having a high electron-transport property. Moreover, a layer containing the composite material of an organic compound and a metal oxide may be combined with a transparent conductive film.

The light-emitting element 312 having such a structure is unlikely to result in energy transfer between the adjacent EL layers 320 and can easily have high emission efficiency and a long lifetime. Moreover, it is easy to obtain phosphorescence from one light-emitting layer and fluorescence from the other light-emitting layer.

The charge generation layer 320a has a function of injecting holes to one of the EL layers 320 that is in contact with the charge generation layer 320a and a function of injecting electrons to the other EL layer 320 that is in contact with the charge generation layer 320a, when voltage is applied between the electrode 318 and the electrode 322.

The light-emitting element 312 illustrated in FIG. 29B can provide a variety of emission colors by changing the type of the light-emitting substance used for the EL layer 320. In addition, a plurality of light-emitting substances emitting light of different colors may be used as the light-emitting substances, whereby light emission having a broad spectrum or white light can be obtained.

In the case of obtaining white light using the light-emitting element 312 in FIG. 29B, as for a combination of a plurality of EL layers, a structure for emitting white light including red light, blue light, and green light may be used. For example, the structure may include an EL layer containing a blue fluorescent substance as a light-emitting substance and an EL layer containing green and red phosphorescent substances as light-emitting substances. Alternatively, a structure including an EL layer emitting red light, an EL layer emitting green light, and an EL layer emitting blue light may be employed. Further alternatively, with a structure including EL layers emitting light of complementary colors, white light can be obtained. In a stacked-layer element including two EL layers which emit light of complementary colors, the combinations of colors are as follows: blue and yellow, blue-green and red, and the like.

Note that in the structure of the above-described stacked-layer element, by providing the charge generation layer between the stacked light-emitting layers, the element can emit light with high luminance at a low current density, and have a long lifetime.

This embodiment can be implemented in an appropriate combination with any of the structures described in the other embodiments.

Embodiment 7

In this embodiment, an operation mode that can be employed in the display device 100 is described with reference to FIGS. 30A1, 30A2, 30B, and 30C.

In this embodiment, a normal driving mode (normal mode) with a normal frame frequency (typically, higher than or equal to 60 Hz and lower than or equal to 240 Hz) and an idling stop (IDS) driving mode with a low frame frequency will be described below, for example.

Note that the IDS driving mode refers to a driving method in which after image data is written, rewriting of image data is stopped. This increases the interval between writing of image data and subsequent writing of image data, thereby reducing the power that would be consumed by writing of image data in that interval. The IDS driving mode can be performed at a frame frequency which is $\frac{1}{100}$ to $\frac{1}{10}$ of the normal driving mode, for example. A still image is displayed by the same video signals in consecutive frames. Thus, the IDS driving mode is particularly effective when displaying a still image. When an image is displayed using IDS driving, power consumption is reduced, image flickering (flicker) is suppressed, and eyestrain can be reduced.

FIGS. 30A1 and 30A2 are pixel circuit diagrams, and FIGS. 30B and 30C are timing charts showing the normal driving mode and the IDS driving mode. Note that in FIG. 30A1, a display element 501 and a pixel circuit 431 electrically connected to the display element 501 are illustrated. The liquid crystal element 180 is used as the display element 501, for example. In the pixel circuit 431 in FIG. 30A1, a signal line SL, a gate line GL, a transistor M1 connected to the signal line SL and the gate line GL, and a capacitor $C_{SLC}$ connected to the transistor M1 are illustrated. Note that a node to which one electrode of the display element 501, one of a source and a drain of the transistor M1, and the capacitor $C_{SLC}$ are connected is referred to as a node ND1.

FIG. 30A2 illustrates a display element 502 and the pixel circuit 431 electrically connected to the display element 502. For example, the light-emitting element 170 (EL element) is used as the display element 502. In the pixel circuit 431 in FIG. 30A2, the signal line SL, the gate line GL, the transistor M1 connected to the signal line SL and the gate line GL, a transistor M2 connected to the transistor M1 and the display element 502, and a capacitor $C_{SEL}$ connected to the transistor M1, the transistor M2, and the display element 502 are illustrated.

Data $D_1$ is supplied from the signal line SL. Then, the data $D_1$ is supplied to the node ND1 through the transistor M1. After that, the transistor M1 is turned off, so that the data $D_1$ is held at the node ND1. Thus, the transistor M1 may become a leakage path of the data $D_1$ supplied from the signal line SL to the node ND1. The off-state current of the transistor M1 is preferably as low as possible. A transistor including a metal oxide in a semiconductor layer in which a channel is formed is preferably used as the transistor M1. A metal oxide having at least one of an amplification function, a rectification function, and a switching function can be referred to as a metal oxide semiconductor or an oxide semiconductor (abbreviated to an OS). As a typical example of a transistor, a transistor including an oxide semiconductor in a semiconductor layer in which a channel is formed (OS transistor) is described. The OS transistor has a feature of extremely low leakage current (off-state current) in an off state compared with a transistor including polycrystalline silicon or the like. When the OS transistor is used as the transistor M1, electric charges supplied to the node ND1 can be held for a long period.

In particular, the response speed of an EL element used as the display element 502 is higher than that of a liquid crystal element; accordingly, the EL element is sensitive to a change in the voltage of the node ND1. Thus, it is preferable to use the OS transistor as the transistor M1 of the pixel circuit 431, in which case flickers due to a change in electric charges of the node ND1 can be reduced.

In addition, the off-state current of a transistor used as the transistor M2 is preferably as low as possible. The use of a transistor having a low off-state current as the transistor M2 can suppress a phenomenon of slight light emission in a black display (also referred to as black floating). Accordingly, the OS transistor is preferably used as the transistor M2 of the pixel circuit 431.

In the circuit diagram illustrated in FIG. 30A2, the liquid crystal element used as the display element 502 becomes a leakage path of the data $D_1$. Therefore, to perform IDS driving appropriately, the resistivity of the liquid crystal element is preferably higher than or equal to $1.0 \times 10^{14}$ Ω·cm.

Note that for example, an In—Ga—Zn oxide, an In—Zn oxide, or the like can be suitably used for a channel formation region of the above OS transistor. The In—Ga—Zn oxide can typically have an atomic ratio of In:Ga:Zn=4:2:4.1 or a neighborhood thereof.

FIG. 30B is a timing chart showing waveforms of signals supplied to the signal line SL and the gate line GL in the normal driving mode. In the normal driving mode, a normal frame frequency (e.g., 60 Hz) is used for operation. FIG. 30B shows periods $T_1$ to $T_3$. A scan signal is supplied to the gate line GL in each frame period and the data $D_1$ is written from the signal line SL to the node ND1. This operation is performed both to write the same data $D_1$ in the periods $T_1$ to $T_3$ and to write different data in the periods $T_1$ to $T_3$.

FIG. 30C is a timing chart showing waveforms of signals supplied to the signal line SL and the gate line GL in the IDS driving mode. In the IDS driving, a low frame frequency (e.g., 1 Hz) is used for operation. One frame period is denoted by a period $T_1$ and includes a data writing period $T_W$ and a data retention period $T_{RET}$. In the IDS driving mode, a scan signal is supplied to the gate line GL and the data $D_1$ of the signal line SL is written in the period $T_W$, the gate line GL is fixed to a low-level voltage in the period $T_{RET}$, and the transistor M1 is turned off so that the written data $D_1$ is retained. Note that the low frame frequency may be higher than or equal to 0.1 Hz and lower than 60 Hz, for example.

This embodiment can be implemented in an appropriate combination with any of the structures described in the other embodiments and the like.

Embodiment 8

In this embodiment, an example of a method for driving a touch sensor will be described with reference to drawings.

[Example of Sensing Method of Sensor]

Figure 31A:
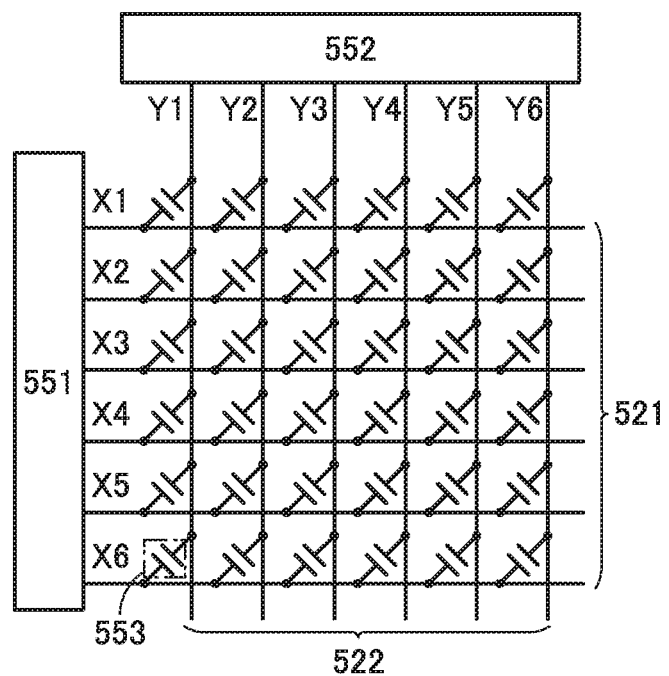
FIGS. 31A and 31B are a block diagram and a timing chart of a touch sensor.

FIG. 31A is a block diagram illustrating the structure of a mutual capacitive touch sensor. FIG. 31A illustrates a pulse voltage output circuit 551 and a current sensing circuit 552. Note that in FIG. 31A, six wirings X1 to X6 represent electrodes 521 to which a pulse voltage is applied, and six wirings Y1 to Y6 represent electrodes 522 that sense changes in current. FIG. 31A also illustrates a capacitor 553 that is formed where the electrodes 521 and 522 overlap with each other. Note that functional replacement between the electrodes 521 and 522 is possible.

The pulse voltage output circuit 551 is a circuit for sequentially applying a pulse voltage to the wirings X1 to X6. By application of a pulse voltage to the wirings X1 to X6, an electric field is generated between the electrodes 521 and 522 of the capacitors 553. When the electric field between the electrodes is shielded, for example, a change occurs in the capacitor 553 (mutual capacitance). The approach or contact of a sensing target can be sensed by utilizing this change.

The current sensing circuit 552 is a circuit for sensing changes in current flowing through the wirings Y1 to Y6 that are caused by the change in mutual capacitance in the capacitor 553. No change in current value is sensed in the wirings Y1 to Y6 when there is no approach or contact of a sensing target, whereas a decrease in current value is sensed when mutual capacitance is decreased owing to the approach or contact of a sensing target. Note that an integrator circuit or the like is used for sensing of current.

Note that one or both of the pulse voltage output circuit 551 and the current sensing circuit 552 may be formed over the first element substrate 181 or the second element substrate 182. For example, it is preferable to form the pixel circuit, the peripheral driver circuit, and the like at the same time because the process can be simplified and the number of components used for driving the touch sensor can be reduced. One or both of the pulse voltage output circuit 551 and the current sensing circuit 552 may be mounted on an IC.

In particular, in the case of using an oxide semiconductor, crystalline silicon such as polycrystalline silicon or single crystal silicon, or the like for the semiconductor layer where a channel is formed in the transistor over the second element substrate 182, the driving characteristics of the pulse voltage output circuit 551, the current sensing circuit 552, or the like are increased and the sensitivity of the touch sensor can be thus increased.

Figure 31B:
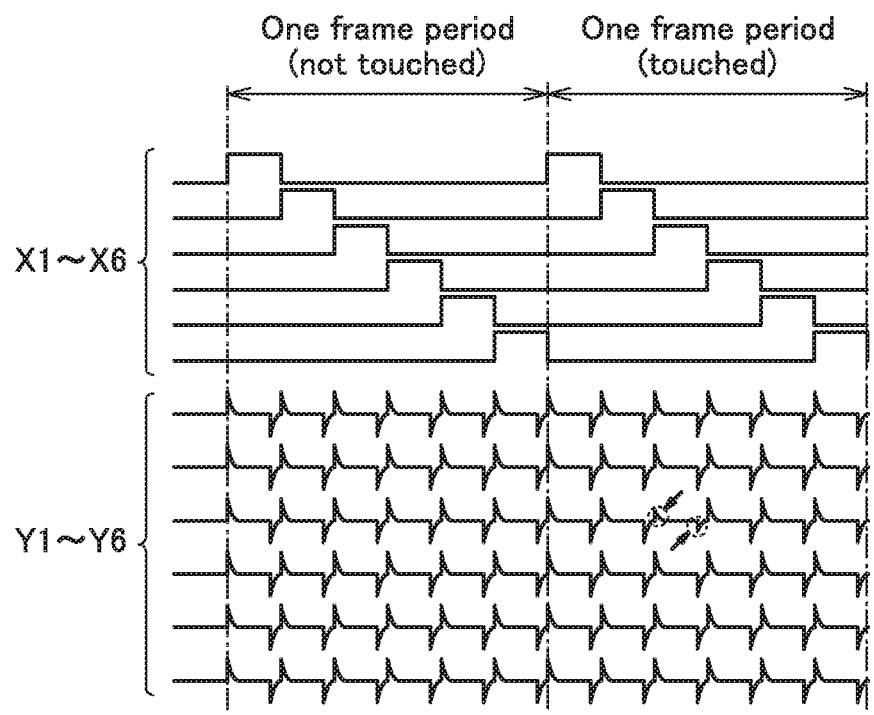

FIG. 31B is a timing chart showing input and output waveforms in the mutual capacitive touch sensor illustrated in FIG. 31A. In FIG. 31B, sensing of a sensing target is performed in all the rows and columns in one frame period. FIG. 31B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change uniformly in accordance with changes in the voltages of the wirings X1 to X6. The current value is decreased at the point of approach or contact of a sensing target and accordingly the waveform of the voltage value changes.

By sensing a change in mutual capacitance in this manner, the approach or contact of a sensing target can be sensed.

Figure 32:
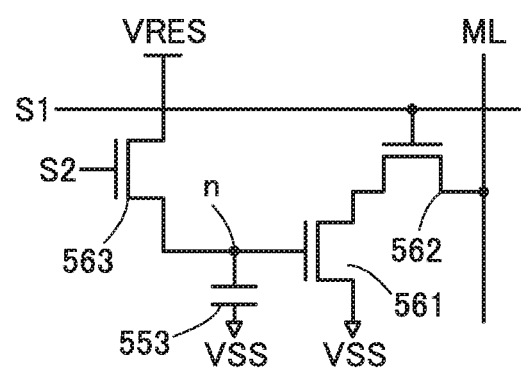
FIG. 32 is a circuit diagram of a touch sensor.

Although FIG. 31A is a passive matrix touch sensor in which only the capacitor 553 is provided at the intersection of wirings as a touch sensor, the touch sensor may be an active matrix touch sensor including a transistor and a capacitor. FIG. 32 is a sensor circuit included in an active matrix touch sensor.

The sensor circuit includes the capacitor 553 and transistors 561, 562, and 563. A signal S2 is input to a gate of the transistor 563. A voltage VRES is applied to one of a source and a drain of the transistor 563, and one electrode of the capacitor 553 and a gate of the transistor 561 are electrically connected to the other of the source and the drain of the transistor 563. One of a source and a drain of the transistor 561 is electrically connected to one of a source and a drain of the transistor 562, and a voltage VSS is applied to the other of the source and the drain of the transistor 561. A signal S1 is input to a gate of the transistor 562, and a wiring ML is electrically connected to the other of the source and the drain of the transistor 562. The voltage VSS is applied to the other electrode of the capacitor 553.

Next, the operation of the sensor circuit will be described. First, a potential for turning on the transistor 563 is supplied as the signal S2, and a potential with respect to the voltage VRES is thus applied to a node n connected to the gate of the transistor 561. Then, a potential for turning off the transistor 563 is applied as the signal S2, whereby the potential of the node n is maintained.

Then, mutual capacitance of the capacitor 553 changes owing to the approach or contact of a sensing target such as a finger; accordingly, the potential of the node n is changed from VRES.

In reading operation, a potential for turning on the transistor 562 is supplied as the signal S1. Current flowing through the transistor 561, that is, current flowing through the wiring ML is changed in response to the potential of the node n. By sensing this current, the approach or contact of a sensing target can be sensed.

It is preferable that the transistors 561, 562, and 563 each include an oxide semiconductor in a semiconductor layer where a channel is formed. In particular, by using an oxide semiconductor in a semiconductor layer where a channel of the transistor 563 is formed, the potential of the node n can be held for a long time and the frequency of operation (refresh operation) of resupplying VRES to the node n can be reduced.

[Example of Driving Method of Display Device]

Figure 33A:
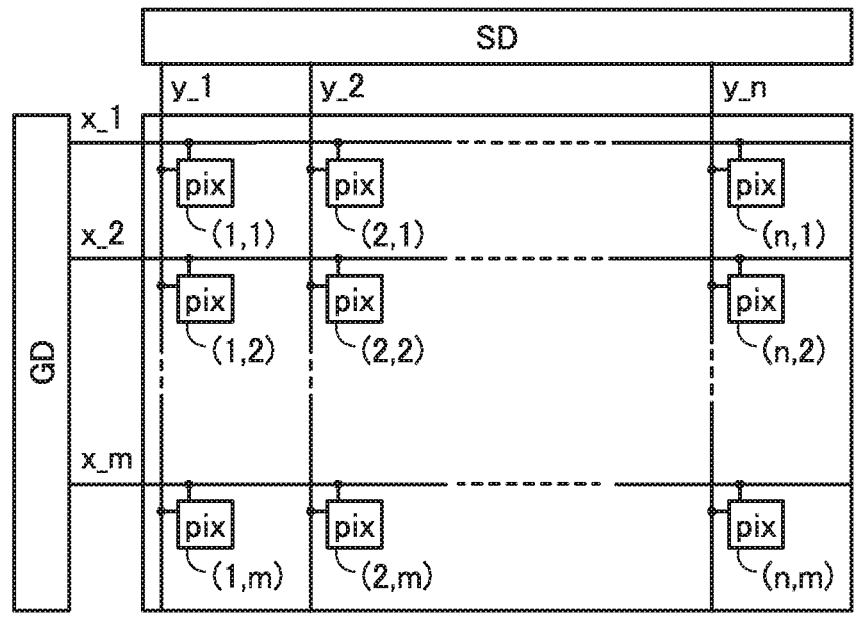
FIGS. 33A and 33B are a block diagram and a timing chart of a display device.

FIG. 33A is a block diagram illustrating a configuration example of a display device. FIG. 33A illustrates a gate driver circuit GD (a scan line driver circuit), a source driver circuit SD (a signal line driver circuit), and a display portion including a plurality of pixels pix. In FIG. 33A, gate lines x_1 to x_m (m is a natural number) electrically connected to the gate driver circuit GD and source lines y_1 to y_n (n is a natural number) electrically connected to the source driver circuit SD are illustrated. Corresponding to these lines, the pixels pix are denoted by (1, 1) to (n, m).

Figure 33B:
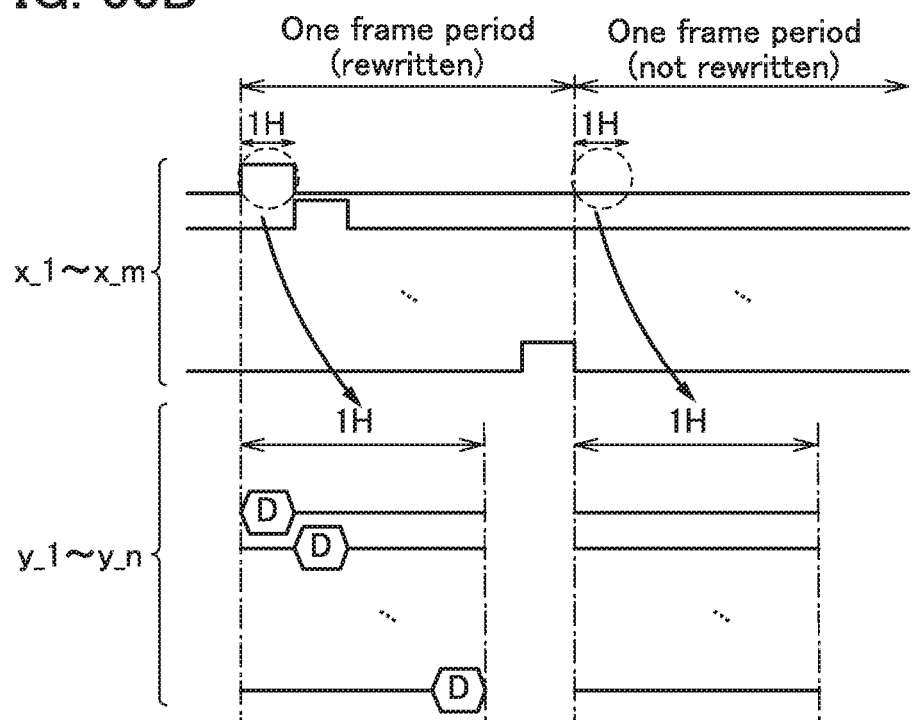

FIG. 33B is a timing chart of signals supplied to the gate lines and the source lines in the display device illustrated in FIG. 33A. The periods in FIG. 33B show the case where data signals are rewritten every frame period and the case where data signals are not rewritten. Note that periods such as a retrace period are not taken into consideration in FIG. 33B.

In the case where data signals are rewritten every frame period, scan signals are sequentially supplied to the gate lines x_1 to x_m. In a horizontal scanning period 1H, during which the scan signal is at an H level, data signals D are supplied to the source lines y_1 to y_n in the columns.

In the case where data signals are not rewritten every frame period, supply of scan signals to the gate lines x_1 to x_m is stopped. In the horizontal scanning period 1H, supply of data signals to the source lines y_1 to y_n in the columns is stopped.

A driving method in which data signals are not rewritten every frame period is effective particularly when an oxide semiconductor is used for the semiconductor layer where a channel is formed in the transistor included in the pixel pix. A transistor including an oxide semiconductor can have much lower off-state current than a transistor including a semiconductor such as silicon. Thus, a data signal written in the previous period can be held without rewriting data signals every frame period, and grayscale of pixels can be held for 1 second or longer, preferably 5 seconds or longer, for example.

In the case where polycrystalline silicon or the like is used for a semiconductor layer where a channel of a transistor included in the pixel pix is formed, the storage capacitance of the pixel is preferably increased in advance. The larger the storage capacitance is, the longer the grayscale of the pixel can be held. The storage capacitance may be determined depending on leakage current of a transistor or a display element which is electrically connected to the storage capacitor. For example, the storage capacitance per pixel is set to 5 fF to 5 pF inclusive, preferably 10 fF to 5 pF inclusive, and further preferably 20 fF to 1 pF inclusive, so that a data signal written in the previous period can be held without rewriting data signals every frame period. For example, grayscale of a pixel can be held for several frame periods or several tens of frame periods.

[Example of Driving Method of Display Portion and Touch Sensor]

Figure 34A:
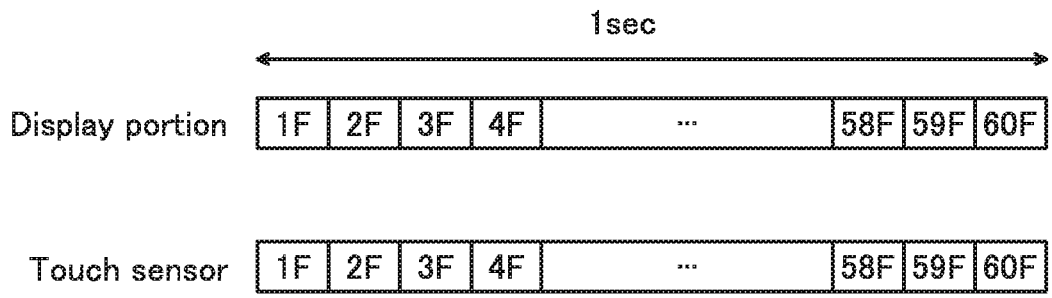
FIGS. 34A to 34D illustrate the operation of a display device and a touch sensor.

FIGS. 34A to 34D show examples of the operations in successive frame periods of the touch sensor described with reference to FIGS. 31A and 31B and the display portion described with reference to FIGS. 33A and 33B that are driven for 1 sec (one second). In FIG. 34A, one frame period for the display portion is 16.7 ms (frame frequency: 60 Hz), and one frame period for the touch sensor is 16.7 ms (frame frequency: 60 Hz).

Figure 34B:
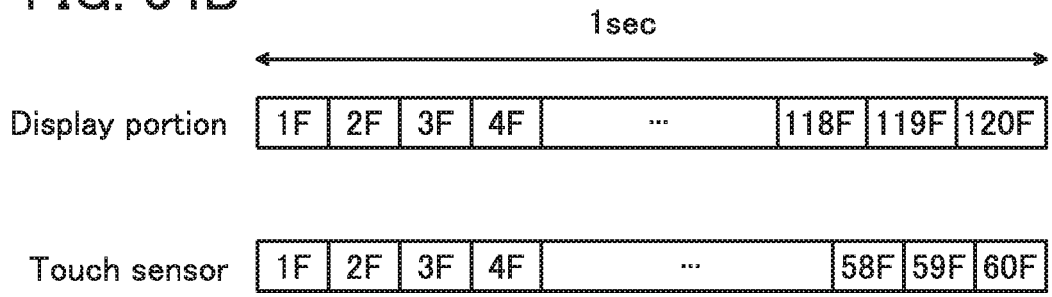

In the display device of one embodiment of the present invention, the display portion and the touch sensor operate independently of each other, and the display device can have a touch sensing period concurrent with a display period. That is why one frame period for the display portion and one frame period for the touch sensor can both be 16.7 ms (frame frequency: 60 Hz) as shown in FIG. 34A. The frame frequency for the touch sensor may differ from that for the display portion. For example, as shown in FIG. 34B, one frame period for the display portion may be 8.3 ms (frame frequency: 120 Hz) and one frame period for the touch sensor may be 16.7 ms (frame frequency: 60 Hz). The frame frequency for the display portion may be 33.3 ms (frame frequency: 30 Hz) (not shown).

The frame frequency for the display portion may be changeable, i.e., the frame frequency in displaying moving images may be increased (e.g., 60 Hz or more, or 120 Hz or more), whereas the frame frequency in displaying still images may be decreased (e.g., 60 Hz or less, 30 Hz or less, or 1 Hz or less). With this structure, the power consumption of the display device can be reduced. The frame frequency for the touch sensor may be changeable, and the frame frequency in waiting may differ from the frame frequency in sensing a touch.

Moreover, in the display device of one embodiment of the present invention, the following operation is possible: data signals are not rewritten in the display portion and a data signal written in the previous period is held. In that case, one frame period for the display portion can be longer than 16.7 ms. Thus, as shown in FIG. 34C, the operation can be switched so that one frame period for the display portion is 1 sec (frame frequency: 1 Hz) and one frame period for the touch sensor is 16.7 ms (frame frequency: 60 Hz).

Note that for the operation in which data signals are not rewritten in the display portion and a data signal written in the previous period is held, the above-described IDS driving mode can be referred to. As the IDS driving mode, a partial IDS driving mode may be employed in which data signals are rewritten only in a specific region of the display portion. The partial IDS driving mode is a mode in which data signals are rewritten only in a specific region of the display portion and a data signal written in the previous period is held in the other region.

Figure 34C:
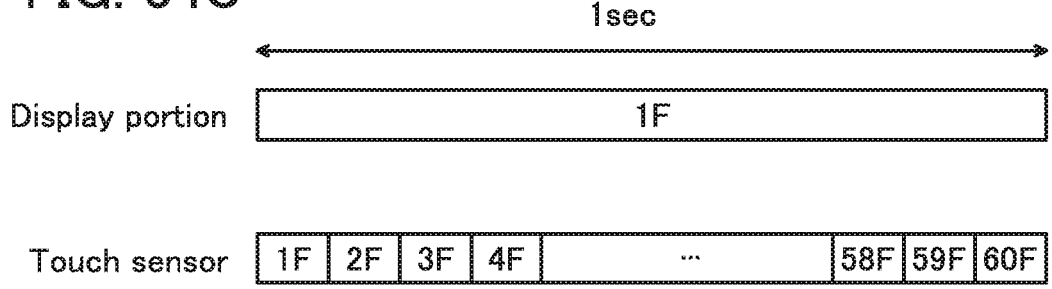
Figure 34D:
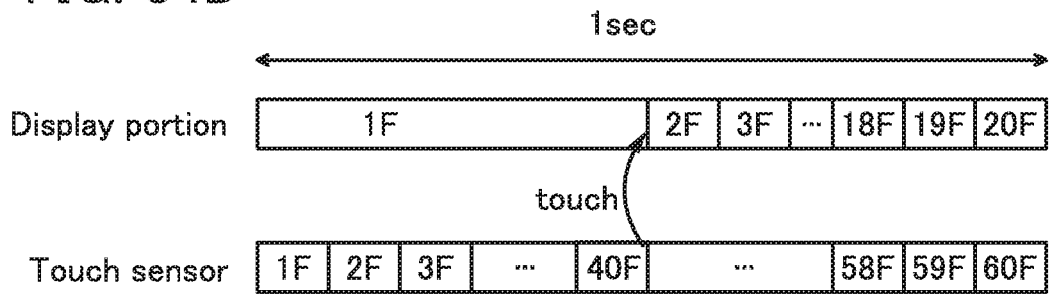

Furthermore, by the driving method of a touch sensor that is disclosed in this embodiment, the touch sensor can be continuously driven in the case of FIG. 34C. Thus, data signals in the display portion can also be rewritten when the approach or contact of a sensing target is sensed by the touch sensor, as shown in FIG. 34D.

If rewriting of data signals in a display portion is performed during a sensing period of a touch sensor, noise caused by rewriting of the data signals travels through the touch sensor and the sensitivity of the touch sensor might decrease. For this reason, rewriting of data signals in a display portion and sensing by a touch sensor are preferably performed in different periods.

FIG. 35A shows an example in which rewriting of data signals in a display portion and sensing by a touch sensor are performed alternately. FIG. 35B shows an example in which sensing by a touch sensor is performed one time every two rewritings of data signals in a display portion. Note that sensing by a touch sensor may be performed once every three or more rewritings.

In the case where an oxide semiconductor is used for a semiconductor layer where a channel is formed in a transistor included in the pixel pix, the off-state current can be significantly reduced and the frequency of rewriting data signals can be sufficiently reduced. Specifically, a sufficiently long break period can be set between rewritings of data signals. The break period can be 0.5 seconds or longer, 1 second or longer, or 5 seconds or longer, for example. The upper limit of the break period depends on the leakage current of a capacitor or a display element connected to the transistor; for example, 1 minute or shorter, 10 minutes or shorter, 1 hour or shorter, or 1 day or shorter.

FIG. 35C shows an example in which rewriting of data signals in a display portion is performed once every 5 seconds. A break period for stopping the rewriting operation of a display portion is set in FIG. 35C between rewriting of data signals and next rewriting. In the break period, a touch sensor can be operated at a frame frequency of i Hz (i is more than or equal to the frame frequency of a display device; here, 0.2 Hz or more). Preferably, sensing by a touch sensor is performed in a break period and is not performed in a rewriting period of data signals in a display portion as shown in FIG. 35C, so that the sensitivity of a touch sensor can be increased. When rewriting of data signals in a display portion and sensing by a touch sensor are performed at the same time as shown in FIG. 35D, operation signals can be simplified.

In a break period during which rewriting of data signals in a display portion is not performed, not only the supply of data signals to the display portion, but also the operation of one or both of the gate driver circuit GD and the source driver circuit SD may be stopped. The supply of power to one or both of the gate driver circuit GD and the source driver circuit SD may also be stopped. Thus, noise is further reduced, and the sensitivity of the touch sensor can be further increased. Moreover, the power consumption of the display device can be further reduced.

With the use of the above-described driving method, an excellent display device having reduced power consumption and increased detection sensitivity of a touch sensor can be obtained.

The display device of one embodiment of the present invention includes a display portion and a touch sensor between two substrates. With this structure, the distance between the display portion and the touch sensor can be reduced. At this time, noise is easily transmitted to the touch sensor in driving the display portion, which might reduce the sensitivity of the touch sensor. When the driving method in this embodiment is employed, a display device including a touch sensor, which has both reduced thickness and high sensitivity, can be obtained.

This embodiment can be implemented in an appropriate combination with any of the structures described in the other embodiments and the like.

Embodiment 9

In this embodiment, structure examples of transistors that can be used for the display device of one embodiment of the present invention are described with reference to FIGS. 36A to 36C, FIGS. 37A to 37C, and FIGS. 38A to 38C.

<Structure Example 1 of Transistor>

Figure 36A:
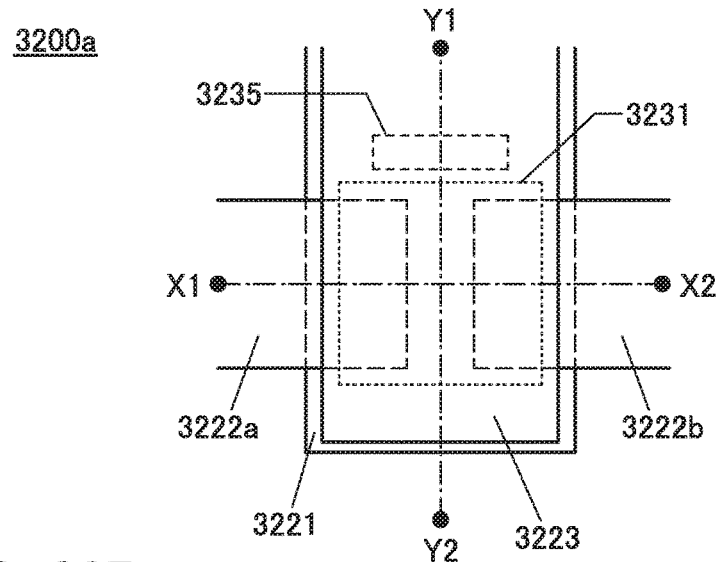
FIGS. 36A to 36C are a top view and cross-sectional views illustrating an example of a transistor used in a display device.
Figure 36B:
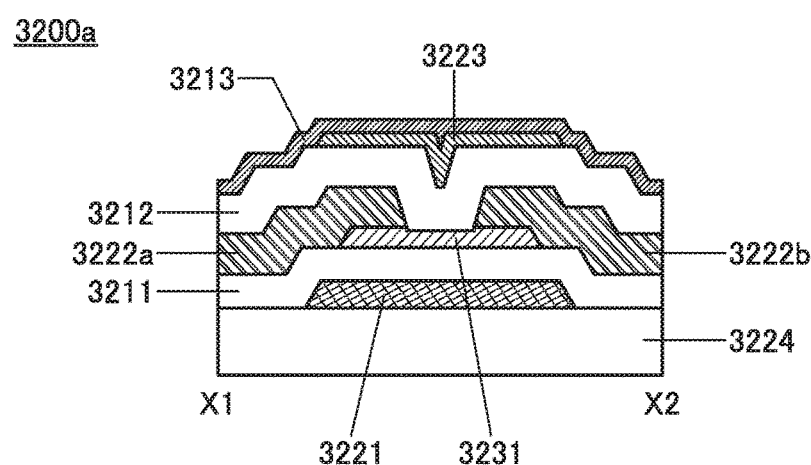
Figure 36C:
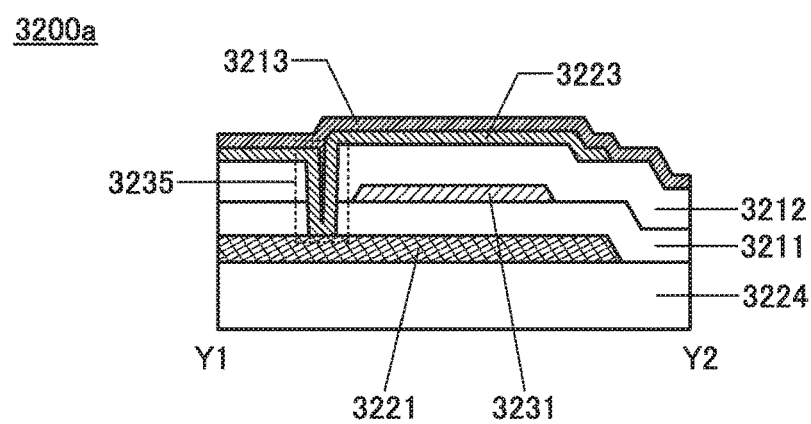

To show a structure example of a transistor, a transistor 3200a is described with reference to FIGS. 36A to 36C. FIG. 36A is a top view of the transistor 3200a. FIG. 36B is a cross-sectional view taken along the dashed-dotted line X1-X2 in FIG. 36A, and FIG. 36C is a cross-sectional view taken along the dashed-dotted line Y1-Y2 in FIG. 36A. Note that in FIG. 36A, some components of the transistor 3200a (e.g., an insulating layer serving as a gate insulating layer) are not illustrated to avoid complexity. Note that hereinafter, the direction of the dashed-dotted line X1-X2 may be called the channel length direction, and the direction of the dashed-dotted line Y1-Y2 may be called the channel width direction. As in FIG. 36A, some components are not illustrated in some cases in top views of transistors described below.

The transistor 3200a includes a conductive layer 3221 over an insulating layer 3224; an insulating layer 3211 over the insulating layer 3224 and the conductive layer 3221; a metal oxide layer 3231 over the insulating layer 3211; a conductive layer 3222a over the metal oxide layer 3231; a conductive layer 3222b over the metal oxide layer 3231; an insulating layer 3212 over the metal oxide layer 3231, the conductive layer 3222a, and the conductive layer 3222b; a conductive layer 3223 over the insulating layer 3212; and an insulating layer 3213 over the insulating layer 3212 and the conductive layer 3223.

The insulating layers 3211 and 3212 have an opening 3235. The conductive layer 3223 is electrically connected to the conductive layer 3221 in the opening 3235.

The insulating layer 3211 serves as a first gate insulating layer of the transistor 3200a. The insulating layer 3212 serves as a second gate insulating layer of the transistor 3200a. The insulating layer 3213 serves as a protective insulating layer of the transistor 3200a. The conductive layer 3221 serves as a first gate of the transistor 3200a. The conductive layer 3222a serves as one of a source and a drain of the transistor 3200a and the conductive layer 3222b serves as the other of the source and the drain. The conductive layer 3223 serves as a second gate of the transistor 3200*a*.

Note that the transistor 3200*a* is a channel-etched transistor, and has a dual-gate structure.

The transistor 3200*a* without the conductive layer 3223 is also available. In that case, the transistor 3200*a* is a channel-etched transistor, and has a bottom-gate structure.

As illustrated in FIGS. 36B and 36C, the metal oxide layer 3231 faces the conductive layer 3221 and the conductive layer 3223, and is between the conductive layers serving as the two gates. The length of the conductive layer 3223 in the channel length direction is longer than the length of the metal oxide layer 3231 in the channel length direction. The length of the conductive layer 3223 in the channel width direction is longer than the length of the metal oxide layer 3231 in the channel width direction. The whole metal oxide layer 3231 is covered with the conductive layer 3223 with the insulating layer 3212 positioned therebetween.

In other words, the conductive layers 3221 and 3223 are connected to each other in the opening 3235 provided in the insulating layers 3211 and 3212, and have a region located outside a side end portion of the metal oxide layer 3231.

With this structure, the metal oxide layer 3231 included in the transistor 3200*a* can be electrically surrounded by electric fields of the conductive layers 3221 and 3223. A device structure of a transistor in which electric fields of a first gate and a second gate electrically surround a metal oxide layer where a channel formation region is formed, like in the transistor 3200*a*, can be referred to as a surrounded channel (S-channel) structure.

Since the transistor 3200*a* has the S-channel structure, an electric field for inducing a channel can be effectively applied to the metal oxide layer 3231 by the conductive layer 3221 serving as the first gate; therefore, the current drive capability of the transistor 3200*a* can be improved and high on-state current characteristics can be obtained. Since the on-state current can be increased, it is possible to reduce the size of the transistor 3200*a*. In addition, since the transistor 3200*a* has a structure in which the metal oxide layer 3231 is surrounded by the conductive layer 3221 serving as the first gate and the conductive layer 3223 serving as the second gate, the mechanical strength of the transistor 3200*a* can be increased.

For example, it is preferable that the metal oxide layer 3231 contain In, M (M is gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, or magnesium), and Zn.

The metal oxide layer 3231 preferably includes a region in which the atomic proportion of In is larger than the atomic proportion of M For example, the atomic ratio of In to M and Zn in the metal oxide layer 3231 is preferably In:M:Zn=4:2:3 or in the neighborhood thereof. As for the range expressed by the term "neighborhood" here, when In is 4, M ranges from 1.5 to 2.5 and Zn ranges from 2 to 4. Alternatively, the atomic ratio of In to M and Zn in the metal oxide layer 3231 is preferably In:M:Zn=5:1:6 or in the neighborhood thereof.

The metal oxide layer 3231 is preferably a CAC-OS or a CAC metal oxide. When the metal oxide layer 3231 is a CAC-OS or a CAC metal oxide and has a region in which the atomic proportion of In is higher than the atomic proportion of M, the transistor 3200*a* can have high field-effect mobility.

Since the transistor 3200*a* having the S-channel structure has high field-effect mobility and high driving capability, the use of the transistor 3200*a* in the driver circuit, a typical example of which is a gate driver that generates a gate signal, allows the display device to have a narrow bezel. The use of the transistor 3200*a* in a source driver (particularly in a demultiplexer connected to an output terminal of a shift register included in the source driver) that supplies a signal to a signal line included in the display device can reduce the number of wirings connected to the display device.

Furthermore, the transistor 3200*a* is a channel-etched transistor and thus can be fabricated through a smaller number of steps than a transistor formed using low-temperature polysilicon. In addition, unlike the transistor formed using low-temperature polysilicon, the transistor 3200*a* including the metal oxide layer in the channel does not need a laser crystallization step. Accordingly, the manufacturing cost can be reduced even in the case of a display device formed using a large substrate. Transistors having high field-effect mobility like the transistor 3200*a* are preferably used in a driver circuit and a display portion of a large display device having high resolution such as ultra high definition (4K resolution, 4K2K, or 4K) or super high definition (8K resolution, 8K4K, or 8K), in which case writing can be performed in a short time and display defects can be reduced.

The insulating layers 3211 and 3212 in contact with the metal oxide layer 3231 are preferably oxide insulating films, and further preferably includes a region containing oxygen in excess of the stoichiometric composition (oxygen-excess region). In other words, the insulating layers 3211 and 3212 are insulating films from which oxygen can be released. In order to provide the oxygen-excess region in the insulating layers 3211 and 3212, the insulating layers 3211 and 3212 are formed in an oxygen atmosphere, or the deposited insulating layers 3211 and 3212 are subjected to heat treatment in an oxygen atmosphere, for example.

An oxide semiconductor, which is a kind of metal oxide, can be used for the metal oxide layer 3231.

In the case where the metal oxide layer 3231 includes an In-M-Zn oxide, it is preferable that the atomic ratio of metal elements of a sputtering target used for forming the In-M-Zn oxide satisfy In>M The atomic ratio of metal elements in such a sputtering target is, for example, In:M:Zn=2:1:3, In:M:Zn=3:1:2, In:M:Zn=4:2:4.1, In:M:Zn=5:1:6, In:M:Zn=5:1:7, In:M:Zn=5:1:8, In:M:Zn=6:1:6, or In:M:Zn=5:2:5.

In the case where the metal oxide layer 3231 is formed using an In-M-Zn oxide, it is preferable to use a target including a polycrystalline In-M-Zn oxide as the sputtering target. The use of the target including a polycrystalline In-M-Zn oxide facilitates formation of the metal oxide layer 3231 having crystallinity. Note that the atomic ratio of metal elements in the formed metal oxide layer 3231 varies from the above atomic ratios of metal elements of the sputtering targets in a range of ±40%. For example, when a sputtering target with an atomic ratio of In:Ga:Zn=4:2:4.1 is used for forming the metal oxide layer 3231, the atomic ratio of In to Ga and Zn in the formed metal oxide layer 3231 may be 4:2:3 or in the neighborhood of 4:2:3.

The energy gap of the metal oxide layer 3231 is 2 eV or more, preferably 2.5 eV or more. The use of such an oxide semiconductor having a wide energy gap leads to a reduction in off-state current of a transistor.

Furthermore, the metal oxide layer 3231 preferably has a non-single-crystal structure. The non-single-crystal structure includes a c-axis aligned crystalline (CAAC) structure, a polycrystalline structure, a microcrystalline structure, or an amorphous structure, for example. Among the non-single-crystal structures, the amorphous structure has the highest density of defect states, whereas the CAAC structure has the lowest density of defect states.

The metal oxide layer 3231 formed with a metal oxide film with low impurity concentration and low density of defect states can give the transistor excellent electrical characteristics. Thus, the use of such a metal oxide film is preferable. Here, the state in which impurity concentration is low and density of defect states is low (the number of oxygen vacancies is small) is referred to as "highly purified intrinsic" or "substantially highly purified intrinsic". Note that impurities in the metal oxide film are typically water, hydrogen, and the like. In this specification and the like, reducing or removing water and hydrogen from the metal oxide film is referred to as dehydration or dehydrogenation in some cases. Moreover, adding oxygen to a metal oxide film or an oxide insulating film is referred to as oxygen addition in some cases, and a state in which oxygen in excess of the stoichiometric composition is contained due to the oxygen addition is referred to as an oxygen-excess state in some cases.

A highly purified intrinsic or substantially highly purified intrinsic metal oxide film has few carrier generation sources, and thus has a low carrier density. Thus, a transistor in which a channel formation region is formed in the metal oxide film rarely has a negative threshold voltage (is rarely normally on). The highly purified intrinsic or substantially highly purified intrinsic metal oxide film has a low density of defect states and accordingly has a low density of trap states in some cases. Furthermore, the highly purified intrinsic or substantially highly purified intrinsic metal oxide film has an extremely low off-state current; even when an element has a channel width of $1\times10^6$ lam and a channel length of 10 μm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

The insulating layer 3213 includes one or both of hydrogen and nitrogen. Alternatively, the insulating layer 3213 includes nitrogen and silicon. The insulating layer 3213 has a function of blocking oxygen, hydrogen, water, alkali metal, alkaline earth metal, or the like. The insulating layer 3213 can prevent outward diffusion of oxygen from the metal oxide layer 3231, outward diffusion of oxygen from the insulating layer 3212, and entry of hydrogen, water, or the like into the metal oxide layer 3231 from the outside.

The insulating layer 3213 can be a nitride insulating film, for example. The nitride insulating film is formed using silicon nitride, silicon nitride oxide, aluminum nitride, aluminum nitride oxide, or the like.

<Structure Example 2 of Transistor>

Figure 37A:
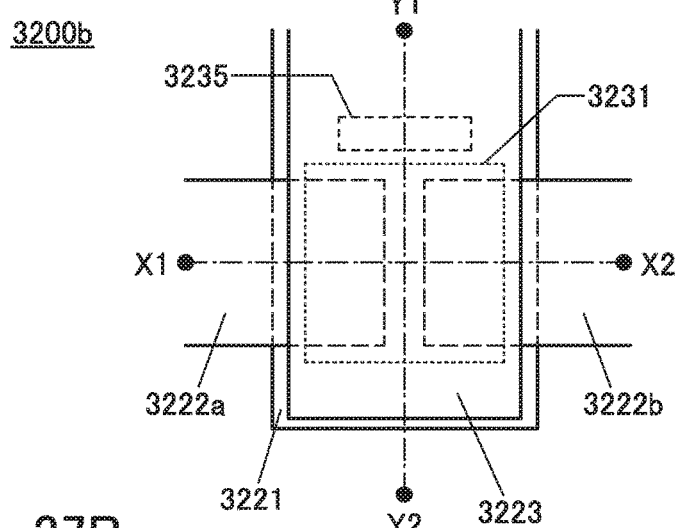
FIGS. 37A to 37C are a top view and cross-sectional views illustrating an example of a transistor used in a display device.
Figure 37B:
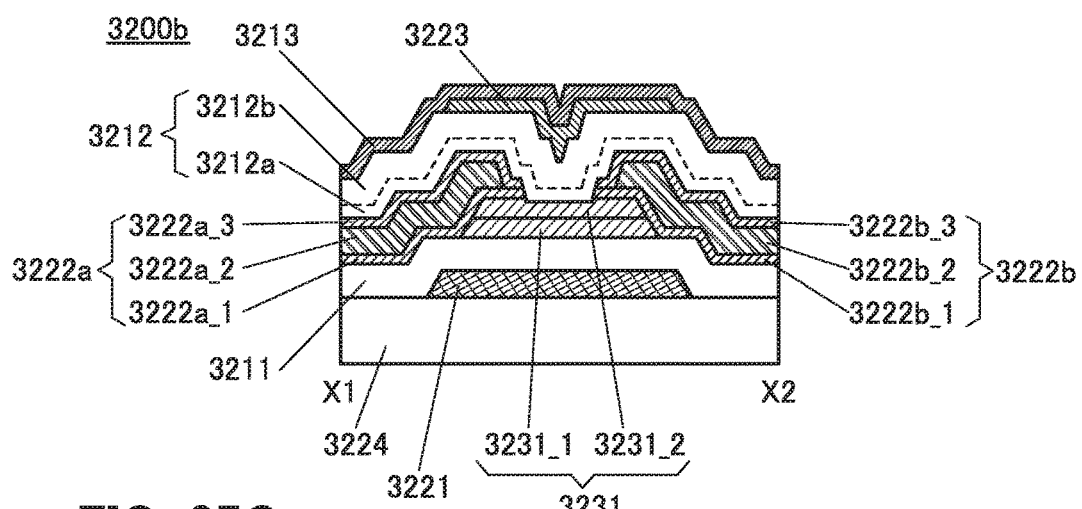
Figure 37C:
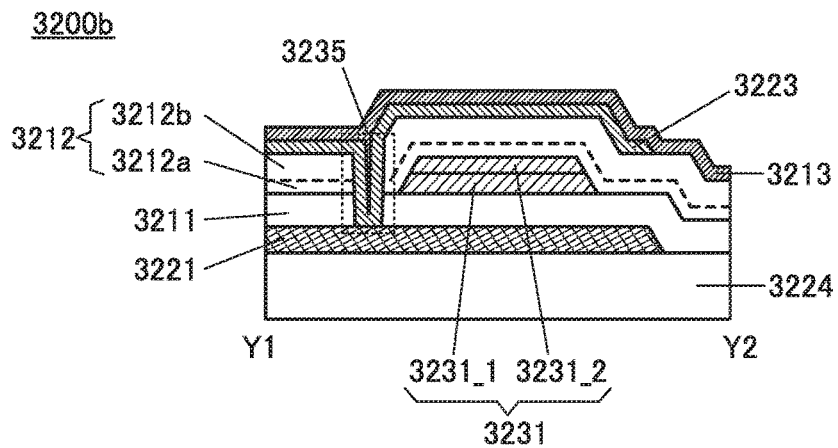

To show a structure example of a transistor, a transistor 3200b is described with reference to FIGS. 37A to 37C. FIG. 37A is a top view of the transistor 3200b. FIG. 37B is a cross-sectional view taken along the dashed-dotted line X1-X2 in FIG. 37A, and FIG. 37C is a cross-sectional view taken along the dashed-dotted line Y1-Y2 in FIG. 37A.

The transistor 3200b is different from the transistor 3200a in that the metal oxide layer 3231, the conductive layer 3222a, the conductive layer 3222b, and the insulating layer 3212 each have a multi-layer structure.

The insulating layer 3212 includes an insulating layer 3212a over the metal oxide layer 3231 and the conductive layers 3222a and 3222b, and an insulating layer 3212b over the insulating layer 3212a. The insulating layer 3212 has a function of supplying oxygen to the metal oxide layer 3231. That is, the insulating layer 3212 contains oxygen. The insulating layer 3212a is an insulating layer that allows oxygen to pass therethrough. Note that the insulating layer 3212a serves also as a film that relieves damage to the metal oxide layer 3231 at the time of forming the insulating layer 3212b.

A silicon oxide, a silicon oxynitride, or the like with a thickness greater than or equal to 5 nm and less than or equal to 150 nm, preferably greater than or equal to 5 nm and less than or equal to 50 nm can be used for the insulating layer 3212a.

Furthermore, it is preferable that the number of defects in the insulating layer 3212a be small and typically, the spin density of a signal that appears at g=2.001 due to a dangling bond of silicon be lower than or equal to $3\times10^{17}$ spins/cm$^3$ by electron spin resonance (ESR) measurement. This is because if the density of defects in the insulating layer 3212a is high, oxygen is bonded to the defects and the property of transmitting oxygen of the insulating layer 3212a is lowered.

Note that not all oxygen that has entered the insulating layer 3212a from the outside moves to the outside of the insulating layer 3212a but some oxygen remains in the insulating layer 3212a. In some cases, movement of oxygen occurs in the insulating layer 3212a in such a manner that oxygen enters the insulating layer 3212a and oxygen contained in the insulating layer 3212a moves to the outside of the insulating layer 3212a. When an oxide insulating layer that can transmit oxygen is formed as the insulating layer 3212a, oxygen released from the insulating layer 3212b provided over the insulating layer 3212a can be moved to the metal oxide layer 3231 through the insulating layer 3212a.

Note that the insulating layer 3212a can be formed using an oxide insulating layer having a low density of states due to nitrogen oxide. Note that the density of states due to nitrogen oxide can be formed between the valence band maximum (Ev_os) and the conduction band minimum (Ec_os) of the metal oxide film. A silicon oxynitride film that releases a small amount of nitrogen oxide, an aluminum oxynitride film that releases a small amount of nitrogen oxide, or the like can be used as the above oxide insulating layer.

Note that a silicon oxynitride film that releases a small amount of nitrogen oxide is a film which releases ammonia more than nitrogen oxide in thermal desorption spectroscopy (TDS) analysis; the amount of released ammonia is typically greater than or equal to $1\times10^{18}$/cm$^3$ and less than or equal to $5\times10^{19}$/cm$^3$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typically NO$_2$ or NO, forms levels in the insulating layer 3212a, for example. The level is positioned in the energy gap of the metal oxide layer 3231. Therefore, when nitrogen oxide is diffused to the interface between the insulating layer 3212a and the metal oxide layer 3231, an electron is in some cases trapped by the level on the insulating layer 3212a side. As a result, the trapped electron remains in the vicinity of the interface between the insulating layer 3212a and the metal oxide layer 3231; thus, the threshold voltage of the transistor is shifted in the positive direction.

Nitrogen oxide reacts with ammonia and oxygen in heat treatment. Since nitrogen oxide contained in the insulating layer 3212a reacts with ammonia contained in the insulating layer 3212b in heat treatment, nitrogen oxide contained in the insulating layer 3212a is reduced. Therefore, an electron is hardly trapped at the interface between the insulating layer 3212a and the metal oxide layer 3231.

By using the above oxide insulating layer for the insulating layer 3212a, a shift in the threshold voltage of the transistor can be reduced, which leads to reduced fluctuations in the electrical characteristics of the transistor.

The concentration of nitrogen of the above oxide insulating layer measured by SIMS is lower than or equal to $6 \times 10^{20}$ atoms/cm$^3$.

The above oxide insulating layer is formed by a PECVD method at a substrate temperature higher than or equal to 220° C. and lower than or equal to 350° C. using silane and dinitrogen monoxide, whereby a dense and hard film can be formed.

The insulating layer 3212b is an oxide insulating layer that contains oxygen at a higher proportion than the stoichiometric composition. Part of oxygen is released from the above oxide insulating layer by heating. The amount of oxygen released from the oxide insulating layer in TDS is more than or equal to $1.0 \times 10^{19}$ atoms/cm$^3$, preferably more than or equal to $3.0 \times 10^{20}$ atoms/cm$^3$. Note that the amount of released oxygen is the total amount of oxygen released by heat treatment in a temperature range of 50° C. to 650° C. or 50° C. to 550° C. in TDS. In addition, the amount of released oxygen is the total amount of released oxygen converted into oxygen atoms in TDS.

A silicon oxide film, a silicon oxynitride film, or the like with a thickness greater than or equal to 30 nm and less than or equal to 500 nm, preferably greater than or equal to 50 nm and less than or equal to 400 nm can be used for the insulating layer 3212b.

It is preferable that the number of defects in the insulating layer 3212b be small and typically, the spin density corresponding to a signal that appears at g=2.001 due to a dangling bond of silicon be lower than $1.5 \times 10^{18}$ spins/cm$^3$, preferably lower than or equal to $1 \times 10^{18}$ spins/cm$^3$ by ESR measurement. Note that the insulating layer 3212b is provided more apart from the metal oxide layer 3231 than the insulating layer 3212a is; thus, the insulating layer 3212b may have higher density of defects than the insulating layer 3212a.

Furthermore, the insulating layer 3212 can include insulating layers including the same kind of material; thus, a boundary between the insulating layer 3212a and the insulating layer 3212b cannot be clearly observed in some cases. Thus, in this embodiment, the boundary between the insulating layer 3212a and the insulating layer 3212b is shown by a dashed line. Although a two-layer structure including the insulating layers 3212a and 3212b is described in this embodiment, the present invention is not limited to this. For example, a single-layer structure including only the insulating layer 3212a or a multi-layer structure including three or more layers may be employed.

The metal oxide layer 3231 in the transistor 3200b includes a metal oxide layer 3231_1 over the insulating layer 3211 and a metal oxide layer 3231_2 over the metal oxide layer 3231_1. The metal oxide layers 3231_1 and 3231_2 contain the same kind of element. For example, it is preferable that the metal oxide layers 3231_1 and 3231_2 each independently contain the same element as the element in the metal oxide layer 3231 that is described above.

Each of the metal oxide layers 3231_1 and 3231_2 preferably contains a region where the atomic proportion of In is higher than the atomic proportion of M For example, the atomic ratio of In to M and Zn in each of the metal oxide layers 3231_1 and 3231_2 is preferably In:M:Zn=4:2:3 or in the neighborhood thereof. As for the range expressed by the term "neighborhood" here, when In is 4, M ranges from 1.5 to 2.5 and Zn ranges from 2 to 4. Alternatively, the atomic ratio of In to M and Zn in each of the metal oxide layers 3231_1 and 3231_2 is preferably In:M:Zn=5:1:6 or in the neighborhood thereof. The metal oxide layers 3231_1 and 3231_2 having substantially the same composition as described above can be formed using the same sputtering target; thus, the manufacturing cost can be reduced. When the same sputtering target is used, the metal oxide layers 3231_1 and 3231_2 can be formed successively in the same vacuum chamber. This can suppress entry of impurities into the interface between the metal oxide layers 3231_1 and 3231_2.

Here, the metal oxide layer 3231_1 may include a region whose crystallinity is lower than that of the metal oxide layer 3231_2. Note that the crystallinity of the metal oxide layers 3231_1 and 3231_2 can be determined by analysis by X-ray diffraction (XRD) or with a transmission electron microscope (TEM), for example.

The region with low crystallinity in the metal oxide layer 3231_1 serves as a diffusion path of excess oxygen, through which excess oxygen can be diffused into the metal oxide layer 3231_2 having higher crystallinity than the metal oxide layer 3231_1. When a multi-layer structure including the metal oxide layers having different crystal structures is employed and the region with low crystallinity is used as a diffusion path of excess oxygen as described above, the transistor can be highly reliable.

The metal oxide layer 3231_2 having a region with higher crystallinity than the metal oxide layer 3231_1 can prevent impurities from entering the metal oxide layer 3231. In particular, the increased crystallinity of the metal oxide layer 3231_2 can reduce damage at the time of processing into the conductive layers 3222a and 3222b. The surface of the metal oxide layer 3231, i.e., the surface of the metal oxide layer 3231_2 is exposed to an etchant or an etching gas at the time of processing into the conductive layers 3222a and 3222b. However, when the metal oxide layer 3231_2 has a region with high crystallinity, the metal oxide layer 3231_2 has higher etching resistance than the metal oxide layer 3231_1. Thus, the metal oxide layer 3231_2 serves as an etching stopper.

By including a region having lower crystallinity than the metal oxide layer 3231_2, the metal oxide layer 3231_1 sometimes has a high carrier density.

When the metal oxide layer 3231_1 has a high carrier density, the Fermi level is sometimes high relative to the conduction band of the metal oxide layer 3231_1. This lowers the conduction band minimum of the metal oxide layer 3231_1, so that the energy difference between the conduction band minimum of the metal oxide layer 3231_1 and the trap level, which might be formed in a gate insulating film (here, the insulating layer 3211), is increased in some cases. The increase of the energy difference can reduce trap of charges in the gate insulating film and reduce variation in the threshold voltage of the transistor, in some cases. In addition, when the metal oxide layer 3231_1 has a high carrier density, the metal oxide layer 3231 can have high field-effect mobility.

Although the metal oxide layer 3231 in the transistor 3200b has a multi-layer structure including two layers in this example, the structure is not limited thereto, and the metal oxide layer 3231 may have a multi-layer structure including three or more layers.

The conductive layer 3222a in the transistor 3200b includes a conductive layer 3222a_1, a conductive layer 3222a_2 over the conductive layer 3222a_1, and a conductive layer 3222a_3 over the conductive layer 3222a_2. The conductive layer 3222b in the transistor 3200b includes a conductive layer 3222b_1, a conductive layer 3222b_2 over the conductive layer 3222b_1, and a conductive layer 3222b_3 over the conductive layer 3222b_2.

For example, it is preferable that the conductive layers 3222a_1, 3222b_1, 3222a_3, and 3222b_3 contain one or more elements selected from titanium, tungsten, tantalum, molybdenum, indium, gallium, tin, and zinc. Furthermore, it is preferable that the conductive layers 3222a_2 and 3222b_2 contain one or more elements selected from copper, aluminum, and silver.

Specifically, the conductive layers 3222a_1, 3222b_1, 3222a_3, and 3222b_3 can contain an In—Sn oxide or an In—Zn oxide and the conductive layers 3222a_2 and 3222b_2 can contain copper.

An end portion of the conductive layer 3222a_1 has a region located outside an end portion of the conductive layer 3222a_2. The conductive layer 3222a_3 covers a top surface and a side surface of the conductive layer 3222a_2 and has a region that is in contact with the conductive layer 3222a_1. An end portion of the conductive layer 3222b_1 has a region located outside an end portion of the conductive layer 3222b_2. The conductive layer 3222b_3 covers a top surface and a side surface of the conductive layer 3222b_2 and has a region that is in contact with the conductive layer 3222b_1.

The above structure is preferred because the structure can reduce the wiring resistance of the conductive layers 3222a and 3222b and inhibit diffusion of copper to the metal oxide layer 3231.

<Structure Example 3 of Transistor>

Figure 38A:
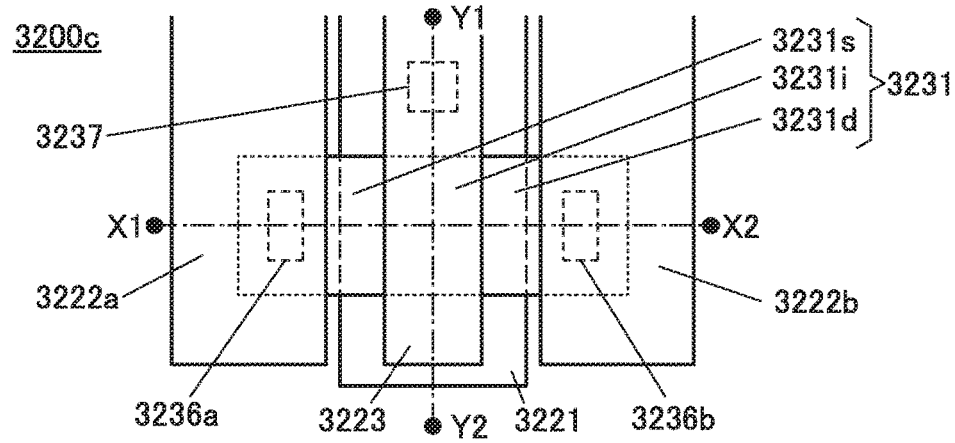
FIGS. 38A to 38C are a top view and cross-sectional views illustrating an example of a transistor used in a display device.
Figure 38B:
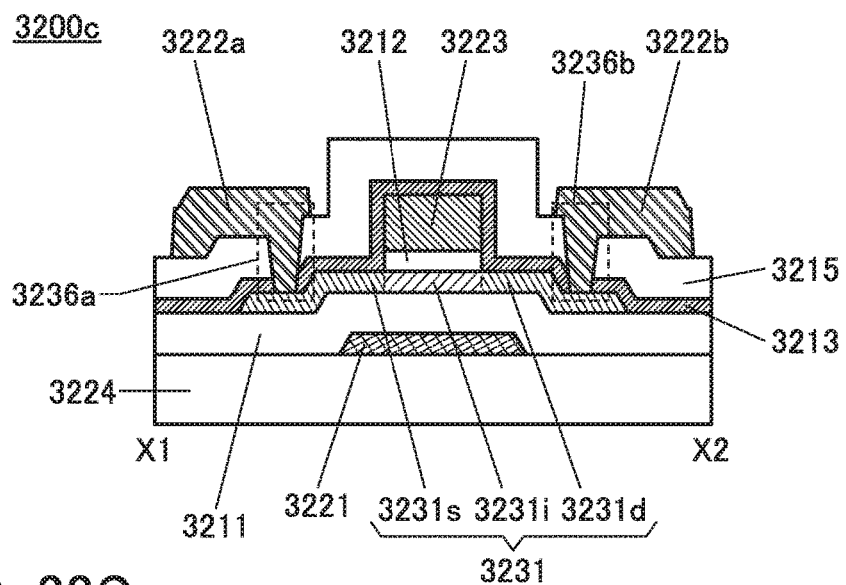

To show a structure example of a transistor, a transistor 3200c is described with reference to FIGS. 38A to 38C. FIG. 38A is a top view of the transistor 3200c. FIG. 38B is a cross-sectional view taken along the dashed-dotted line X1-X2 in FIG. 38A, and FIG. 38C is a cross-sectional view taken along the dashed-dotted line Y1-Y2 in FIG. 38A.

Figure 38C:
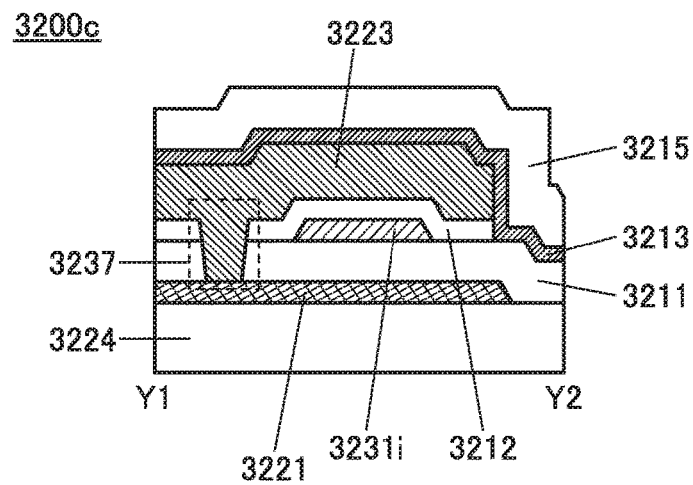

The transistor 3200c illustrated in FIGS. 38A to 38C includes the conductive layer 3221 over the insulating layer 3224; the insulating layer 3211 over the conductive layer 3221; the metal oxide layer 3231 over the insulating layer 3211; the insulating layer 3212 over the metal oxide layer 3231; the conductive layer 3223 over the insulating layer 3212; and the insulating layer 3213 over the insulating layer 3211, the metal oxide layer 3231, and the conductive layer 3223. The metal oxide layer 3231 includes a channel formation region 3231i overlapping with the conductive layer 3223, a source region 3231s in contact with the insulating layer 3213, and a drain region 3231d in contact with the insulating layer 3213.

The insulating layer 3213 contains nitrogen or hydrogen. The insulating layer 3213 is in contact with the source region 3231s and the drain region 3231d, so that nitrogen or hydrogen that is contained in the insulating layer 3213 is added to the source region 3231s and the drain region 3231d. The source region 3231s and the drain region 3231d each have a high carrier density when nitrogen or hydrogen is added thereto.

The transistor 3200c may further include an insulating layer 3215 over the insulating layer 3213, the conductive layer 3222a electrically connected to the source region 3231s through an opening 3236a provided in the insulating layers 3213 and 3215, and the conductive layer 3222b electrically connected to the drain region 3231d through an opening 3236b provided in the insulating layers 3213 and 3215.

The insulating layer 3215 can be an oxide insulating film. Alternatively, a multi-layer film including an oxide insulating film and a nitride insulating film can be used as the insulating layer 3215. The insulating layer 3215 can include, for example, silicon oxide, silicon oxynitride, silicon nitride oxide, aluminum oxide, hafnium oxide, gallium oxide, or Ga—Zn oxide. Furthermore, the insulating layer 3215 preferably functions as a barrier film against hydrogen, water, and the like from the outside.

The insulating layer 3211 serves as a first gate insulating film, and the insulating layer 3212 serves as a second gate insulating film. The insulating layers 3213 and 3215 serve as a protective insulating film.

The insulating layer 3212 includes an excess oxygen region. Since the insulating layer 3212 includes the excess oxygen region, excess oxygen can be supplied to the channel formation region 3231i included in the metal oxide layer 3231. As a result, oxygen vacancies that might be formed in the channel formation region 3231i can be filled with excess oxygen, which can provide a highly reliable semiconductor device.

To supply excess oxygen to the metal oxide layer 3231, excess oxygen may be supplied to the insulating layer 3211 that is formed below the metal oxide layer 3231. However, in that case, excess oxygen contained in the insulating layer 3211 might also be supplied to the source region 3231s and the drain region 3231d included in the metal oxide layer 3231. When excess oxygen is supplied to the source region 3231s and the drain region 3231d, the resistance of the source region 3231s and the drain region 3231d might be increased.

In contrast, in the structure in which the insulating layer 3212 formed over the metal oxide layer 3231 contains excess oxygen, excess oxygen can be selectively supplied only to the channel formation region 3231i. Alternatively, the carrier density of the source and drain regions 3231s and 3231d can be selectively increased after excess oxygen is supplied to the channel formation region 3231i and the source and drain regions 3231s and 3231d, in which case an increase in the resistance of the source and drain regions 3231s and 3231d can be prevented.

Furthermore, each of the source region 3231s and the drain region 3231d included in the metal oxide layer 3231 preferably contains an element that forms an oxygen vacancy or an element that is bonded to an oxygen vacancy. Typical examples of the element that forms an oxygen vacancy or the element that is bonded to an oxygen vacancy include hydrogen, boron, carbon, nitrogen, fluorine, phosphorus, sulfur, chlorine, titanium, and a rare gas. Typical examples of the rare gas element include helium, neon, argon, krypton, and xenon. In the case where one or more of the elements that form oxygen vacancies are contained in the insulating layer 3213, the one or more of the elements are diffused from the insulating layer 3213 to the source region 3231s and the drain region 3231d. One or more of the elements that form oxygen vacancies may be added to the source region 3231s and the drain region 3231d by impurity addition treatment.

An impurity element added to the oxide semiconductor film cuts a bond between a metal element and oxygen in the oxide semiconductor film, so that an oxygen vacancy is formed. Alternatively, when the impurity element is added to the oxide semiconductor film, oxygen bonded to a metal element in the oxide semiconductor film is bonded to the impurity element, and the oxygen is released from the metal element, whereby an oxygen vacancy is formed. As a result, the oxide semiconductor film has a higher carrier density and thus the conductivity thereof becomes higher.

The conductive layer 3221 functions as a first gate electrode and the conductive layer 3223 functions as a second gate electrode. The conductive layer 3222a functions as a source electrode and the conductive layer 3222b functions as a drain electrode.

As illustrated in FIG. 38C, an opening 3237 is formed in the insulating layers 3211 and 3212. The conductive layer 3221 is electrically connected to the conductive layer 3223 in the opening 3237. Thus, the conductive layers 3221 and 3223 are supplied with the same potential. Note that different potentials may be applied to the conductive layers 3221 and 3223 without providing the opening 3237. Alternatively, the conductive layer 3221 may be used as a light-blocking film without providing the opening 3237. For example, light irradiating the channel formation region 3231i from the bottom can be reduced by the conductive layer 3221 formed with a light-blocking material.

As illustrated in FIGS. 38B and 38C, the metal oxide layer 3231 faces the conductive layer 3221 functioning as the first gate electrode and the conductive layer 3223 functioning as the second gate electrode and is between the two conductive films functioning as the gate electrodes.

As with the transistors 3200a and 3200b, the transistor 3200c has the S-channel structure. Such a structure enables the metal oxide layer 3231 included in the transistor 3200c to be electrically surrounded by electric fields of the conductive layer 3221 functioning as the first gate electrode and the conductive layer 3223 functioning as the second gate electrode.

Since the transistor 3200c has the S-channel structure, an electric field for inducing a channel can be effectively applied to the metal oxide layer 3231 by the conductive layer 3221 or 3223; thus, the current drive capability of the transistor 3200c can be improved and high on-state current characteristics can be obtained. As a result of the high on-state current, it is possible to reduce the size of the transistor 3200c. Furthermore, since the transistor 3200c has a structure in which the metal oxide layer 3231 is surrounded by the conductive layers 3221 and 3223, the mechanical strength of the transistor 3200c can be increased.

The transistor 3200c may be called a top-gate self-aligned (TGSA) FET from the position of the conductive layer 3223 relative to the metal oxide layer 3231 or the formation method of the conductive layer 3223.

The metal oxide layer 3231 in the transistor 3200c may have a multi-layer structure including two or more layers, as in the transistor 3200b.

Although the insulating layer 3212 is present only in a portion overlapping with the conductive layer 3223 in the transistor 3200c, the structure is not limited thereto, and the insulating layer 3212 may cover the metal oxide layer 3231. Alternatively, the conductive layer 3221 may be omitted.

This embodiment can be implemented in an appropriate combination with any of the structures described in the other embodiments and the like.

Embodiment 10

In this embodiment, electronic devices that can include the display device of one embodiment of the present invention will be described.

The display device of one embodiment of the present invention can be used for a display portion of an electronic device. As a result, the electronic device can have high display quality, extremely high resolution, or high reliability.

Examples of electronic devices include a television set, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

The electronic device of one embodiment of the present invention can be incorporated along a curved inside/outside wall surface of a house or a building or a curved interior/exterior surface of a car.

The electronic device of one embodiment of the present invention may include a secondary battery. It is preferable that the secondary battery be capable of being charged by contactless power transmission.

Examples of the secondary battery include a lithium ion secondary battery such as a lithium polymer battery using a gel electrolyte (lithium ion polymer battery), a nickel-metal hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays).

The electronic device of one embodiment of the present invention can have a variety of functions such as a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Furthermore, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an image receiving portion can have a function of photographing a still image or a moving image, a function of automatically or manually correcting a photographed image, a function of storing a photographed image in a recording medium (an external recording medium or a recording medium incorporated in the electronic device), a function of displaying a photographed image on a display portion, or the like. Note that the functions of the electronic devices of embodiments of the present invention are not limited thereto, and the electronic devices can have a variety of functions.

The display device of one embodiment of the present invention can display images with extremely high resolution. For this reason, the display device can be used particularly for portable electronic devices, wearable electronic devices (wearable devices), e-book readers, and the like. In addition, the display device can be suitably used for virtual reality (VR) devices, augmented reality (AR) devices, and the like.

FIG. 39A is an external view of a camera 840 to which a finder 850 is attached.

The camera 840 includes a housing 841, a display portion 842, an operation button 843, a shutter button 844, and the like. Furthermore, an attachable lens 846 is attached to the camera 840.

Although the lens 846 of the camera 840 here is detachable from the housing 841 for replacement, the lens 846 may be built in a housing.

When the shutter button 844 is pressed, the camera 840 can take images. In addition, images can be taken by a touch on the display portion 842 that serves as a touch panel.

The housing 841 of the camera 840 has a mount including an electrode, and the finder 850, a stroboscope, and the like can be connected to the housing 841.

The finder 850 includes a housing 851, a display portion 852, a button 853, and the like.

The housing 851 includes a mount for engagement with the mount of the camera 840 so that the finder 850 can be connected to the camera 840. The mount includes an electrode, and a moving image or the like received from the camera 840 through the electrode can be displayed on the display portion 852.

The button 853 serves as a power button. The display portion 852 can be turned on and off with the button 853.

The display device of one embodiment of the present invention can be used in the display portion 842 of the camera 840 and the display portion 852 of the finder 850.

Although the camera 840 and the finder 850 are separate and detachable electronic devices in FIG. 39A, a finder including the display device of one embodiment of the present invention may be built in the housing 841 of the camera 840.

FIG. 39B is an external view of a head-mounted display 860.

The head-mounted display 860 includes a mounting portion 861, a lens 862, a main body 863, a display portion 864, a cable 865, and the like. In addition, a battery 866 is built in the mounting portion 861.

Power is supplied from the battery 866 to the main body 863 through the cable 865. The main body 863 includes a wireless receiver or the like to receive video data such as image data and display it on the display portion 864. The movement of the user's eyeball or eyelid is captured by a camera in the main body 863 and then the coordinates of the eyepoint are calculated using the captured data to utilize the user's eye as an input means.

The mounting portion 861 may include a plurality of electrodes so as to be in contact with the user. The main body 863 may have a function of sensing current flowing through the electrodes with the movement of the user's eyeball to recognize the direction of his or her eyes. The main body 863 may have a function of sensing current flowing through the electrodes to monitor the user's pulse. The mounting portion 861 may include sensors such as a temperature sensor, a pressure sensor, or an acceleration sensor so that the user's biological information can be displayed on the display portion 864. The main body 863 may sense the movement of the user's head or the like to move an image displayed on the display portion 864 in synchronization with the movement of the user's head, or the like.

The display device of one embodiment of the present invention can be used in the display portion 864.

FIGS. 39C and 39D are external views of a head-mounted display 870.

The head-mounted display 870 includes a housing 871, two display portions 872, an operation button 873, and a fixing band 874.

The head-mounted display 870 has the functions of the above-described head-mounted display 860 and includes two display portions.

Since the head-mounted display 870 includes the two display portions 872, the user's eyes can see their respective display portions. Thus, a high-definition image can be displayed even when a three-dimensional display using parallax, or the like, is performed. In addition, the display portion 872 is curved around an arc with the user's eye as an approximate center. Owing to this, distances between the user's eye and display surfaces of the display portion become equal; thus, the user can see a more natural image. Even when the luminance or chromaticity of light emitted from the display portion varies depending on the viewing angle, the influence of the variation is substantially ignorable and thus a more realistic image can be displayed because the user's eye is positioned in the normal direction of the display surface of the display portion.

The operation button 873 serves as a power button or the like. A button other than the operation button 873 may be included.

As illustrated in FIG. 39E, lenses 875 may be provided between the display portion 872 and the user's eyes. The user can see magnified images on the display portion 872 through the lenses 875, leading to higher sense of presence. In that case, as illustrated in FIG. 39E, a dial 876 for changing the position of the lenses and adjusting visibility may be included.

The display device of one embodiment of the present invention can be used for the display portion 872. Since the display device of one embodiment of the present invention has extremely high definition, even when an image is magnified using the lenses 875 as illustrated in FIG. 39E, the pixels are not perceived by the user, and thus a more realistic image can be displayed.

Figure 40A:
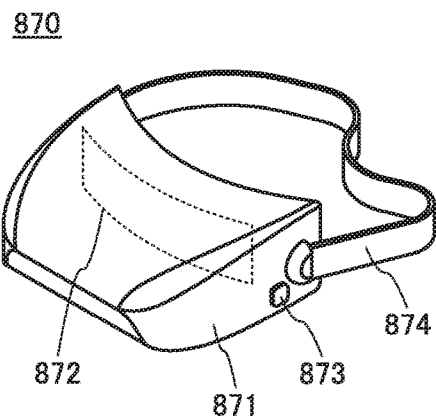
FIGS. 40A to 40D illustrate examples of an electronic device.
Figure 40B:
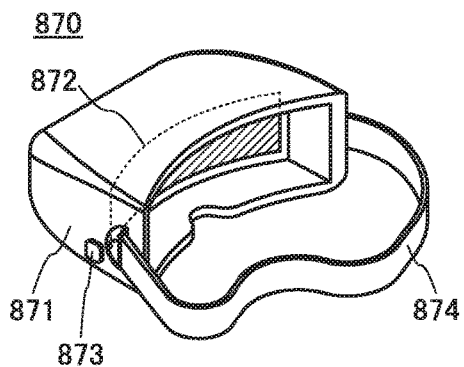

FIGS. 40A and 40B illustrate an example in which the head-mounted display includes one display portion 872. This structure can reduce the number of components.

The display portion 872 can display an image for the right eye and an image for the left eye side by side on a right region and a left region, respectively. Thus, a three-dimensional moving image using binocular disparity can be displayed.

One image which can be seen by both eyes may be displayed on the entire display portion 872. A panorama moving image can thus be displayed from end to end of the field of view, which can provide a higher sense of reality.

The lenses 875 may be provided. Two images may be displayed side by side on the display portion 872. Alternatively, one image may be displayed on the display portion 872 and seen by both eyes through the lenses 875.

Figure 40C:
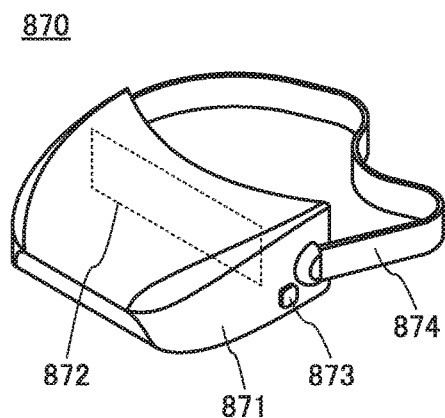
Figure 40D:
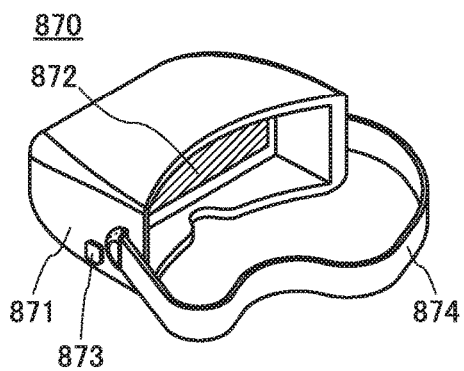

The display portion 872 is not necessarily curved and may have a flat display surface as illustrated in an example of FIGS. 40C and 40D in which the display portion 872 does not have a curved surface, for example.

This embodiment can be implemented in an appropriate combination with any of the structures described in the other embodiments and the like.

Embodiment 11

In this embodiment, examples of electronic devices including any of the display devices disclosed in this specification and the like are described.

Examples of the electronic devices including any of the display devices of one embodiment of the present invention are as follows: display devices such as televisions and monitors, lighting devices, desktop personal computers, laptop personal computers, word processors, image reproduction devices which reproduce still images and moving images stored in recording media such as digital versatile discs (DVDs), portable CD players, radios, tape recorders, headphone stereos, stereos, table clocks, wall clocks, cordless phone handsets, transceivers, car phones, mobile phones, portable information terminals, tablet terminals, portable game machines, stationary game machines such as pachinko machines, calculators, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as chain saws, smoke detectors, and medical equipment such as dialyzers. Further examples include the following industrial equipment: guide lights, traffic lights, belt conveyors, elevators, escalators, industrial robots, power storage systems, and power storage devices for leveling the amount of power supply and smart grid. In addition, moving objects and the like driven by fuel engines and electric motors using power from power storage units, and the like may also be included in the range of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

Figure 41A:
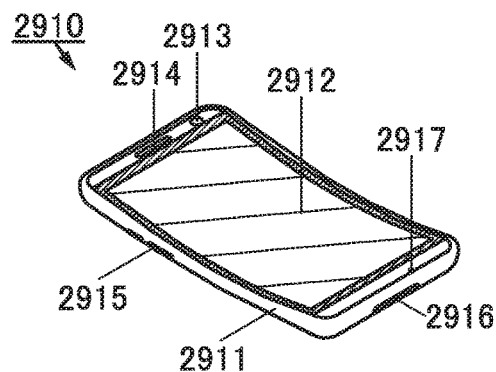
FIGS. 41A to 41G each illustrate an example of an electronic device.

An information terminal 2910 illustrated in FIG. 41A includes a housing 2911, a display portion 2912, a microphone 2917, a speaker portion 2914, a camera 2913, an external connection portion 2916, an operation switch 2915, and the like. A display panel and a touch screen that use a flexible substrate are provided in the display portion 2912. In addition, the information terminal 2910 includes an antenna, a battery, and the like inside the housing 2911. The information terminal 2910 can be used as, for example, a smartphone, a mobile phone, a tablet information terminal, a tablet personal computer, or an e-book reader.

Figure 41B:
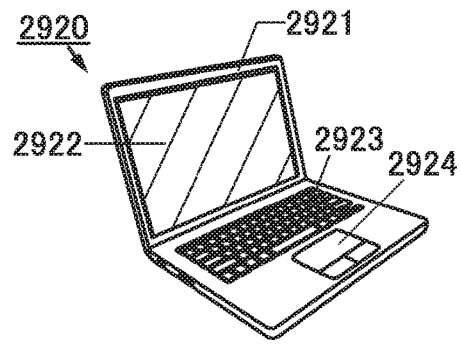

A notebook personal computer 2920 illustrated in FIG. 41B includes a housing 2921, a display portion 2922, a keyboard 2923, a pointing device 2924, and the like. In addition, the notebook personal computer 2920 includes an antenna, a battery, and the like inside the housing 2921.

Figure 41C:
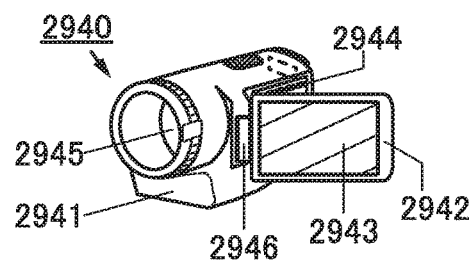

A video camera 2940 in FIG. 41C includes a housing 2941, a housing 2942, a display portion 2943, operation switches 2944, a lens 2945, a joint 2946, and the like. The operation switches 2944 and the lens 2945 are provided for the housing 2941, and the display portion 2943 is provided for the housing 2942. In addition, the video camera 2940 includes an antenna, a battery, and the like inside the housing 2941. The housing 2941 and the housing 2942 are connected to each other with the joint 2946, and the angle between the housing 2941 and the housing 2942 can be changed with the joint 2946. The orientation of an image on the display portion 2943 can be changed and display and non-display of an image can be switched depending on the angle between the housings 2941 and 2942.

Figure 41D:
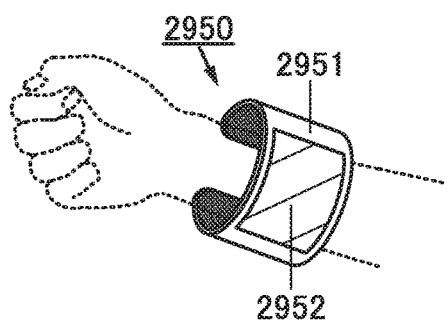

FIG. 41D illustrates an example of a bangle-type information terminal. An information terminal 2950 includes a housing 2951, a display portion 2952, and the like. In addition, the information terminal 2950 includes an antenna, a battery, and the like inside the housing 2951. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 41E:
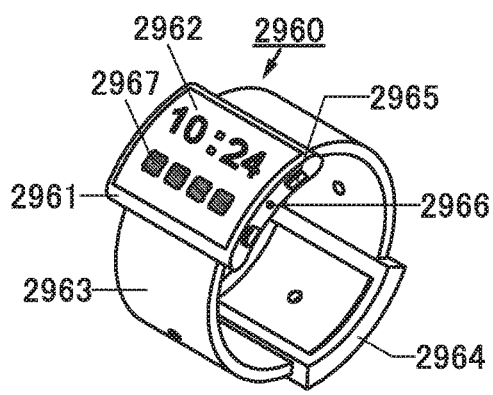

FIG. 41E illustrates an example of a watch-type information terminal. An information terminal 2960 includes a housing 2961, a display portion 2962, a band 2963, a buckle 2964, an operation switch 2965, an input/output terminal 2966, and the like. In addition, the information terminal 2960 includes an antenna, a battery, and the like inside the housing 2961. The information terminal 2960 is capable of executing a variety of applications such as mobile phone calls, e-mailing, text viewing and editing, music reproduction, Internet communication, and computer games.

The display surface of the display portion 2962 is curved, and images can be displayed on the curved display surface. In addition, the display portion 2962 includes a touch sensor, and operation can be performed by touching the screen with a finger, a stylus, or the like. For example, by touching an icon 2967 displayed on the display portion 2962, application can be started. With the operation switch 2965, a variety of functions such as time setting, power on/off, on/off of wireless communication, setting and cancellation of a silent mode, and setting and cancellation of a power saving mode can be performed. For example, the functions of the operation switch 2965 can be set by setting the operating system incorporated in the information terminal 2960.

The information terminal 2960 can employ near field communication that is a communication method based on an existing communication standard. In that case, for example, mutual communication between the information terminal 2960 and a headset capable of wireless communication can be performed, and thus hands-free calling is possible. Moreover, the information terminal 2960 includes the input/output terminal 2966, and data can be directly transmitted to and received from another information terminal via the input/output terminal 2966. In addition, charging via the input/output terminal 2966 is possible. Note that the charging operation may be performed by wireless power feeding without using the input/output terminal 2966.

Figure 41F:
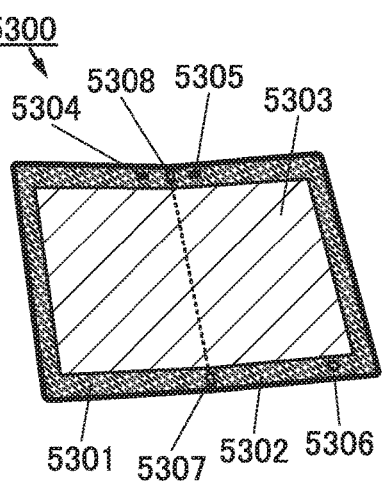

FIG. 41F illustrates a tablet personal computer 5300 including a housing 5301, a housing 5302, a display portion 5303, an optical sensor 5304, an optical sensor 5305, a switch 5306, and the like. The display portion 5303 is supported by the housing 5301 and the housing 5302. The display portion 5303 is formed using a flexible substrate and thus has a function of being bendable flexibly. By changing the angle between the housing 5301 and the housing 5302 with a hinge 5307 and a hinge 5308, the display portion 5303 can be folded so that the housing 5301 and the housing 5302 overlap with each other. Although not illustrated, an open/close sensor may be incorporated so that the above-described angle change can be used as information about conditions of use of the display portion 5303.

Figure 41G:
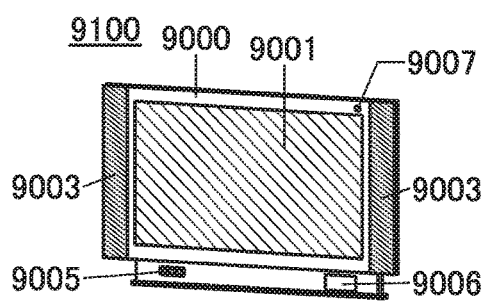

FIG. 41G is a perspective view of a television device 9100. The television device 9100 includes a housing 9000, a display portion 9001, a speaker 9003, an operation key 9005 (including a power switch or an operation switch), a connection terminal 9006, a sensor 9007 (a sensor having a function of measuring distance, light, temperature, or the like), and the like. In the television device 9100, the display portion 9001 can include a display device having a screen size of, for example, 50 inches or more or 100 inches or more.

The display device of one embodiment of the present invention is included in the display portions of the electronic devices in this embodiment. With the use of the display device and the driving method of one embodiment of the present invention for the display portions of the electronic devices, the electronic devices can have excellent visibility.

This embodiment can be implemented in an appropriate combination with any of the structures described in the other embodiments and the like.

This application is based on Japanese Patent Application Serial No. 2016-250228 filed with Japan Patent Office on Dec. 23, 2016, the entire contents of which are hereby incorporated by reference.

What is claimed is:

1. A light-emitting display device comprising:
a first insulating layer;
a first electrode over the first insulating layer;
a second insulating layer covering an end portion of the first electrode;
a second electrode over the second insulating layer;
an EL layer over the first electrode and the second electrode; and
a third electrode over the EL layer,
wherein the third electrode overlaps with the first electrode with a first region of the EL layer between the first electrode and the third electrode,
wherein the third electrode overlaps with the second electrode with a second region of the EL layer between the second electrode and the third electrode, and
wherein an end portion of the second electrode is aligned with the end portion of the first electrode.

2. The light-emitting display device according to claim 1, wherein the first electrode, the first region of the EL layer, and the third electrode are in a first light-emitting element of a first pixel, and
wherein the second electrode, the second region of the EL layer, and the third electrode are in a second tight-emitting element of a second pixel adjacent to the first pixel.

3. The light-emitting display device according to claim 1, further comprising:
a first coloring layer overlapping with the first region of the EL layer; and
a second coloring layer overlapping with the second region of the EL layer,
wherein the first coloring layer and the second coloring layer have different colors.

4. The light-emitting display device according to claim 1, further comprising a fourth electrode over the first insulating layer,
wherein the fourth electrode, a third region of the EL layer, and the third electrode are in a third light-emitting element.

5. A light-emitting display device comprising:
a first insulating layer;
a first electrode over the first insulating layer;
a second insulating layer covering an end portion of the first electrode;
a second electrode over the second insulating layer;
a third insulating layer over the second electrode;
an EL layer over the third insulating layer; and
a third electrode over the EL layer,
wherein the third insulating layer is in contact with the first electrode and the second electrode,
wherein the third electrode overlaps with the first electrode with a first region of the EL layer between the first electrode and the third electrode, and
wherein the third electrode overlaps with the second electrode with a second region of the EL layer between the second electrode and the third electrode.

6. The light-emitting display device according to claim 5, wherein an end portion of the second electrode is aligned with the end portion of the first electrode.

7. The light-emitting display device according to claim 5, wherein an end portion of the second electrode overlaps with the end portion of the first electrode.

8. The light-emitting display device according to claim 5, wherein the first electrode, the first region of the EL layer, and the third electrode are in a first light-emitting element of a first pixel, and
wherein the second electrode, the second region of the EL layer, and the third electrode are in a second light-emitting element of a second pixel adjacent to the first pixel.

9. The light-emitting display device according to claim 5, further comprising:
a first coloring layer overlapping with the first region of the EL layer; and
a second coloring layer overlapping with the second region of the EL layer,
wherein the first coloring layer and the second coloring layer have different colors.

10. The light-emitting display device according to claim 5, further comprising a fourth electrode over the first insulating layer,
wherein the fourth electrode, a third region of the EL layer, and the third electrode are in a third light-emitting element.

11. A light-emitting display device comprising:
a first transistor;
a second transistor;
a first insulating layer over the first transistor and the second transistor;
a first electrode over the first insulating layer, the first electrode electrically connected to the first transistor;
a second insulating layer covering an end portion of the first electrode;
a second electrode over the second insulating layer, the second electrode electrically connected to the second transistor;
a third insulating layer over the second electrode;
an EL layer over the third insulating layer; and
a third electrode over the EL layer,
wherein the third insulating layer is in contact with the first electrode and the second electrode, wherein the third electrode overlaps with the first electrode with a first region of the EL layer between the first electrode and the third electrode, and wherein the third electrode overlaps with the second electrode with a second region of the EL layer between the second electrode and the third electrode.

12. The light-emitting display device according to claim 11, wherein an end portion of the second electrode is aligned with the end portion of the first electrode.

13. The light-emitting display device according to claim 11, wherein an end portion of the second electrode overlaps with the end portion of the first electrode.

14. The light-emitting display device according to claim 11, wherein the first electrode, the first region of the EL layer, and the third electrode are in a first light-emitting element of a first pixel, and wherein the second electrode, the second region of the EL layer, and the third electrode are in a second light-emitting element of a second pixel adjacent to the first pixel.

15. The light-emitting display device according to claim 11, further comprising:

a first coloring layer overlapping with the first region of the EL layer; and a second coloring layer overlapping with the second region of the EL layer, wherein the first coloring layer and the second coloring layer have different colors.

16. The light-emitting display device according to claim 11, further comprising a fourth electrode over the first insulating layer, wherein the fourth electrode, a third region of the EL layer, and the third electrode are in a third light-emitting element.

* * * * *